(12) United States Patent
Hasegawa et al.

(10) Patent No.: US 6,893,734 B2
(45) Date of Patent: May 17, 2005

(54) MAGNETIC SENSING ELEMENT WITH IMPROVED SENSITIVITY AND METHOD FOR MAKING THE SAME

(75) Inventors: Naoya Hasegawa, Niigata-ken (JP); Eiji Umetsu, Niigata-ken (JP); Masamichi Saito, Niigata-ken (JP); Kenichi Tanaka, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 59 days.

(21) Appl. No.: 10/017,301

(22) Filed: Dec. 14, 2001

(65) Prior Publication Data

US 2002/0081458 A1 Jun. 27, 2002

(30) Foreign Application Priority Data

| Dec. 22, 2000 | (JP) | ........................................ | 2000-390815 |
| Dec. 22, 2000 | (JP) | ........................................ | 2000-390849 |
| Apr. 24, 2001 | (JP) | ........................................ | 2001-125605 |
| Apr. 24, 2001 | (JP) | ........................................ | 2001-125631 |

(51) Int. Cl.$^7$ ................................................. G11B 5/39
(52) U.S. Cl. ........................ 428/611; 428/637; 428/678; 428/686; 428/156; 428/336; 428/692; 360/324.11; 360/324.12
(58) Field of Search ................................ 428/611, 637, 428/678, 686, 156, 336, 692; 360/324.11, 324.12, 321

(56) References Cited

U.S. PATENT DOCUMENTS

| 5,949,623 A | | 9/1999 | Lin |
| 5,966,274 A | * | 10/1999 | Suzuki ........................ 360/317 |
| 6,030,753 A | | 2/2000 | Lin |
| 6,447,689 B1 | * | 9/2002 | Torng et al. ................... 216/22 |
| 6,462,919 B1 | * | 10/2002 | Mack et al. .............. 360/327.3 |
| 6,549,454 B1 | * | 4/2003 | Slaughter ..................... 365/158 |
| 6,580,588 B1 | * | 6/2003 | Gill .......................... 360/324.1 |
| 2002/0034055 A1 | * | 3/2002 | Seyama et al. ......... 360/324.11 |
| 2002/0051897 A1 | * | 5/2002 | Saito et al. .................. 428/692 |
| 2003/0197505 A1 | * | 10/2003 | Sakakima et al. ........... 324/252 |

FOREIGN PATENT DOCUMENTS

JP           11-175919 A   *   7/1999

OTHER PUBLICATIONS

English Translation of JP 11–175919–A (Arai et al.).*
JPO Abstract Translation of JP 11–175919.*

* cited by examiner

*Primary Examiner*—Kevin M. Bernatz
(74) *Attorney, Agent, or Firm*—Brinks Hofer Gilson & Lione

(57) ABSTRACT

A magnetic sensing element includes a laminate, the laminate including a first antiferromagnetic layer; a pinned magnetic layer, the magnetization direction thereof being pinned by the first antiferromagnetic layer; a nonmagnetic conductive layer; a free magnetic layer, the magnetization direction thereof being variable in response to an external magnetic field; a nonmagnetic interlayer; a ferromagnetic layer; and a second antiferromagnetic layer. The laminate has a recess extending through the second antiferromagnetic layer and the ferromagnetic layer, a bottom face of the recess lying in the nonmagnetic interlayer, the width of the bottom face in a track width direction being equal to a track width. The free magnetic layer is magnetized in a direction substantially orthogonal to the magnetization direction of the pinned magnetic layer as a result of magnetic coupling with the ferromagnetic layer. A method for making such a magnetic sensing element is also disclosed.

15 Claims, 32 Drawing Sheets

FIG. 8
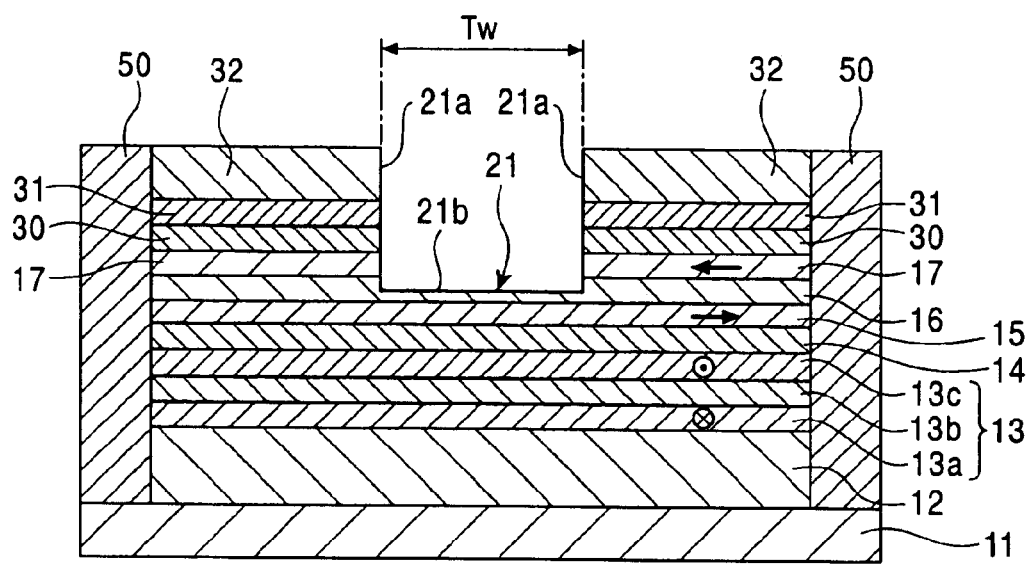
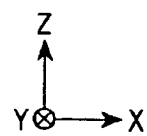

Y⊗⟶X

Y⊗⟶X

MAGNETIC SENSING ELEMENT WITH IMPROVED SENSITIVITY AND METHOD FOR MAKING THE SAME

BACKGROUND OF THE INVENTION

1. Field of the Invention

The present invention relates generally to a magnetic sensing element for use in a magnetic sensor or a hard disk and, more particularly, the present invention relates to a magnetic sensing element having an improved sensitivity to magnetic fields, and to a manufacturing method thereof.

2. Description of the Related Art

FIG. 12 is a cross-sectional view showing the structure of a conventional magnetic sensing element manufactured by a conventional manufacturing method as viewed from the face opposing a magnetic medium. The magnetic sensing element shown in FIG. 12 is a spin-valve, which is a type of giant magnetoresistive (GMR) element utilizing the giant magnetoresistive effect. The element detects a magnetic field recorded in a recording medium, such as a hard disk. The spin-valve magnetic sensing element includes a laminate 9, a pair of longitudinal bias layers 6 formed on the laminate 9, and a pair of electrode layers 7 formed on the bias layers 6. The laminate 9 is composed of a substrate 8, an antiferromagnetic layer 1, a pinned magnetic layer 2, a nonmagnetic layer 3, and a free magnetic layer 4.

Generally, the antiferromagnetic layer 1 and the longitudinal bias layers 6 are composed of an Fe—Mn alloy or a Ni—Mn alloy. The pinned magnetic layer 2 and the free magnetic layer 4 are composed of a Ni—Fe alloy, the nonmagnetic layer 3 is composed of Cu, and the electrode layers 7 are composed of Cr.

Referring to FIG. 12, the pinned magnetic layer 2 is preferably put into a single-magnetic-domain state in the Y direction in the drawing (the direction of a leakage magnetic field from the recording medium, i.e., the height direction) by an exchange anisotropic magnetic field generated with the antiferromagnetic layer 1. The magnetization of the free magnetic layer 4 is preferably oriented in the X direction by an exchange anisotropic magnetic field from the longitudinal bias layers 6. In other words, the magnetization direction of the pinned magnetic layer 2 is preferably orthogonal to the magnetization direction of the free magnetic layer 4.

In this spin-valve magnetic sensing element, a sense current is supplied to the free magnetic layer 4, the nonmagnetic layer 3, and the pinned magnetic layer 2 through the electrode layers 7 formed on the longitudinal bias layers 6. A recording medium such as a hard disk moves in the Z direction in the drawing. A leakage magnetic field from the recording medium provided in the Y direction changes the magnetization direction of the free magnetic layer 4 from the X direction toward the Y direction. This change in the magnetization direction of the free magnetic layer 4 with respect to the pinned magnetization direction of the pinned magnetic layer 2 changes the electrical resistance (magnetoresistive effect). The voltage then changes based on the change in the electrical resistance. The leakage magnetic field from the recording medium is thus detected as the change in the voltage.

In a conventional manufacturing method for the spin-valve magnetic sensing element shown in FIG. 12, the antiferromagnetic layer 1, the pinned magnetic layer 2, the nonmagnetic layer 3, and the free magnetic layer 4 are deposited on the substrate 8 in that order to form the laminate 9. Subsequently, the longitudinal bias layers 6 and the electrode layers 7 are formed on the laminate 9.

After deposition, these layers are annealed in a first magnetic field to orient the magnetization of the pinned magnetic layer 2 in the Y direction and then in a second magnetic field to orient the magnetization of the free magnetic layer 4 in the X direction. However, during annealing in the second magnetic field, an exchange anisotropic magnetic field acting at the interface between the antiferromagnetic layer 1 and the pinned magnetic layer 2 is shifted from the Y direction toward the X direction. Accordingly, the magnetization direction of the pinned magnetic layer 2 is no longer orthogonal to the magnetization direction of the free magnetic layer 4. Thus, asymmetry which is the degree of asymmetry in an out waveform, is high. The problem of high asymmetry is especially significant when the antiferromagnetic layer 1 and the longitudinal bias layer 6 are made from the same antiferromagnetic material.

In making the spin-valve magnetic sensing element shown in FIG. 12, a resist layer R for lift-off resist is formed on the laminate 9 subsequent to the formation of the laminate 9, as shown in FIG. 13. The longitudinal bias layers 6 and the electrode layers 7 are then deposited by an ion beam sputtering process. Layers 6a having the same composition as that of the longitudinal bias layers 6 and layers 7a having the same composition as that of the electrode layers 7 are formed on the resist layer R.

During the sputtering process, few sputtered particles are deposited on the region covered by two end portions of the resist layer R. Thus, the longitudinal bias layers 6 and the electrode layers 7 are thin in the region covered by the two end portions of the resist layer R. As shown in FIGS. 12 and 13, the thickness of the longitudinal bias layers 6 and the electrode layers 7 is decreased at two side portions S of the track.

The tapering of the layers 6 and 7 causes the exchange coupling between the free magnetic layer 4 and the longitudinal bias layers 6 to decrease at the two side portions S of the track. Thus, the magnetization direction of the free magnetic layer 4 is not satisfactorily pinned at the two side portions S of the track, such that the magnetization in regions S changes in response to the external magnetic field. Accordingly, when a track in the magnetic recording medium is made narrower to improve the recording density of the magnetic recording medium, not only information on the track, which the region corresponding to the track width Tw intends to read, but also the information on the adjacent tracks may be read by the two side portions S of the track (side reading).

SUMMARY OF THE INVENTION

It is an object of the present invention to overcome the above-described problems experienced in the conventional art and by providing a magnetic sensing element in which the magnetization directions of a pinned magnetic layer and a free magnetic layer are securely oriented to be substantially orthogonal to each other so as to prevent side reading. The present invention also provides a method for making the magnetic sensing element.

One aspect of the present invention provides a magnetic sensing element comprising a laminate, the laminate including: a first antiferromagnetic layer; a pinned magnetic layer, the magnetization direction thereof being pinned by the first antiferromagnetic layer; a nonmagnetic layer; a free magnetic layer which changes the magnetization direction thereof in response to an external magnetic field; a nonmagnetic interlayer; a ferromagnetic layer; and a second antiferromagnetic layer which magnetically couples with the ferromagnetic layer to orient the magnetization direction of the ferromagnetic layer. The laminate has a recess extending through the second antiferromagnetic layer and the ferromagnetic layer, a bottom face of the recess being provided in the nonmagnetic interlayer. The width of the bottom face in a track width direction is equal to a track width. The magnetization direction of the free magnetic layer is oriented in the direction substantially orthogonal to the magnetization direction of the pinned magnetic layer as a result of a magnetic coupling between the free magnetic layer and the ferromagnetic layer.

In the magnetic sensing element of the present invention, the second antiferromagnetic layer has a layer thickness sufficient for exhibiting antiferromagnetism in all regions except the bottom face of the recess. Moreover, the track width is determined by the width of the bottom face of the recess in the track width direction. In other words, only in the portion under the bottom face of the recess, does the magnetization direction of the free magnetic layer change in response to the external magnetic field.

The region corresponding to the track width Tw (optical track width), defined during the formation of the laminate described above, functions as a sensitive region which substantially contributes to reading of the recorded magnetic field and exhibits the magnetoresistive effect. Since the magnetic sensing element of the present invention has an optical track width equal to a magnetic track width, no insensitive regions are generated in the magnetic sensing element of the present invention. Accordingly, a decrease in read output resulting from a narrower optical track width Tw required for higher recording density can be prevented.

Moreover, the recess can be formed by simply removing a portion of the second antiferromagnetic layer having a uniform thickness in a vertical direction relative to the track width direction by employing a reactive ion etching (RIE) process or an ion milling process. Thus, the recess has accurate dimensions, and the track width of the magnetic sensing element can be accurately defined.

In this invention, the bottom face of the recess is located in the nonmagnetic interlayer. The magnetization direction of the ferromagnetic layer under the second antiferromagnetic layer is oriented in a predetermined direction as a result of the magnetic coupling with the second antiferromagnetic layer. The magnetization direction of the free magnetic layer, which is provided under the ferromagnetic layer with the nonmagnetic interlayer therebetween, is oriented in a direction substantially orthogonal to the magnetization direction of the pinned magnetic layer as a result of the Ruderman-Kittel-Kasuya-Yoshida (RKKY) interaction with the ferromagnetic layer. In other words, the ferromagnetic layer, the nonmagnetic interlayer, and the free magnetic layer form a synthetic ferrimagnetism structure under the second antiferromagnetic layer to readily orient the magnetization direction of the free magnetic layer in a predetermined direction. Thus, the magnetization direction of the free magnetic layer can be securely oriented in a direction substantially orthogonal to the magnetization direction of the pinned magnetic field even when the exchange coupling magnetic field generated between the second antiferromagnetic layer and the ferromagnetic layer is relatively weak.

Note that the free magnetic layer and the ferromagnetic layer must differ in the magnitude of the magnetic moment thereof. The magnitude of the magnetic moment per unit of each layer is expressed as a product of a saturation magnetization $M_s$ of the layer and a thickness t of each layer.

In the magnetic sensing element of the present invention, the nonmagnetic interlayer may contain at least one element selected from the group consisting of Ru, Rh, Ir, Cr, Re, and Cu. Preferably, at least one of the ferromagnetic layer and the free magnetic layer is made of a CoFeNi alloy containing about 9 to about 17 atomic percent of Fe, about 0.5 to about 10 atomic percent of Ni, and the balance of Co. Preferably, an interlayer, made of a CoFe alloy or elemental Co, is provided between the free magnetic layer and the nonmagnetic layer.

When the above-described interlayer is formed in the laminate, at least one of the ferromagnetic layer and the free magnetic layer is preferably made of a CoFeNi alloy containing about 7 to about 15 atomic percent of Fe, about 5 to about 15 atomic percent of Ni, and the balance of Co.

In the magnetic sensing element of the present invention, both the ferromagnetic layer and the free magnetic layer are preferably composed of the same CoFeNi alloy.

In the magnetic sensing element of the present invention, side faces of the recess may be perpendicular to the track width direction. In this manner, the second antiferromagnetic layer will have a thickness sufficient for inducing ferromagnetism over the entire region excluding the track width region; hence, the magnetization direction of the free magnetic layer can be securely pinned over the entire region excluding the track width region. Thus, the magnetization direction of the free magnetic layer is variable only in the track width region of the magnetic sensing element, and side readings in the vicinity of the track width region can be prevented.

The laminate may further include a nonmagnetic layer disposed between the ferromagnetic layer and the second antiferromagnetic layer. The magnetization of the ferromagnetic layer is oriented in a direction substantially orthogonal to the magnetization direction of the pinned magnetic layer as a result of the RKKY interaction between the ferromagnetic layer and the second antiferromagnetic layer, which is separated from the ferromagnetic layer by the nonmagnetic layer.

The exchange coupling between the ferromagnetic layer and the second antiferromagnetic layer is stronger when the ferromagnetic layer is magnetized by the RKKY interaction with the second antiferromagnetic layer compared to the case where the second antiferromagnetic layer is in direct contact with the ferromagnetic layer.

Preferably, the nonmagnetic layer contains at least one element selected from the group consisting of Ru, Cu, Ag, and Au. The nonmagnetic layer made of Ru having a thickness of about 8 to about 11 Å is especially preferable.

In this magnetic sensing element, the laminate may further include a third antiferromagnetic layer disposed under the second antiferromagnetic layer. The third antiferromagnetic layer prevents the layers covered by this third antiferromagnetic layer from oxidation caused by exposure to air during the step of annealing the first antiferromagnetic layer. This annealing step will be described below in relation with a method for making this magnetic sensing element. Preferably, the third antiferromagnetic layer has a thickness of not more than about 30 Å.

In this magnetic sensing element, the nonmagnetic interlayer, which is made of the conductive material deposited on the free magnetic layer, functions as a back layer exhibiting the spin filter effect.

When a sensing current is supplied to the spin-valve magnetic sensing element, most conduction electrons travel in the vicinity of the nonmagnetic layer having low electrical resistance. In the conduction electrons, spin-up conduction electrons and spin-down conduction electrons exist in statistically equal proportions. A rate of change in resistance of the spin-valve magnetic sensing element exhibits positive correlation with the difference in mean free paths of these two types of conduction electrons.

The spin-down conduction electrons are always scattered at the interface between the nonmagnetic conductive layer and the free magnetic layer regardless of the direction of an applied external magnetic field. The probability of the spin-down conduction electrons moving into the free magnetic layer remains low, and the mean free path of the spin-down conduction electrons remains shorter than that of the spin-up conduction electrons.

In contrast, the probability of the spin-up conduction electrons moving from the nonmagnetic conductive layer into the free magnetic layer is high when the magnetization directions of the free magnetic layer and the pinned magnetic layer are parallel to each other, and the mean free path of the spin-up conduction electrons is extended thereby. As the magnetization direction of the free magnetic layer is rotated from such a parallel state toward the magnetization direction of the pinned magnetic layer in response to an external magnetic field, the probability of the spin-up conduction electrons being scattered at the interface between the nonmagnetic conductive layer and the free magnetic layer increases, and the mean free path of the up-spin conduction electrons shortens.

As described above, the change in the mean free path of the spin-up conduction electrons in response to the external magnetic field is significantly large compared to that of the spin-down conduction electrons. As the difference in the mean free paths of the spin-up and spin-down conduction electrons increases, the mean free path of the entire conductive electrons changes significantly, resulting in an increased rate of change in magnetic resistance ($\Delta R/R$) of the spin-valve magnetic sensing element.

When the free magnetic layer is provided with a back layer, the spin-up conduction electrons in the free magnetic layer can move into the back layer, thereby extending the mean free path of the spin-up conduction electrons in proportion to the thickness of the back layer. Consequently, a so-called spin filter effect occurs, and the difference between the mean free paths of these two types of conduction electrons is increased to further improve the rate of change in magnetic resistance ($\Delta R/R$) of the spin-valve magnetic sensing element.

Preferably, the free magnetic layer has a thickness in the range of about 15 to about 45 Å. The increase in the difference between the mean free paths of the spin-up and spin-down electrodes resulting from the spin filter effect is significant when the thickness of the free magnetic layer is relatively small.

A free magnetic layer with a thickness of less than about 15 Å cannot sufficiently function as a ferromagnetic layer and required magnetoresistive effects may not be achieved. Moreover, some conduction electrons may undergo diffusive scattering instead of specular reflection, and the rate of change in resistance may be degraded.

In a free magnetic layer with a thickness exceeding about 45 Å, the number of the spin-up conduction electrons scattered before reaching the nonmagnetic interlayer is high. Thus, the rate of change in resistance due to the spin filter effect changes at a reduced ratio.

Preferably, the pinned magnetic layer comprises a plurality of ferromagnetic sublayers differing in the magnetic moment per unit, and at least one nonmagnetic intermediate sublayer separating the plurality of ferromagnetic sublayers from one another. The magnetization directions of the plurality of ferromagnetic sublayers are preferably antiparallel to each other (ferrimagnetic state).

In the pinned magnetic layer composed of the nonmagnetic intermediate sublayer and the ferromagnetic sublayers sandwiching the nonmagnetic intermediate sublayer, each of the ferromagnetic sublayers pins the magnetization direction of the other to firmly pin the magnetization of the pinned magnetic layer in a predetermined direction. In other words, a large exchange coupling magnetic field Hex can be obtained between the second antiferromagnetic layer and the pinned magnetic layer. Moreover, demagnetizing fields (dipole magnetic field) $H_d$ due to the pinned magnetization of the pinned magnetic layer counteract each other by magnetostatic coupling between the ferromagnetic sublayers. As a result, contribution of the demagnetizing fields by the pinned magnetization of the pinned magnetic layer to the variable magnetization of the free magnetic layer is moderated. Thus, the variable magnetization of the free magnetic layer can be readily oriented to a desired direction, and the resulting magnetic sensing element exhibits excellent symmetry with low asymmetry.

Here, asymmetry indicates a degree of asymmetry in an output waveform. An output waveform has a low asymmetry when the output waveform is symmetrical. An asymmetry of an output waveform becomes closer to zero as the symmetry of the output waveform improves. The asymmetry is zero when the direction of the variable magnetization of the free magnetic layer is orthogonal to the magnetization direction of the pinned magnetic layer. At a high asymmetry, information on the recording medium cannot accurately be read, resulting in errors. A spin-valve magnetic sensing element with low asymmetry is more reliable for read signal processing.

Moreover, the demagnetizing field (dipole magnetic field) $H_d$ due to the pinned magnetization of the pinned magnetic layer has an uneven distribution in the element height direction in which the demagnetizing field is large at the end portions of the element and small at the central portion of the element, and may inhibit the free magnetic layer from entering a single magnetic domain state. In this invention, since the pinned magnetic layer has a multilayer structure described above, the dipole magnetic field $H_d$ can be reduced to substantially zero and Barkhausen noise due to the domain wall within the free magnetic layer and uneven distribution of the magnetization can be prevented.

The magnitude per unit area of the magnetic moment in the ferromagnetic layer is expressed as the product of a saturation magnetization $M_s$ and a thickness t of the ferromagnetic layer.

The nonmagnetic intermediate sublayer may contain one metal selected from the group consisting of Ru, Rh, Ir, Cr, Re, and Cu.

In this invention, the first antiferromagnetic layer and the second antiferromagnetic layer are preferably made of the same antiferromagnetic material. The magnetization directions of the first and second antiferromagnetic layers are readily arranged to be orthogonal to each other even when the first and second antiferromagnetic layers are made of the same antiferromagnetic material. The magnetization directions of the free magnetic layer and the pinned magnetic layer can be set orthogonal to each other in the absence of an external magnetic field.

Preferably, at least one of the first and second antiferromagnetic layers is made of one of a PtMn alloy, an X—Mn alloy, and a Pt—Mn—X' alloy, wherein X is at least one element selected from the group consisting of Pd, Ir, Rh, Ru, Os, Ni, and Fe, and X' is at least one element selected from, the group consisting of Pd, Ir, Rh, Ru, Au, Ag, Os, Cr, Ni, Ar, Ne, Xe, and Kr. The content of Pt in the PtMn alloy and the content of the X in the X—Mn alloy are preferably in the range of about 37 to about 63 atomic percent.

In the Pt—Mn—X' alloy, the X'+Pt content is preferably in the range of about 37 to about 63 atomic percent. Furthermore, the X' content in the Pt—Mn—X' alloy is preferably in the range of about 0.2 to about 10 atomic percent. When X' is at least one element selected from the group consisting of Pd, Ir, Rh, Ru, Os, Ni, and Fe, the X' content is preferably about 0.2 to about 40 atomic percent.

The first and second antiferromagnetic layers made of the above alloys are annealed to generate a large exchange coupling magnetic field. Particularly, the first and second antiferromagnetic layers made of the PtMn alloy generate an exchange coupling magnetic field of about 48 kA/m or more, for example, about 64 kA/m, and have a blocking temperature, (i.e., a temperature at which the exchange coupling magnetic field is lost), of 380° C., which is significantly high.

The above-described alloys, as deposited, have a disordered face centered cubic (fcc) structure and are transformed into CuAuI-type ordered face centered tetragonal (fct) structure by annealing.

The present invention also provides a method for making a magnetic sensing element. The method comprises the steps of: (a) depositing a first antiferromagnetic layer, a pinned magnetic layer, a nonmagnetic conductive layer, a free magnetic layer, a nonmagnetic interlayer, a ferromagnetic layer, and a protective layer on a substrate to form a laminate; (b) annealing the laminate at a first annealing temperature in a first magnetic field so as to pin the magnetization of the pinned magnetic layer in a predetermined direction; (c) removing the protective layer and the ferromagnetic layer by a predetermined thickness; (d) redepositing the ferromagnetic layer using a magnetic material and sequentially depositing a second antiferromagnetic layer on the ferromagnetic layer; (e) annealing the laminate and the second antiferromagnetic layer on the laminate at a second annealing temperature in a second magnetic field so as to pin the magnetization of the free magnetic layer in a direction substantially orthogonal to the magnetization direction of the pinned magnetic layer; and (f) depositing a pair of resist layers on the second antiferromagnetic layer, said pair of resist layers being separated by a gap corresponding to a track width, and removing the portion of the second antiferromagnetic layer sandwiched by said pair of resist layers in a direction perpendicular to a track width direction so as to form a recess.

In this method, the magnetization of the pinned magnetic layer is pinned in a predetermined direction by annealing the laminate in the magnetic field before depositing the second antiferromagnetic layer on the laminate. Thus, no exchange anisotropic magnetic field is generated between the second antiferromagnetic layer and the ferromagnetic layer when the second antiferromagnetic layer is deposited on the laminate.

The exchange anisotropic magnetic field between the second antiferromagnetic layer and the ferromagnetic layer is generated only after step (e) above. Thus, the magnetization direction of the free magnetic layer can be readily rotated to align in a predetermined direction. The magnetization of the free magnetic layer can be easily pinned in a direction orthogonal to the magnetization direction of the pinned magnetic layer.

Note that steps (a) and (d) are preferably performed in the same vacuum deposition apparatus.

In the magnetic sensing element manufactured by the method of the present invention, the track width is determined by the width of the bottom face of the recess. That is, the magnetization direction of the free magnetic layer is rotated in response to an external magnetic field only in the portion of the free magnetic layer under the bottom face of the recess. Moreover, a portion of the second antiferromagnetic layer of uniform thickness is removed in a direction perpendicular to the track width direction by means of reactive ion etching (RIE) or ion milling so as to form the recess. Thus, the recess can be formed with precise dimensions to accurately define the track width of the magnetic sensing element.

In the present invention, side faces of the recess may be formed to be perpendicular to the track width direction. In this manner, the second antiferromagnetic layer will have a thickness sufficient for inducing ferromagnetism over the entire region excluding the track width region; hence, the magnetization of the free magnetic layer can be securely pinned over the entire region excluding the track width region. Thus, the magnetization of the free magnetic layer is rotatable only in the track width region of the magnetic sensing element. Side readings in the vicinity of the track width region can be prevented.

Another aspect of the invention provides a method for making a magnetic sensing element, the method comprising the steps of: (g) depositing a first antiferromagnetic layer, a pinned magnetic layer, a nonmagnetic conductive layer, a free magnetic layer, a nonmagnetic interlayer, a ferromagnetic layer, and a third antiferromagnetic layer on a substrate to form a laminate; (h) annealing the laminate at a first annealing temperature in a first magnetic field so as to pin the magnetization direction of the pinned magnetic layer in a predetermined direction; (i) depositing a second antiferromagnetic layer on the laminate; (j) annealing the laminate and the second antiferromagnetic layer on the laminate at a second annealing temperature in a second magnetic field so as to pin the magnetization of the free magnetic layer in a direction substantially orthogonal to the magnetization direction of the pinned magnetic layer; and (k) depositing a pair of resist layers on the second antiferromagnetic layer, said pair of resist layers being separated by a gap corresponding to a track width, and removing the portion of the second antiferromagnetic layer sandwiched by said pair of resist layers in a direction perpendicular to a track width direction so as to form a recess.

In this method, the magnetization of the pinned magnetic layer is pinned in a predetermined direction by annealing the laminate in the magnetic field before depositing the second antiferromagnetic layer on the laminate. Thus, no exchange anisotropic magnetic field is generated between the second antiferromagnetic layer and the ferromagnetic layer when the second antiferromagnetic layer is deposited on the laminate.

The exchange anisotropic magnetic field between the second antiferromagnetic layer and the ferromagnetic layer is generated only after step (j) above. Thus, the magnetization direction of the free magnetic layer can be readily rotated to align in a predetermined direction. The magnetization direction of the free magnetic layer can be easily pinned in a direction orthogonal to the magnetization direction of the pinned magnetic layer.

Note that step (g) is preferably performed in the same vacuum deposition apparatus.

In the magnetic sensing element manufactured by this method, the track width is also determined by the width of the bottom face of the recess. That is, the magnetization direction of the free magnetic layer is rotated in response to an external magnetic field only in the portion of the free magnetic layer under the bottom face of the recess. Moreover, a portion of the second antiferromagnetic layer of uniform thickness is removed in a direction perpendicular to the track width direction by means of reactive ion etching (RIE) or ion milling so as to form the recess. Thus, the recess can be formed with precise dimensions to accurately define the track width of the magnetic sensing element.

In the present invention, side faces of the recess can be perpendicular to the track width direction. In this manner, the second antiferromagnetic layer will have a thickness sufficient for inducing ferromagnetism over the entire region excluding the track width region; hence, the magnetization direction of the free magnetic layer can be securely pinned over the entire region excluding the track width region. Thus, the magnetization direction of the free magnetic layer is rotatable only in the track width region of the magnetic sensing element and side reading in the vicinity of the track width region can be prevented.

In this aspect of the invention, the third antiferromagnetic layer is made of a material which generates an energy gap at which the probability of specular reflection maintaining the spin state of the conduction electrons is high. The antiferromagnetic layer functions as a specular reflection layer for extending the mean free path of the conduction electrons as a result of the specular reflection effect. When the third antiferromagnetic layer functions as the specular reflection layer, the thickness of the free magnetic layer is preferably in the range of about 15 to about 45 Å.

A free magnetic layer with a thickness of less than about 15 Å barely functions as the ferromagnetic layer for obtaining the required magnetoresistive effect.

In a free magnetic layer with a thickness exceeding about 45 Å, the number of the spin-up conduction electrons scattered before reaching the nonmagnetic interlayer is high. Thus, the rate of change in resistance due to the spin filter effect changes at a reduced ratio.

The third antiferromagnetic layer, which functions as the specular reflection layer, may be a single layer or a multilayer of metalloid Heusler alloys such as NiMnSb and PtMnSb. These materials will form a potential barrier between adjacent layers sufficient to yield the required specular reflection effect.

Preferably, the third antiferromagnetic layer has a thickness of not more than about 30 Å.

A third antiferromagnetic layer with a thickness of not more than about 30 Å does not generate an exchange coupling magnetic field with the ferromagnetic layer during step (h) described above. Thus, the magnetization of the ferromagnetic layer is prevented from being pinned in the same direction as that of the pinned magnetic layer. Accordingly, the magnetization of the free magnetic layer is prevented from being pinned in the same direction as that of the pinned magnetic layer when the second antiferromagnetic layer is deposited on the third antiferromagnetic layer during step (i) above. Preferably, the third antiferromagnetic layer has a thickness in the range of about 10 to about 30 Å.

A nonmagnetic layer may be deposited on the ferromagnetic layer in step (a). When the nonmagnetic layer is deposited on the ferromagnetic layer as above, the ferromagnetic layer is magnetized in a direction substantially orthogonal to the magnetization direction of the pinned magnetic layer as a result of the RKKY interaction with the second antiferromagnetic layer separated from the ferromagnetic layer by the nonmagnetic layer.

The exchange coupling between the second antiferromagnetic layer and the ferromagnetic layer is stronger when the ferromagnetic layer is magnetized by the RKKY interaction with the second antiferromagnetic layer compared to the case where the second antiferromagnetic layer is in direct contact with the ferromagnetic layer.

Preferably, the nonmagnetic layer is made of a conductive material. The nonmagnetic layer may be made of, for example, at least one element selected from the group consisting of Ru, Cu, Ag, and Au. More preferably, the nonmagnetic layer is made of Ru and has thickness in the range of about 8 to about 11 Å. The nonmagnetic layer composed of a conductive material can also function as a back layer exhibiting the spin filter effect.

When a sensing current is supplied to the spin-valve magnetic sensing element, most conduction electrons traveling in the vicinity of the nonmagnetic layer having a low electrical resistance. In the conduction electrons, spin-up conduction electrons and spin-down conduction electrons exist in statistically equal proportions. A rate of change in resistance of the spin-valve magnetic sensing element exhibits positive correlation with the difference in mean free paths of these two types of conduction electrons.

The spin-down conduction electrons are always scattered at the interface between the nonmagnetic conductive layer and the free magnetic layer regardless of the direction of an applied external magnetic field. The probability of the spin-down conduction electrons moving into the free magnetic layer remains low, and the mean free path of the spin-down conduction electrons remains shorter than that of the spin-up conduction electrons.

In contrast, the probability of the spin-up conduction electrons moving from the nonmagnetic conductive layer into the free magnetic layer is high when the magnetization directions of the free magnetic layer and the pinned magnetic layer are parallel to each other, and the mean free path of the spin-up conduction electrons is extended thereby. As the magnetization direction of the free magnetic layer is rotated from such a parallel state in response to an external magnetic field, the probability of the spin-up conduction electrons being scattered at the interface between the nonmagnetic conductive layer and the free magnetic layer increases, and the mean free path of the up-spin conduction electrons shortens.

As described above, the change in the mean free path of the spin-up conduction electrons in response to the external magnetic field is significantly large compared to that of the spin-down conduction electrons. As the difference in the mean free paths of the spin-up and spin-down conduction electrons increases, the mean free path of the entire conductive electrons changes significantly, resulting in an increased rate of change in resistance ($\Delta R/R$) of the spin-valve magnetic sensing element.

When the free magnetic layer is provided with a back layer, the spin-up conduction electrons in the free magnetic layer can move into the back layer, thereby extending the mean free path of the spin-up conduction electrons in proportion to the thickness of the back layer. Consequently, a so-called spin filter effect occurs, and the difference between the mean free paths of these two types of conduction electrons is increased to further improve the rate of change in resistance (ΔR/R) of the spin-valve magnetic sensing element.

In this method for making the magnetic sensing element, at least one of the ferromagnetic layer and the free magnetic layer is made of CoFeNi containing about 9 to about 17 atomic percent of Fe, about 0.5 to about 10 atomic percent of Ni, and the balance of Co.

Preferably, an interlayer composed of a CoFe alloy or elemental Co is formed between the nonmagnetic conductive layer and the free magnetic layer. At least one of the ferromagnetic layer and the free magnetic layer is preferably made of a CoFeNi alloy containing about 7 to about 15 atomic percent of Fe, about 5 to about 15 atomic percent of Ni, and the balance of Co when the interlayer is formed. More preferably, both the ferromagnetic layer and the free magnetic layer are made of the same CoFeNi alloy.

In the methods for making the magnetic sensing element according to the present invention, a recess having a bottom face thereof lying in the second antiferromagnetic layer may be formed in the laminate. When the bottom face of the recess is located in the second antiferromagnetic layer, the free magnetic layer and the adjacent ferromagnetic layer are separated from each other by the nonmagnetic interlayer, and the magnetization directions of the free magnetic layer and the ferromagnetic layer become antiparallel to each other and enter a ferrimagnetic state. At this time, the laminate consisting of the free magnetic layer, the nonmagnetic interlayer, and the ferromagnetic layer functions as a single free magnetic layers (i.e., a so-called synthetic ferrimagnetic free layer). The synthetic ferrimagnetic free layer has the same advantages as those achieved by reducing the thickness of the free magnetic layer. That is, the magnetization direction of the free magnetic layer can be readily rotated to improve the sensitivity of the magnetoresistive element to magnetic fields. Note that the free magnetic layer and the ferromagnetic layer are required to differ in the magnitude of the magnetic moment per unit area. The magnitude of the magnetic moment per unit area is expressed as a product of a saturation magnetization $M_s$ and a layer thickness t of each layer.

Preferably, the thickness of the portion of the second antiferromagnetic layer under the bottom face of the recess and the total thickness of the portion of the second antiferromagnetic layer under the bottom face of the recess and the third antiferromagnetic layer are not more than about 30 Å. In this manner, no exchange coupling magnetic field is generated in the portion of the second antiferromagnetic layer under the bottom face of the recess or between the portions of the second and third antiferromagnetic layers under the bottom face of the recess.

When the third ferromagnetic layer is deposited during step (g) above of forming the laminate, a recess having a bottom face thereof lying in the third antiferromagnetic layer may be formed. In such a case, the portion of the third antiferromagnetic layer under the bottom face of the recess preferably has a thickness of not more than about 30 Å to prevent generation of an exchange anisotropic magnetic field between the portion of the third antiferromagnetic layer overlaid by the recess and the ferromagnetic layer.

Alternatively, when the laminate has a nonmagnetic layer deposited on the ferromagnetic layer, the bottom face of the recess may lie in the nonmagnetic layer.

Alternatively, the bottom face of the recess may lie in the ferromagnetic layer or in the nonmagnetic interlayer.

When the bottom face of the recess lies in the ferromagnetic layer or the nonmagnetic interlayer, the ferromagnetic layer, disposed under the second antiferromagnetic layer, is magnetized as a result of exchange coupling with the second antiferromagnetic layer. The free magnetic layer, disposed under the ferromagnetic layer and separated by the nonmagnetic interlayer, is magnetized in a direction substantially orthogonal to the magnetization direction of the pinned magnetic layer as a result of the RKKY interaction with the ferromagnetic layer. The ferromagnetic layer, the nonmagnetic interlayer, and the free magnetic layer form a synthetic ferrimagnetic structure under the second antiferromagnetic layer. Under such a structure, the magnetization of the free magnetic layer can be easily oriented in a particular direction, even when the exchange coupling magnetic field generated between the second antiferromagnetic layer and the ferromagnetic layer is relatively weak.

Note that the free magnetic layer and the ferromagnetic layer are required to differ in the magnitude of the magnetic moment per unit area. The magnitude of the magnetic moment per unit area of each layer is expressed as the product of a saturation magnetization $M_s$ and a layer thickness t of each layer.

In steps (e) and (j) above, the second annealing temperature is preferably lower than the blocking temperature of the first antiferromagnetic layer. The magnitude of the second magnetic field is preferably smaller than the exchange anisotropic magnetic field of the first antiferromagnetic layer.

In the methods for making the magnetic sensing element of the present invention, each of steps (f) and (k) may be replaced by the step of (1) depositing a pair of electrode layers on the second antiferromagnetic layer, said pair of electrode layers being separated from each other by a gap in a track width direction, and removing the portion of the second antiferromagnetic layer sandwiched by said pair of electrode layers so as to form a recess having a width equal to the track width.

The pinned magnetic layer may be formed by depositing a plurality of ferromagnetic sublayers differing in the magnetic moment per unit area and at least one nonmagnetic intermediate sublayer separating the ferromagnetic sublayers.

In the pinned magnetic layer composed of the nonmagnetic intermediate sublayer and the ferromagnetic sublayers sandwiching the nonmagnetic intermediate sublayer, each of the ferromagnetic sublayers pins the magnetization of the other to firmly pin the magnetization of the pinned magnetic layer in a predetermined direction. A large exchange coupling magnetic field Hex, for example, of about 80 to about 160 kA/m, can be obtained between the first antiferromagnetic layer and the pinned magnetic layer. Thus, while preventing the magnetization of the pinned magnetic layer from rotating toward the track width direction during the annealing step for magnetizing the ferromagnetic layer or the free magnetic layer in the track width direction by the second antiferromagnetic layer, by performing the annealing step after the annealing step for magnetizing the pinned magnetic layer in the height direction by the first antiferromagnetic layer, a longitudinal bias magnetic field generated with the second antiferromagnetic layer can be increased.

Moreover, demagnetizing fields (dipole magnetic field) $H_d$ due to the pinned magnetization of the pinned magnetic layer counteract each other by magnetostatic coupling between the ferromagnetic sublayers. As a result, contribution of the demagnetizing fields by the pinned magnetization of the pinned magnetic layer to the variable magnetization of the free magnetic layer is moderated. Thus, the variable magnetization direction of the free magnetic layer can be readily oriented in a desired direction, and the resulting magnetic sensing element exhibits excellent symmetry with low asymmetry.

Here, as above, asymmetry indicates a degree of asymmetry in an output waveform. An output waveform has a low asymmetry when it is symmetrical. The asymmetry of the output waveform becomes closer to zero as the symmetry of the output waveform improves. The asymmetry is zero when the direction of the variable magnetization of the free magnetic layer is orthogonal to the magnetization direction of the pinned magnetic layer. At a high asymmetry, information on the recording medium cannot be accurately read, resulting in errors. A spin-valve magnetic sensing element with low asymmetry is more reliable for read signal processing.

Moreover, the demagnetizing field (dipole magnetic field) $H_d$ due to the pinned magnetization of the pinned magnetic layer has an uneven distribution in the element height direction in which the demagnetizing field is large at the end portions of the element and small at the central portion of the element, and may inhibit the free magnetic layer from entering a single magnetic domain state. In this invention, since the pinned magnetic layer has a multilayer structure described above, the dipole magnetic field $H_d$ can be reduced to substantially zero and Barkhausen noise due to the domain wall within the free magnetic layer and uneven distribution of the magnetization can be prevented.

The nonmagnetic intermediate sublayer may contain one metal selected from the group consisting of Ru, Rh, Ir, Cr, Re, and Cu.

The pinned magnetic layer may be a single layer of a ferromagnetic material.

In this invention, the free magnetic layer can be readily magnetized in a direction orthogonal to the magnetization direction of the pinned magnetic layer even when the first and second antiferromagnetic layers are made of the same antiferromagnetic material.

Preferably, at least one of the first and second antiferromagnetic layers is made of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The Pt content in the PtMn alloy and the X content in the X—Mn alloy are preferably in the range of about 37 to about 63 atomic percent. The Pt content in the PtMn alloy and the X content in the X—Mn alloy are preferably in the range of about 47 to about 57 atomic percent.

In the Pt—Mn—X' alloy, the X'+Pt content is preferably in the range of about 37 to about 63 atomic percent. More preferably, the X'+Pt content in the Pt—Mn—X' alloy is in the range of about 47 to about 57 atomic percent. Furthermore, the X' content in the Pt—Mn—X' alloy is preferably in the range of about 0.2 to about 10 atomic percent. When X' is at least one element selected from the group consisting of Pd, Ir, Rh, Ru, Os, Ni, and Fe, the X' content is preferably about 0.2 to about 40 atomic percent.

The first and second antiferromagnetic layers made of the above alloys are annealed to generate a large exchange coupling magnetic field. Particularly, the first and second antiferromagnetic layers made of the PtMn alloy generate an exchange coupling magnetic field of about 48 kA/m or more, for example, about 64 kA/m, and has a blocking temperature, (i.e., a temperature at which the exchange coupling magnetic field is lost), of 380° C., which is significantly high.

The above-described alloys in as-deposited state have a disordered face centered cubic (fcc) structure and are transformed into CuAuI-type ordered face centered tetragonal (fct) structure by annealing.

BRIEF DESCRIPTION OF THE DRAWINGS

FIG. 8 is a cross-sectional view of a magnetic sensing element according to an eighth embodiment of the present invention;

DESCRIPTION OF THE PREFERRED EMBODIMENTS

Figure 1:
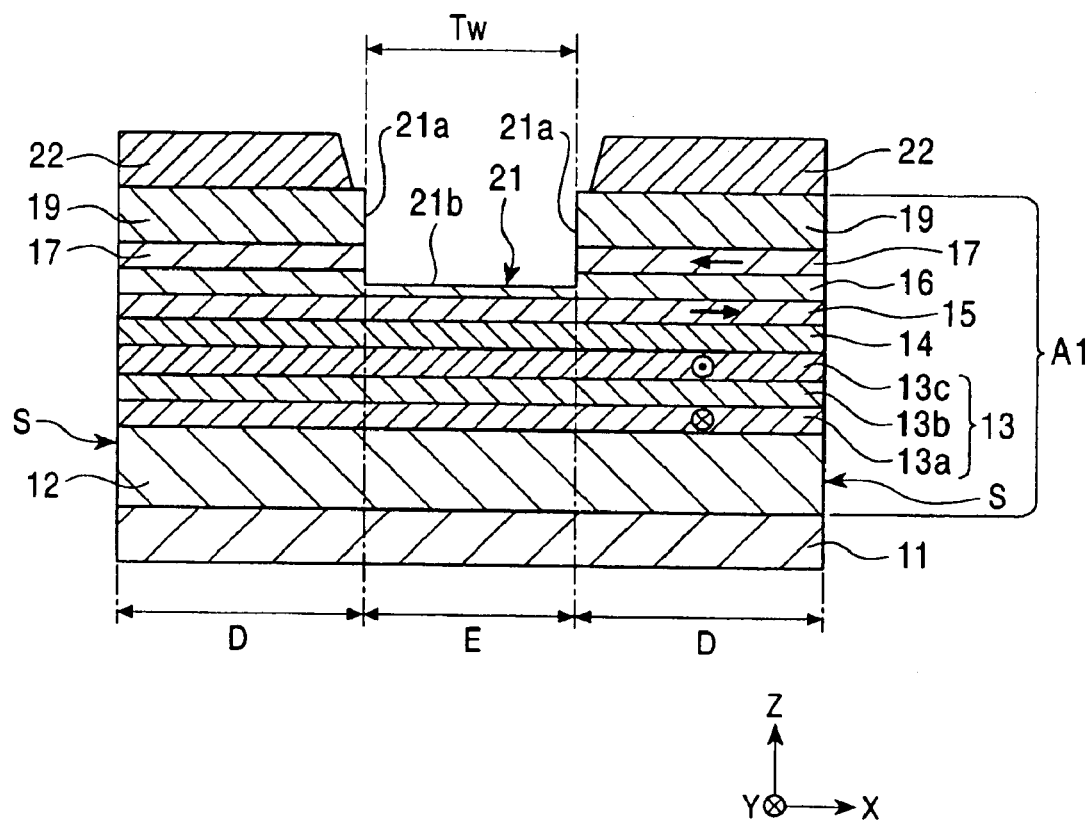
FIG. 1 is a cross-sectional view of a magnetic sensing element according to a first embodiment of the present invention.

FIG. 1 is a cross-sectional view of a magnetic sensing element in accordance with a first embodiment of the present invention, viewed from the surface facing a recording medium. The magnetic sensing element shown in FIG. 1 includes a first antiferromagnetic layer 12, a pinned magnetic layer 13 of synthetic ferripinned type comprising a first pinned magnetic sublayer 13a, a nonmagnetic intermediate sublayer 13b, and a second pinned magnetic sublayer 13c, a nonmagnetic conductive layer 14, a free magnetic layer 15, a nonmagnetic interlayer 16, a ferromagnetic layer 17, a second antiferromagnetic layer 19, and electrode layers 22 deposited in that order on a substrate 11 by a thin-film forming process, such as sputtering or vapor deposition. The second antiferromagnetic layer 19 and the ferromagnetic layer 17 function as longitudinal bias layers for the free magnetic layer 15.

The first antiferromagnetic layer 12 and the second antiferromagnetic layer 19, respectively, are composed of any one of a PtMn alloy, an X—Mn alloy, where X is at least one element selected from the group consisting of Pd, Ir, Rh, Ru, Os, Ni, and Fe, and a Pt—Mn—X' alloy, where X' is at least one element selected from the group consisting of Pd, Ir, Rh, Ru, Au, Ag, Os, Cr, Ni, Ar, Ne, Xe, and Kr.

By annealing the first antiferromagnetic layer 12 and the second antiferromagnetic layer 19 composed of such alloys, a large exchange coupling magnetic field can be obtained. In particular, a first antiferromagnetic layer 12 and a second antiferromagnetic layer 19, composed of a PtMn alloy, exhibit an exchange coupling magnetic field of about 48 kA/m or more. For example, the exchange coupling magnetic field can exceed 64 kA/m and these layers can have an extremely high blocking temperature, of about 380° C., at which these antiferromagnetic layers lose the exchange coupling magnetic field.

Although these alloys have a disordered face-centered cubic (fcc) structure immediately after deposition, the structure is transformed into an ordered face-centered tetragonal (fct) structure of CuAuI type by annealing treatment.

The first antiferromagnetic layer 12 has a thickness of about 80 o about 300 Å, for example, about 200 Å, near the center in the track width direction. In the magnetic sensing element of this embodiment, the first antiferromagnetic layer 12 and the second antiferromagnetic layer 19 may be composed of the same antiferromagnetic material.

In the PtMn alloy or the X—Mn alloy for forming the first antiferromagnetic layer 12 and the second antiferromagnetic layer 19, the Pt content or the X content is preferably in the range of about 37 to about 63 atomic percent. In the Pt—Mn—X' alloy, the X'+Pt content is preferably in the range of about 37 to about 63 atomic percent. Furthermore, in the Pt—Mn—X' alloy, the X' content is in the range of about 0.2 to about 10 atomic percent. However, when X' is at least one element selected from Pd, Ir, Rh, Ru, Os, Ni, and Fe, the X' content is preferably in the range of about 0.2 to about 40 atomic percent.

The compositional ranges for the PtMn alloy and the XMn alloy for forming the first antiferromagnetic layer 12 and the second antiferromagnetic layer 19 which are suitable for directing the magnetizations of the first antiferromagnetic layer 12 and the second antiferromagnetic layer 19 substantially orthogonal to each other will be described below along with a method for making the magnetic sensing element shown in FIG. 1.

The first pinned magnetic sublayer 13a and the second pinned magnetic sublayer 13c, respectively, are composed of a ferromagnetic material, such as an NiFe alloy, elemental Co, a CoNiFe alloy, a CoFe alloy, or a CoNi alloy, and preferably composed of an NiFe alloy or elemental Co. Preferably, the first pinned magnetic sublayer 13a and the second pinned magnetic sublayer 13c are composed of the same material.

The nonmagnetic intermediate sublayer 13b and the nonmagnetic interlayer 16, respectively, are composed of one metal selected from Ru, Rh, Ir, Cr, Re, and Cu, or an alloy composed of at least two of these metals. Among these, Ru is preferred.

The nonmagnetic conductive layer 14 inhibits magnetic coupling between the pinned magnetic layer 13 and the free magnetic layer 15. Furthermore, a sensing current primarily flows in the nonmagnetic conductive layer 14. Thus, the nonmagnetic conductive layer 14 is preferably composed of a conductive nonmagnetic material, such as Cu, Cr, Au, or Ag, and more preferably composed of Cu.

The free magnetic layer 15 and the ferromagnetic layer 17, respectively, are composed of a ferromagnetic material, such as an NiFe alloy, elemental Co, a CoNiFe alloy, a CoFe alloy, or a CoNi alloy, and preferably composed of an NiFe alloy or elemental Co. Preferably, the free magnetic layer 15 and the ferromagnetic layer 17 are composed of the same material.

The electrode layer 22 is, for example, formed of Au, W, Cr, or Ta. In the magnetic sensing element in this embodiment, steps are present between a recess 21 and the electrode layers 22 in the track width direction. Additionally, the electrode layers 22 may be deposited on the second antiferromagnetic layer 19 with protective layers composed of Ta, Cr, or the like therebetween. In such a case, the protective layers function as electrode underlayers.

In the magnetic sensing element shown in FIG. 1, the recess 21 is made so as to pass through the second antiferromagnetic layer 19 and the ferromagnetic layer 17. Side faces 21a of the recess 21 are perpendicular to the surface of the substrate 11. That is, the side faces 21a of the recess 21 are perpendicular to the track width direction (the X direction in the drawing). The recess 21 is formed so that a bottom face 21b thereof is located in the nonmagnetic interlayer 16. The width in the track width direction of the bottom face 21b is the same as a track width Tw.

In the magnetic sensing element shown in FIG. 1, the magnetization direction of the ferromagnetic layer 17 is pinned in the track width direction (in the opposite direction of the X direction) by magnetic coupling (exchange coupling) with the second antiferromagnetic layer 19. Furthermore, the magnetization direction of the free magnetic layer 15 formed under the ferromagnetic layer 17 with the nonmagnetic interlayer 16 therebetween is aligned in the track width direction (in the X direction) by the RKKY interaction with the ferromagnetic interlayer 17. That is, in the regions below the second antiferromagnetic layer 19 (at both ends D in the track width direction), the ferromagnetic layer 17, the nonmagnetic interlayer 16, and the free magnetic layer 15 constitute a synthetic ferrimagnetic structure, and thus the magnetization direction of the free magnetic layer 15 is easily aligned in the track width direction.

Consequently, even if the exchange coupling magnetic field between the second antiferromagnetic layer 19 and the ferromagnetic layer 17 is relatively weak, the magnetization direction of the free magnetic layer 15 is easily aligned in a direction substantially orthogonal to the magnetization direction of the pinned magnetic layer 13 without fail.

In this embodiment, since the sections of the second antiferromagnetic layer 19 facing the track width region do not taper, the magnetization direction of the free magnetic layer 15 is pinned by magnetic coupling with the second antiferromagnetic layer 19, which has a thickness sufficient for exhibiting antiferromagnetism at both ends D in the track width direction other than a region E, corresponding to the bottom face 21b of the recess 21.

In the absence of an applied external magnetic field, the region E of the free magnetic layer 15, corresponding to the bottom face 21b of the recess 21b, is aligned in the X direction, following both ends D in which the magnetization direction is pinned, while, in the presence of an applied external magnetic field, the magnetization of the region E of the free magnetic layer 15 is changed. Accordingly, the track width Tw of the magnetic sensing element is defined by the width of the bottom face 21b of the recess 21, and moreover, it is possible to avoid side reading in which recorded signals are read in regions outside the track width Tw.

As described above, the recess 21 can be made by simply etching the second antiferromagnetic layer 19 to have a uniform thickness perpendicular to the surface of the substrate 11 using reactive ion etching (RIE) or ion milling process. Therefore, the recess 21 can be made to a precise track width Tw. That is, the track width of the magnetic sensing element can be accurately defined.

Since insensitive regions do not occur in the region of the track width (optical track width) Tw, which has been physically set during the formation of the magnetic sensing element, it is possible to suppress a reduction in read output when the optical track width Tw is decreased as the recording density is increased. Furthermore, in this embodiment, since side faces S of the magnetic sensing element can be formed so as to be perpendicular to the track width direction, variations in the length of the free magnetic layer 15 in the track width direction can be suppressed.

In the present invention, in the regions below the second antiferromagnetic layer, the ferromagnetic layer, the nonmagnetic interlayer, and the free magnetic layer, which constitute a laminated ferrimagnetic structure, a ferrimagnetic state is exhibited in which the magnetization direction of the ferromagnetic layer and the magnetization direction of the free magnetic layer adjacent to the ferromagnetic layer are antiparallel to each other.

In order to appropriately maintain the antiparallel state, the exchange coupling magnetic field due to the RKKY interaction between the ferromagnetic layer and the free magnetic layer must be increased by improving the materials for the ferromagnetic layer and the free magnetic layer. NiFe alloys are often used as magnetic materials for forming the ferromagnetic layer and the free magnetic layer. Although the NiFe alloys have been used for free magnetic layers, and the like, because of their superior soft magnetic properties, when the laminated ferrimagnetic structure is constructed using the NiFe alloys for the ferromagnetic layer and the free magnetic layer, antiparallel coupling between these layers is not substantially large.

Therefore, in the present invention, a CoFeNi alloy is used for at least one of the ferromagnetic layer and the free magnetic layer, and preferably for both of these layers. The use of CoFeNi alloy materials for the ferromagnetic layer and the free magnetic layer, increases the antiparallel coupling between the ferromagnetic layer and the free magnetic layer. Also, the magnetization of both ends of the free magnetic layer outside the track width are not influenced by an external magnetic field, and side reading is appropriately suppressed.

Figure 11:
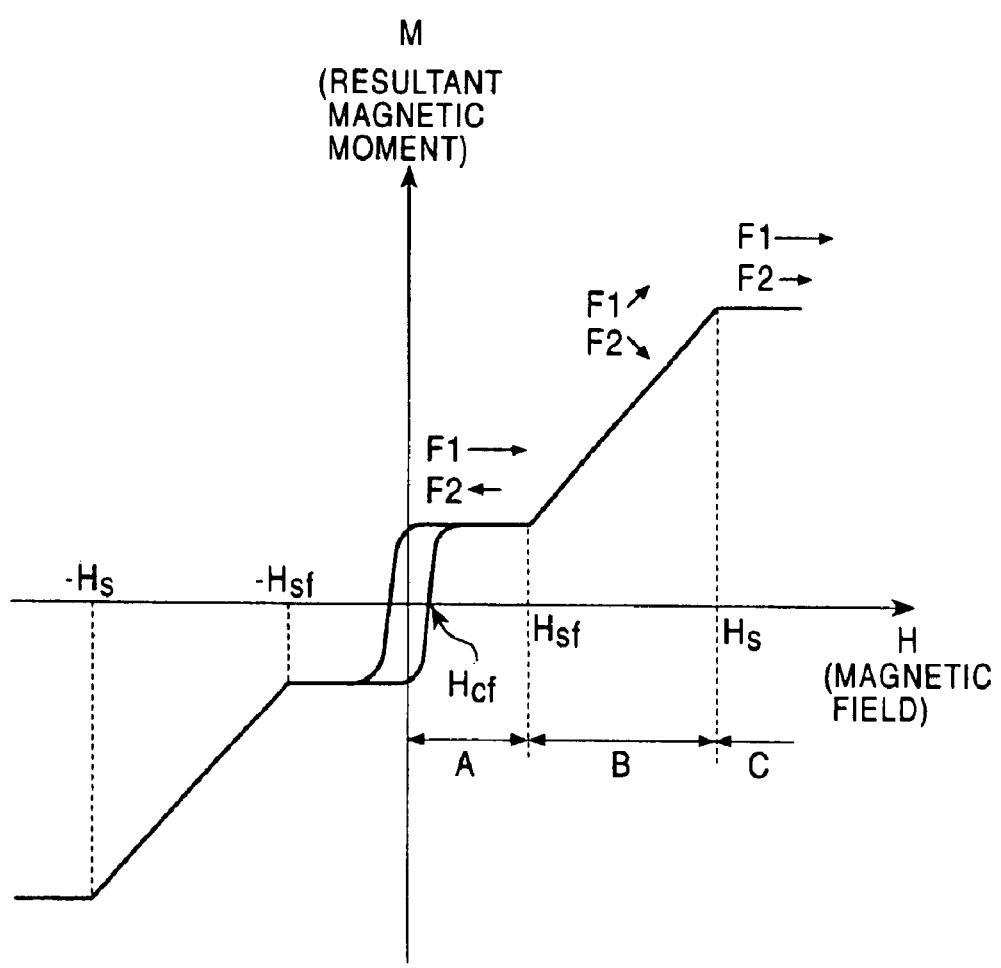
FIG. 11 is a graph schematically showing a hysteresis loop of a free magnetic layer having a laminated ferrimagnetic structure.
Figure 12:
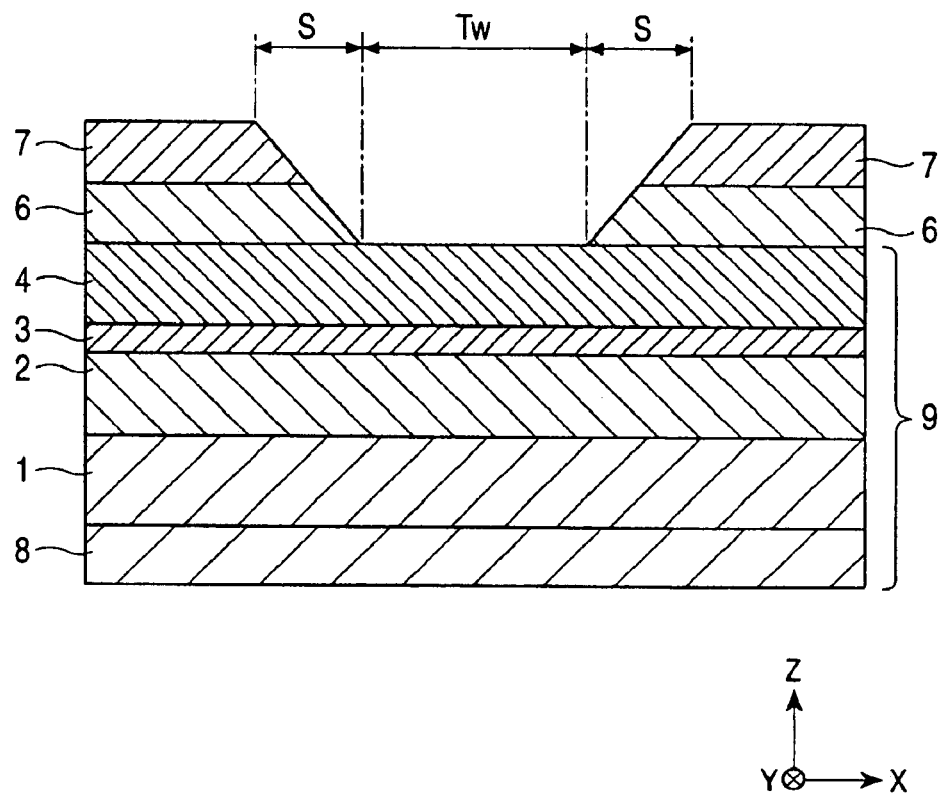
FIG. 12 is a cross-sectional view of a conventional magnetic sensing element.
Figure 13:
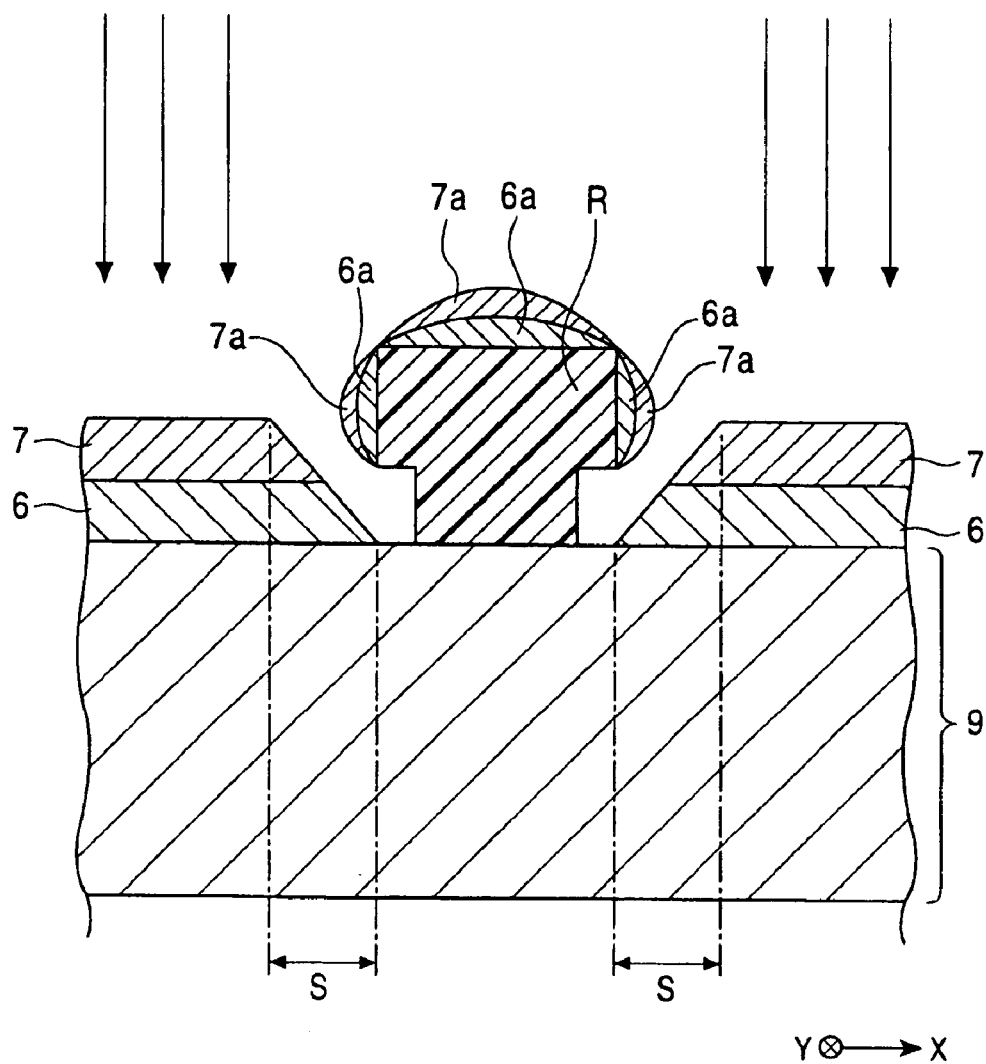
FIG. 13 is a diagram illustrating a step of a conventional method for making the conventional magnetic sensing element.

FIG. 11 is a conceptual diagram of a hysteresis loop for a so-called "laminated ferrimagnetic structure" in which thin films composed of ferromagnetic materials are laminated with a nonmagnetic layer therebetween. For example, the magnetic moment (saturation magnetization $M_s \times$ thickness t) for a unit area of a first ferromagnetic layer (F1) is assumed to be larger than the magnetic moment for a unit area of a second ferromagnetic layer (F2). An external magnetic field is assumed to be applied in the right hand direction in the drawing.

A resultant magnetic moment for the unit area determined by the vector sum of the magnetic moment for the unit area of the first ferromagnetic layer and the magnetic moment for the unit area of the second ferromagnetic material layer ($|M_s \cdot t(F1) + M_s \cdot t(F2)|$) remains constant up to a certain point even if the external magnetic field is increased. In an external magnetic field region A in which the resultant magnetic moment for the unit area remains constant, since antiparallel coupling between the first ferromagnetic layer and the second ferromagnetic layer is stronger than the external magnetic field, the magnetizations of the first and second ferromagnetic layers are aligned in single-domain states that are antiparallel to each other.

However, the resultant magnetic moment for the unit area increases as the rightward external magnetic field is further increased. The reason for this is that since the external magnetic field is stronger than the antiparallel coupling between the first ferromagnetic layer and the second ferromagnetic layer, the magnetizations of the first ferromagnetic layer and the second ferromagnetic layer are dispersed and the single-domain state is changed to a multidomain state. Thus, the resultant magnetic moment for the unit area determined by the vector sum is increased. In an external magnetic field region B, when the resultant magnetic moment for the unit area is increased, the antiparallel state of the ferromagnetic layers is lost. The magnitude of the external magnetic field at which the resultant magnetic moment for the unit area starts to increase is referred to as a spin-flop magnetic field ($H_{sf}$).

When the rightward external magnetic field is increased further, the magnetizations of the first ferromagnetic layer and the second ferromagnetic layer are aligned in single-domain states again, and both layers are magnetized rightward this time. The resultant magnetic moment for the unit area in this external magnetic field region C remains constant. The magnitude of the external magnetic field at which the resultant magnetic moment for the unit area becomes constant is referred to as a saturation magnetic field ($H_s$).

It has been found that, when a CoFeNi alloy is used for the first ferromagnetic layer and the second ferromagnetic layer, the magnetic field at which the antiparallel state is lost, (i.e., the spin-flop magnetic field ($H_{sf}$)) can be satisfactorily increased compared to the case in which a NiFe alloy is used.

Using both a NiFe alloy for comparison and a CoFeNi alloy of the present invention for first and second ferromagnetic layers, experiments were conducted in order to find the magnitude of the spin-flop magnetic field. A layered film structure was used that included the following layers: substrate/nonmagnetic conductive layer (Cu)/first ferromagnetic layer (2.4 nm)/nonmagnetic interlayer (Ru)/second ferromagnetic layer (1.4 nm).

An NiFe alloy with an Ni content of about 80 atomic percent and an Fe content of about 20 atomic percent was used for the first ferromagnetic layer and the second ferromagnetic layer in comparative example. In such a case, the spin-flop magnetic field ($H_{sf}$) was approximately 59 kA/m.

A CoFeNi alloy with a Co content of about 87 atomic percent, an Fe content of about 11 atomic percent, and an Ni content of about 2 atomic percent was used for the first ferromagnetic layer and the second ferromagnetic layer in accordance with the invention. In such a case, the spin-flop magnetic field ($H_{sf}$) was approximately 293 kA/m.

As is known from the above, the spin-flop magnetic field can be efficiently improved by using the CoFeNi alloy for the first ferromagnetic layer and the second ferromagnetic layer in comparison with the case in which the NiFe alloy is used. That is, by using a CoFeNi alloy for at least one of the ferromagnetic layer and the free magnetic layer, preferably for both layers, the spin-flop magnetic field of the ferromagnetic layer and the free magnetic layer can be efficiently improved.

Next, the compositional ratio of the CoFeNi alloy will be described. The magnetostriction of a layer composed of the CoFeNi alloy is known to be shifted positively by approximately about $1 \times 6^{-6}$ to about $6 \times 10^{-6}$ when the layer is in contact with a nonmagnetic interlayer composed of Ru in comparison with the case in which the NiFe alloy is used.

The magnetostriction is preferably in the range of about $-3 \times 10^{-6}$ to about $3 \times 10^{-6}$. The coercive force is preferably about 790 A/m or less. If the magnetostriction is large, stress tends to increase due to film deposition strain and a difference in thermal expansion coefficients among layers, and therefore the magnetostriction is preferably low. The coercive force is also preferably low, and thereby the magnetization of the free magnetic layer can be reversed satisfactorily in response to an external magnetic field.

In the present invention, when a layered film structure including a nonmagnetic conductive layer, a free magnetic layer, a nonmagnetic interlayer, and a ferromagnetic layer is employed, with respect to the CoFeNi alloy, preferably, the Fe content is in the range of about 9 to about 17 atomic percent, the Ni content is in the range of about 0.5 to about 10 atomic percent, and the balance is Co. If the Fe content is larger than about 17 atomic percent, the magnetostriction is negatively increased from about $-3 \times 10^{-6}$ and soft magnetic properties are degraded. Correspondingly, if the Fe content is less than about 9 atomic percent, the magnetostriction exceeds about $3 \times 10^{-6}$ and the soft magnetic properties are degraded. Still further, if the Ni content is larger than about 10 atomic percent, the magnetostriction exceeds about $3 \times 10^{-6}$ and a change in resistance ($\Delta R$) and a rate of the change in resistance ($\Delta R/R$) are reduced due to diffusion of Ni at the interface with the nonmagnetic layer. Also, if the Ni content is less than about 0.5 atomic percent, the magnetostriction negatively increases from about $-3 \times 10^{-6}$.

The coercive force can be set at about 790 A/m or less if the compositional ranges described above are satisfied.

Next, when an interlayer composed of either a CoFe alloy or Co is formed between the free magnetic layer and the nonmagnetic conductive layer, specifically, for example, when a layered film structure including a nonmagnetic conductive layer, an interlayer (CoFe alloy), a free magnetic layer, a nonmagnetic interlayer, and a ferromagnetic layer is employed, with respect to the CoFeNi alloy, preferably, the Fe content is in the range of about 7 to about 15 atomic percent, the Ni content is in the range of about 5 to about 15 atomic percent, and the balance is Co. If the Fe content is larger than about 15 atomic percent, the magnetostriction is increased negatively from about $-3 \times 10^{-6}$ and soft magnetic properties are degraded. Correspondingly, if the Fe content is less than about 7 atomic percent, the magnetostriction exceed about $3 \times 10^{-6}$ and soft magnetic properties are degraded. Still further, if the Ni content is larger than about 15 atomic percent, the magnetostriction exceeds about $3 \times 10^{-6}$. Also, if the Ni content is less than about 5 atomic percent, the magnetostriction is negatively increased from about $-3 \times 10^{-6}$.

If the compositional ranges described above are satisfied, the coercive force can be set at about 790 A/m or less.

Additionally, since the interlayer composed of the CoFe alloy or Co has negative magnetostriction, with respect to the CoFeNi alloy, the Fe content is slightly lower and the Ni content is slightly larger in comparison with the case in which the interlayer is not interposed between the free magnetic layer and the nonmagnetic conductive layer.

By disposing an interlayer composed of a CoFe alloy or Co between the nonmagnetic conductive layer and the free magnetic layer as described above, diffusion of metallic elements between the free magnetic layer and the nonmagnetic conductive layer can be more effectively prevented.

In the first embodiment, at least one of the free magnetic layer 15 and the ferromagnetic layer 17 is composed of a magnetic material having a composition described below.

The magnetic material is represented by the formula CoFeNi, in which the Fe content is in the range of about 9 to about 17 atomic percent, the Ni content is in the range of about 0.5 to about 10 atomic percent, and the balance is Co.

Consequently, an exchange coupling magnetic field due to the RKKY interaction between the free magnetic layer 15 and the ferromagnetic layer 17 can be increased. Specifically, the magnetic field at which the antiparallel state is lost, (i.e., the spin-flop magnetic field ($H_{sf}$)), can be increased to approximately 293 kA/m. Thereby, the magnetizations of the free magnetic layer 15 and the ferromagnetic layer 17 at both ends can be appropriately pinned in an antiparallel state, and side reading can be suppressed.

Preferably, both the free magnetic layer 15 and the ferromagnetic layer 17 are composed of the CoFeNi alloy. Consequently, a large spin-flop magnetic field can be more stable, and the free magnetic layer 15 and the ferromagnetic layer 17 can be appropriately magnetized in an antiparallel state.

If the compositional ranges described above are satisfied, the magnetostriction of the free magnetic layer 15 and the ferromagnetic layer 17 can be set in the range of about $-3 \times 10^{-6}$ to about $3 \times 10^{-6}$, and the coercive force can be set at about 790 A/m or less. Moreover, the soft magnetic properties of the free magnetic layer 15 can be improved, and reductions in a change in resistance ($\Delta R$) and a rate of the change in resistance ($\Delta R/R$), due to diffusion of Ni at the interface with the nonmagnetic conductive layer 14, can be appropriately suppressed.

In the magnetic sensing element shown in FIG. 1, the nonmagnetic interlayer 16 functions as a protective layer for the free magnetic layer 15 in the region corresponding to the track width Tw. By forming a nonmagnetic interlayer 16 using a conductive material, the nonmagnetic interlayer 16 can function as a back layer exhibiting a spin filter effect. The spin filter effect will now be described below.

Figure 9:
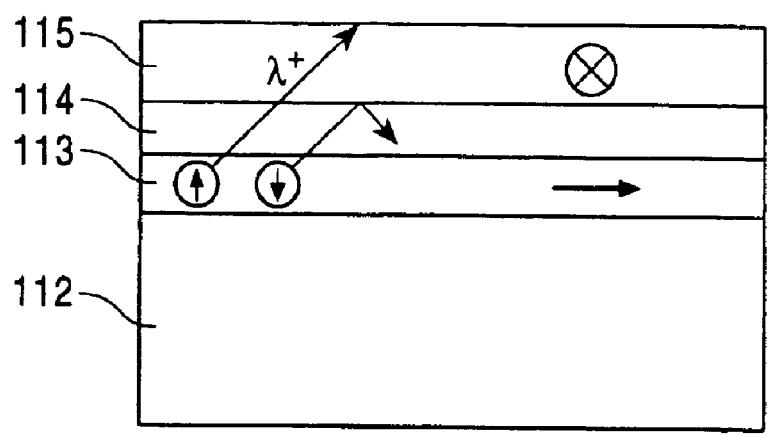
FIG. 9 is an illustration for explaining the spin filter effect induced by a back layer.
Figure 10:
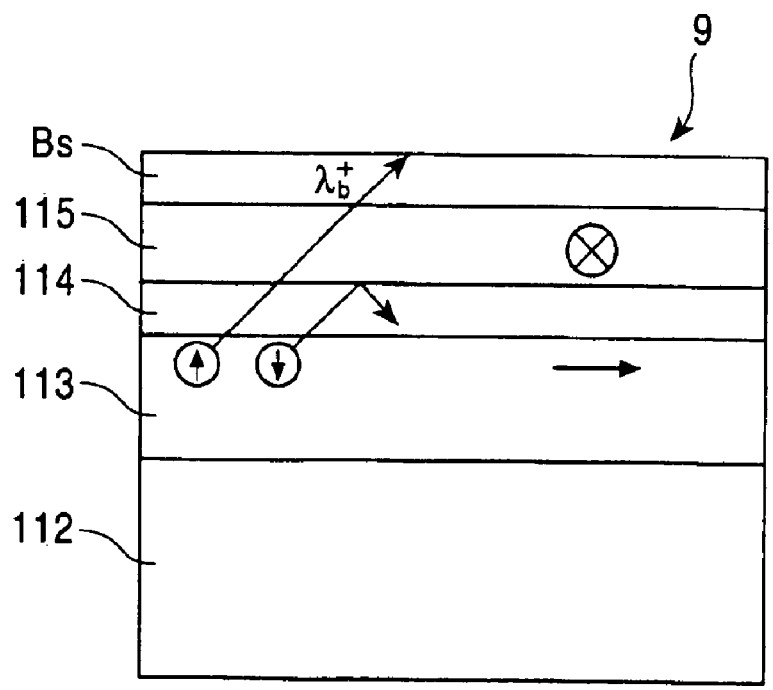
FIG. 10 is an illustration for explaining the spin filter effect induced by the back layer.

FIGS. 9 and 10 are schematic diagrams illustrating the spin filter effect due to a back layer in a spin-valve magnetic sensing element. FIG. 9 shows a structure in which a back layer is not provided, and FIG. 10 shows a structure in which a back layer is provided.

A giant magnetoresistance (GMR) effect is mainly caused by "spin-dependent scattering" of electrons. That is, the GMR effect is obtained using the difference between the mean free path $\lambda+$ of the conduction electrons having a spin parallel to the magnetization direction of a magnetic material, i.e., a free magnetic layer (for example, spin-up electrons) and the mean free path $\lambda-$ of the conduction electrons having a spin antiparallel to the magnetization direction (for example, spin-down electrons). In FIGS. 9 and 10, upward arrows represent the spin-up conduction electrons, and downward arrows represent the spin-down conduction electrons. When an electron enters the free magnetic layer 115, if the electron has a spin parallel to the magnetization direction of the free magnetic layer 115, i.e., if the electron is a spin-up electron, the electron can freely move. In contrast, if the electron is a spin-down electron, the electron is immediately scattered.

The reason for this is that the mean free path $\lambda+$ of the spin-up electrons is, for example, approximately 50 Å, while the mean free path $\lambda-$ of the spin-down electrons is approximately 6 Å, which is almost one tenth shorter than that of the spin-up electrons. The thickness of a free magnetic layer 115 is set larger than the mean free path $\lambda-$ the spin-down electrons, which is approximately 6 Å, and is set smaller than the mean free path $\lambda+$ of the spin-up electrons, which is approximately 50 Å. Therefore, when entering the free magnetic layer 115, the spin-up conduction electrons pass through the free magnetic layer 115, while the spin-down conduction electrons are immediately scattered by the free magnetic layer 115, namely, are filtered out.

The spin-down electrons, which originate in a pinned magnetic layer 113 and pass through a nonmagnetic conductive layer 114, are scattered in the vicinity of the interface between the free magnetic layer 115 and the nonmagnetic conductive layer 114 and do not substantially reach the free magnetic layer 115. That is, even if the magnetization direction of the free magnetic layer 115 is rotated, the mean free path of the spin-down electrons is not changed, and thus the spin-down electrons do not affect the rate of the change in resistance due to the GMR effect. Therefore, with respect to the GMR effect, only the behavior of the spin-up electrons may be taken into consideration.

The spin-up electrons originating in the pinned magnetic layer 113 pass through the nonmagnetic conductive layer 114 having a thickness that is shorter than the mean free path $\lambda+$ of the spin-up electrons, and reach the free magnetic layer 115. The spin-up electrons can be easily transported through the free magnetic layer 115. This is because the spin-up electrons have a spin parallel to the magnetization direction of the free magnetic layer 115.

In a state in which the magnetization direction of the pinned magnetic layer and the magnetization direction of the free magnetic layer are antiparallel to each other, the spin of the spin-up electrons is not parallel to the magnetization direction of the free magnetic layer 115. In such a case, the spin-up electrons are scattered in the vicinity of the interface between the free magnetic layer 115 and the nonmagnetic conductive layer 114, and the effective mean free path of the spin-up electrons is suddenly decreased. That is, the resistance is increased. The rate of the change in resistance has a positive correlation with the change in the effective mean free path of the spin-up electrons.

As shown in FIG. 10, when a back layer Bs is provided, the spin-up electrons which have passed through the free magnetic layer 115 are transported through the back layer Bs by an additional mean free path $\lambda+_b$ determined by the material of the back layer Bs, and then are scattered. That is, by providing the back layer Bs, the mean free path $\lambda+$ of the spin-up electrons is extended by the additional mean free path $\lambda+_b$ length.

In this embodiment, since the nonmagnetic interlayer 16, shown in FIG. 1, functions as a back layer, the mean free path of spin-up conduction electrons can be extended. Therefore, a change in the mean free path of spin-up electrons due to an applied external magnetic field is increased, thus improving the rate of the change in resistance ($\Delta R/R$) in the spin-valve magnetic sensing element.

In this embodiment, even when the first antiferromagnetic layer 12 and the second antiferromagnetic layer 19 are composed of the same antiferromagnetic material, it is possible to direct the exchange anisotropic magnetic field of the second antiferromagnetic layer 19 in the X direction, while maintaining the direction of the exchange anisotropic magnetic field of the first antiferromagnetic layer 12 in the Y direction. That is, in this embodiment, the magnetization direction of the free magnetic layer 15 can be pinned in a direction substantially orthogonal to the magnetization direction of the pinned magnetic layer 13.

In this embodiment, although the first antiferromagnetic layer 12 is deposited directly on the substrate 11, the first antiferromagnetic layer 12 may be deposited on the substrate 11 with an underlayer composed of an alumina film or Ta, or the like therebetween. The extension of the difference in the mean free path between the spin-up conduction electrons and the spin-down conduction electrons due to the spin filter effect is more effective when the free magnetic layer has a relatively small thickness. If the thickness of the free magnetic layer 15 is smaller than about 15 Å, it is difficult to make the free magnetic layer 15 function as a ferromagnetic layer, and a sufficient magnetoresistance effect cannot be obtained. Correspondingly, if the thickness of the free magnetic layer 15 is larger than about 45 Å, the number of spin-up conduction electrons which are scattered before reaching the nonmagnetic interlayer 16 is high, and the rate of the change in resistance due to the spin filter effect changes at a reduced ratio.

In FIG. 1, the pinned magnetic layer 13 includes the first pinned magnetic sublayer 13a and the second pinned magnetic sublayer 13c having different magnetic moments for a unit area, separated by the nonmagnetic intermediate sublayer 13b.

The first pinned magnetic sublayer 13a is brought into contact with the first antiferromagnetic layer 12, and by annealing in a magnetic field, an exchange anisotropic magnetic field is generated by exchange coupling at the interface between the first pinned magnetic sublayer 13a and the first antiferromagnetic layer 12. Thus, the magnetization direction of the first pinned magnetic sublayer 13a is pinned in the Y direction. When the magnetization direction of the first pinned magnetic sublayer 13a is pinned in the Y direction, the magnetization direction of the second pinned sublayer 13c is antiparallel to the magnetization direction of the first pinned magnetic sublayer 13a.

The direction of the resultant magnetic moment determined by the sum of the magnetic moments of the first pinned magnetic sublayer 13a and the second pinned magnetic sublayer 13c corresponds to the magnetization direction of the pinned magnetic layer 13.

As described above, the magnetization directions of the first pinned magnetic sublayer 13a and the second pinned magnetic sublayer 13c are antiparallel to each other, (i.e., in a ferrimagnetic state). Since the first pinned magnetic sublayer 13a pins the magnetization direction of the second pinned magnetic sublayer 13c and the second pinned magnetic sublayer 13c pins the magnetization direction of the first pinned magnetic sublayer 13a, the overall magnetization direction of the pinned magnetic layer 13 can be stabilized in one direction.

The first pinned magnetic sublayer 13a and the second pinned magnetic sublayer 13c, respectively, are preferably composed of a ferromagnetic material, such as an NiFe alloy, elemental Co, a CoNiFe alloy, a CoFe alloy, or a CoNi alloy and, more preferably, composed of an NiFe alloy or elemental Co. Preferably, the first pinned magnetic sublayer 13a and the second pinned magnetic sublayer 13c are composed of the same material. In the magnetic sensing element shown in FIG. 1, the first pinned magnetic sublayer 13a and the second pinned magnetic sublayer 13c are composed of the same material and have different thicknesses, and thereby they have different magnetic moments for the unit area.

The nonmagnetic intermediate sublayer 13b is preferably composed of a nonmagnetic material, such as Ru, Rh, Ir, Cr, Re, or Cu, or an alloy of at least two of these metals and, more preferably, composed of Ru.

When the pinned magnetic layer 13 has a laminated structure in which the nonmagnetic intermediate sublayer 13b is interposed between the first pinned magnetic sublayer 13a and the second pinned magnetic sublayer 13c, each of the first pinned magnetic sublayer 13a and the second pinned magnetic sublayer 13c pins the magnetization direction of the opposite layer, and the overall magnetization direction of the pinned magnetic layer 13 can be firmly pinned in one direction. That is, a large exchange coupling magnetic field $H_{ex}$ between the first antiferromagnetic layer 12 and the pinned magnetic layer 13 of, for example, about 80 to about 160 kA/m can be obtained.

In this embodiment, the demagnetizing field (dipole magnetic field) due to the pinned magnetization of the pinned magnetic layer 13 can be cancelled, because the magnetostatic couplings of the first pinned magnetic sublayer 13a and the second pinned magnetic sublayer 13c mutually counteract. Accordingly, it is possible to reduce the influence of the demagnetizing field (dipole magnetic field) due to the pinned magnetization of the pinned magnetic layer 13 on the variable magnetization of the free magnetic layer 15. Consequently, the direction of the variable magnetization of the free magnetic layer 15 can be more easily directed to a desired direction, and it is possible to obtain a magnetic sensing element having superior symmetry.

The demagnetizing field (dipole magnetic field) $H_d$ due to the pinned magnetization of the pinned magnetic layer 13 has a nonuniform profile in the element height direction in which the demagnetizing field is large at the ends and small in the center, which may prevent the single-domain alignment in the free magnetic layer 15. By employing the pinned magnetic layer 13 having the laminated structure described above, however, the dipole magnetic field $H_d$ can be set to be substantially zero. Thus, domain walls are prevented from occurring in the free magnetic layer 15 that can produce nonuniform magnetization, and Barkhausen noise and the like are prevented from occurring.

Alternatively, the pinned magnetic layer 13 may be a single layer composed of a ferromagnetic material.

In the spin-valve magnetic sensing element, when a steady-state current is applied through the electrode layers 22 to the free magnetic layer 15, the nonmagnetic conductive layer 14, and the pinned magnetic layer 13 and a leakage magnetic field from a magnetic recording medium travelling in the Z direction is applied in the Y direction, the magnetization direction of the free magnetic layer 15 is varied from the X direction to the Y direction. Electrical resistance changes due to the relationship between the varied magnetization direction of the free magnetic layer 15 and the magnetization direction of the second pinned magnetic sublayer 13c, and the leakage magnetic field from the magnetic recording medium are detected by a voltage change based on the change in the electrical resistance.

Additionally, an antidiffusion layer composed of Co or the like may be formed between the free magnetic layer 15 and the nonmagnetic conductive layer 14. The antidiffusion layer prevents interdiffusion between the free magnetic layer 15 and the nonmagnetic conductive layer 14. An antidiffusion layer composed of Co or the like may also be formed between the second pinned magnetic sublayer 13c and the nonmagnetic conductive layer 14. This antidiffusion layer prevents interdiffusion between the second pinned magnetic sublayer 13c and the nonmagnetic conductive layer 14.

A first method for making the magnetic sensing element shown in FIG. 1 will be described below.

First, the first antiferromagnetic layer 12 is deposited on the substrate 11. The pinned magnetic layer 13 of synthetic ferripinned type comprising the first pinned magnetic sublayer 13a, the nonmagnetic intermediate sublayer 13b, and the second pinned magnetic sublayer 13c, is deposited thereon. Then, the nonmagnetic conductive layer 14, the free magnetic layer 15, the nonmagnetic interlayer 16, the ferromagnetic layer 17, and the second antiferromagnetic layer 19 are deposited on the pinned magnetic layer 13 to form a laminate A1. Preferably, laminate A1 is continuously formed in the same vacuum deposition system by a thin-film forming process, such as sputtering or vapor deposition.

The first antiferromagnetic layer 12 and the second antiferromagnetic layer 19, respectively, are composed of any one of a PtMn alloy, an X—Mn alloy, where X is at least one element selected from the group consisting of Pd, Ir, Rh, Ru, Os, Ni, and Fe, and a Pt—Mn—X' alloy, where X' is at least one element selected from the group consisting of Pd, Ir, Rh, Ru, Au, Ag, Os, Cr, Ni, Ar, Ne, Xe, and Kr.

Although these alloys have a disordered face-centered cubic (fcc) structure immediately after deposition, the structure is transformed into an ordered face-centered tetragonal (fct) structure of CuAuI type by annealing treatment.

The first antiferromagnetic layer 12 has a thickness of about 80 to about 300 Å near the center in the track width direction.

The first pinned magnetic sublayer 13a and the second pinned magnetic sublayer 13c are preferably composed of the same material. Also, the free magnetic layer 15 and the ferromagnetic layer 17 are preferably composed of the same material.

In the present invention, as described above, the individual layers from the first antiferromagnetic layer 12 to the second antiferromagnetic layer 19 are continuously deposited. Consequently, the surfaces of the individual layers are not exposed to air, and since it is not necessary to clean the surface of each layer by ion milling or reverse sputtering before forming a layer thereon, the production step is very efficient. In accordance with this method, magnetic sensing elements can be produced with consistency. Furthermore, since it is not necessary to clean the surfaces of the individual layers by ion milling or reverse sputtering, it is possible to avoid problems resulting from cleaning, such as contamination due to redeposition, and an adverse effect on the generation of exchange coupling magnetic fields due to disturbances in the crystal states on the surfaces. Since deposition is performed continuously in the present invention, even without cleaning steps, exchange coupling magnetic fields can be appropriately generated between the first antiferromagnetic layer 12 and the first pinned magnetic sublayer 13a, and between the second antiferromagnetic layer 19 and the ferromagnetic layer 17.

Next, a first annealing step is performed. Annealing is performed at a first annealing temperature, while applying a first magnetic field in the Y direction that is perpendicular to the track width Tw direction (X direction). Thereby, exchange coupling magnetic fields are generated between the first antiferromagnetic layer 12 and the first pinned magnetic sublayer 13a and between the second antiferromagnetic layer 19 and the ferromagnetic layer 17 so that the magnetization directions of the first pinned magnetic sublayer 13a, and the ferromagnetic layer 17, are pinned in the same direction. Simultaneously, the exchange coupling magnetic field between the first antiferromagnetic layer 12 and the first pinned magnetic sublayer 13a is set larger than the exchange coupling magnetic field between the second antiferromagnetic layer 19 and the ferromagnetic layer 17.

In order to set the exchange coupling magnetic field between the first antiferromagnetic layer 12 and the first pinned magnetic sublayer 13a larger than the exchange coupling magnetic field between the second antiferromagnetic layer 19 and the ferromagnetic layer 17, the first annealing temperature is preferably in the range of about 220 to about 245° C. Thereby, the exchange coupling magnetic field between the first antiferromagnetic layer 12 and the first pinned magnetic sublayer 13a can be set at about $1.58 \times 10^4$ A/m or more. More preferably, the first annealing temperature is about 230° C. or more, and thereby a large exchange coupling magnetic field of about $4.74 \times 10^4$ A/m or more can be generated.

On the other hand, the exchange coupling magnetic field between the second antiferromagnetic layer 19 and the ferromagnetic layer 17 is smaller than the exchange coupling magnetic field between the first antiferromagnetic layer 12 and the first pinned magnetic sublayer 13a.

Next, a second annealing step is performed. In this step, annealing is performed at a second annealing temperature that is higher than the first annealing temperature, while applying a second magnetic field in the track width Tw direction that is perpendicular to the first magnetic field. The second applied magnetic field is larger than the exchange coupling magnetic field between the second antiferromagnetic layer 19 and the ferromagnetic layer 17 generated in the first annealing step, and is smaller than the exchange coupling magnetic field between the first antiferromagnetic layer 12 and the first pinned magnetic sublayer 13a generated in the first annealing step. Preferably, the second annealing temperature is in the range of about 250 to about 270° C.

Thereby, the exchange coupling magnetic field between the second antiferromagnetic layer 19 and the ferromagnetic layer 17 can be set at about $3.16 \times 10^4$ A/m or more, which is larger than the exchange coupling magnetic field generated in the first annealing step.

At this stage, since the second applied magnetic field is smaller than the exchange coupling magnetic field between the first antiferromagnetic layer 12 and the first pinned magnetic sublayer 13a, even if the second applied magnetic field is applied to the first antiferromagnetic layer 12, the exchange coupling magnetic field between the first antiferromagnetic layer 12 and the first pinned magnetic sublayer 13a will not be deteriorated. Further, it is possible to maintain the magnetization direction of the pinned magnetic layer 13 in the height direction. Additionally, since the pinned magnetic layer 13 has the synthetic ferrimagnetic structure, the magnetization is stabilized and the magnetization directions of the first pinned magnetic sublayer 13a and the second pinned magnetic sublayer 13c are antiparallel to each other.

As described above, by appropriately setting the temperatures and the magnitudes and directions of the applied magnetic fields in the two annealing steps, the magnetization direction of the pinned magnetic layer 13 and the magnetization direction of the free magnetic layer 15 can be appropriately and easily adjusted so as to be substantially orthogonal to each other.

Since the magnitudes of the exchange coupling magnetic field between the first antiferromagnetic layer 12 and the first pinned magnetic sublayer 13a and the exchange coupling magnetic field between the second antiferromagnetic layer 19 and the ferromagnetic layer 17 greatly depend on the compositional ratios of the individual layers, the compositional ratios are preferably adjusted when the first antiferromagnetic layer 12 and the second antiferromagnetic layer 19 are formed. For example, the first antiferromagnetic layer 12 is composed of an $X_m M_{100-m}$ alloy, where X is at least one element selected from the group consisting of Pt, Pd, Ir, Rh, Ru, and Os, and the subscript m preferably satisfies the relationship about 46 atomic percent $\leq m \leq$ about 53.5 atomic percent. More preferably, m is in the range of about 48.5 to about 52.7 atomic percent.

Alternatively, the first antiferromagnetic layer 12 is composed of a $Pt_m Mn_{100-m-n} Z_n$ alloy, where Z is at least one element selected from the group consisting of Pd, Ir, Rh, Ru, and Os, the subscripts m and n preferably satisfy the relationships 46 at. $\% \leq m+n \leq 53.5$ at. % and 0.2 at. $\% \leq n \leq 40$ at. %. More preferably, m+n is in the range of 48.5 to 52.7 atomic percent.

In another alternative, the first antiferromagnetic layer 12 is composed of a $Pt_q Mn_{100-q-j} L_j$ alloy, where L is at least one element selected from the group consisting of Au, Ag, Cr, Ni, Ne, Ar, Xe, and Kr, the subscripts q and j preferably satisfy the relationships 46 at. $\% \leq q+j \leq 53.5$ at. % and 0.2 at. $\% \leq j \leq 10$ at. %. More preferably, q+j is in the range of 48.5 to 52.7 atomic percent.

In yet another alternative, the second antiferromagnetic layer 19 is composed of an $X_m Mn_{100-m}$ alloy, where X is at least one element selected from the group consisting of Pt, Pd, Ir, Rh, Ru, and Os, the subscript m preferably satisfies the relationship 49 at. $\% \leq m \leq 55.5$ at. %. More preferably, m is in the range of 49.5 to 54.5 atomic percent.

In a further alternative, the second antiferromagnetic layer 19 is composed of a $Pt_m Mn_{100-m-n} Z_n$ alloy, where Z is at least one element selected from the group consisting of Pd, Ir, Rh, Ru, and Os, the subscripts m and n preferably satisfy the relationships 49 at. $\% \leq m+n \leq 55.5$ at. % and 0.2 at. $\% \leq n \leq 40$ at. %. More preferably, m+n is in the range of 49.5 to 54.5 atomic percent.

In a still further alternative, the second antiferromagnetic layer 19 is composed of a $Pt_{q100-q-j} L_j$ alloy, where L is at least one element selected from the group consisting of Au, Ag, Cr, Ni, Ne, Ar, Xe, and Kr, the subscripts q and j preferably satisfy the relationships 49 at. $\% \leq q+j \leq 55.5$ at. % and 0.2 at. $\% \leq j \leq 10$ at. %. More preferably, q+j is in the range of 49.5 to 54.5 atomic percent.

In the present invention, the first antiferromagnetic layer 12 and the second antiferromagnetic layer 19 may be composed of the same alloy having the same compositional ratio. For example, the first antiferromagnetic layer 12 and the second antiferromagnetic layer 19 are composed of an $X_m Mn_{100-m}$ alloy, where X is at least one element selected from the group consisting of Pt, Pd, Ir, Rh, Ru, and Os, the subscript m preferably satisfies the relationship 49 at. $\% \leq m \leq 53.5$ at. %. More preferably, m is in the range of 49.5 to 52.7 atomic percent. The upper limit is most preferably 51.2 atomic percent.

Alternatively, the first antiferromagnetic layer 12 and the second antiferromagnetic layer 19 are composed of a $Pt_m Mn_{100-m-n} Z_n$ alloy, where Z is at least one element selected from the group consisting of Pd, Ir, Rh, Ru, and Os, the subscripts m and n preferably satisfy the relationships 49 at. $\% \leq m+n \leq 53.5$ at. % and 0.2 at. $\% \leq n \leq 40$ at. %. More preferably, m+n is in the range of 49.5 to 52.7 atomic percent. The upper limit is most preferably 51.2 atomic percent.

In another alternative, the first antiferromagnetic layer 12 and the second antiferromagnetic layer 19 are composed of a $Pt_q Mn_{100-q-j} L_j$ alloy, where L is at least one element selected from the group consisting of Au, Ag, Cr, Ni, Ne, Ar, Xe, and Kr, the subscripts q and j preferably satisfy the relationships 49 at. $\% \leq q+j \leq 53.5$ at. % and 0.2 at. $\% \leq j \leq 10$ at. %. More preferably, q+j is in the range of 49.5 to 52.7 atomic percent. The upper limit is most preferably 51.2 atomic percent.

If the first antiferromagnetic layer 12 and the second antiferromagnetic layer 19 are composed of alloys of different compositional ratios, for example, by setting the Mn content in the first antiferromagnetic layer 12 larger than the Mn content in the second antiferromagnetic layer 19, the difference in the exchange coupling magnetic field between the first and second antiferromagnetic layers 12 and 19 becomes more noticeable after the first annealing step. It is then possible to set the magnetization directions of the free magnetic layer 15 and the pinned magnetic layer 13 substantially orthogonal to each other more reliably after the second annealing step. In such a case, a combination of alloys can be chosen among many alternatives in order to make the difference in the exchange coupling magnetic field more noticeable, thus improving the design versatility.

If the compositional ranges described above are satisfied, when the first annealing step is performed, the exchange coupling magnetic field between the first antiferromagnetic layer 12 and the first pinned magnetic sublayer 13a can be increased. Also, the exchange coupling magnetic field between the first antiferromagnetic layer 12 and the first pinned magnetic sublayer 13a can be set larger than the exchange coupling magnetic field of the second antiferromagnetic layer 19 and the ferromagnetic layer 17. Furthermore, when the second annealing step is performed, the exchange coupling magnetic field between the second antiferromagnetic layer 19 and the ferromagnetic layer 17 can be set larger than the exchange coupling magnetic field generated in the first annealing step. Consequently, the magnetization directions of the pinned magnetic layer 13 and the free magnetic layer 15 can be appropriately set substantially orthogonal to each other.

Next, a resist layer is deposited on the second antiferromagnetic layer 19 and a mask is formed on the second antiferromagnetic layer 19 extending a distance of the track width Tw. The unmasked section of the second antiferromagnetic layer 19 is then etched perpendicular to the surface of the substrate 11. The recess 21 is formed by ion milling or RIE in a direction perpendicular to the track width direction with side faces 21a that are perpendicular to the track width direction. Also, recess 21 is formed so that the bottom face 21b lies in the nonmagnetic interlayer 16.

The magnetization direction of the ferromagnetic layer 17 is pinned by the exchange coupling with the second antiferromagnetic layer 19 only at-ends D in the track width direction. Therefore, the magnetization direction of the free magnetic layer 15,-which is disposed under the ferromagnetic layer 17 with the nonmagnetic interlayer 16 therebetween, is also pinned by the RKKY interaction with the ferromagnetic layer 17 only at both ends D.

In the absence of an applied external magnetic field, the magnetization direction of the free magnetic layer 15 in the region E, corresponding to the bottom face 21b of the recess 21, is aligned in the X direction, following the pinned magnetization direction at ends D. When an external magnetic field is applied, the magnetization direction of the free magnetic layer 15 is changed. Therefore, the track width of the magnetic sensing element is determined by the width Tw of the recess 21.

After the recess 21 is made, a lift-off resist layer is formed on the second antiferromagnetic layer 19 so as to cover a region having a width that is larger than the width (track width Tw) of the recess 21. Then, the electrode layers 22 are deposited by sputtering or vapor deposition on the regions of the antiferromagnetic layer 19 not covered by the lift-off resist layer. The electrode layers 22 are made of, for example, Au, W, Cr, or Ta. After the electrode layers 22 are formed, the resist layer is removed, and the magnetic sensing element is thereby obtained.

In the magnetic sensing element in this embodiment, steps are present between the electrode layers 22 and the recess 21 in the track width direction. The electrode layers 22 may be deposited on the second antiferromagnetic layer 19 with protective layers composed of Ta, Cr, or the like therebetween.

Figure 6:
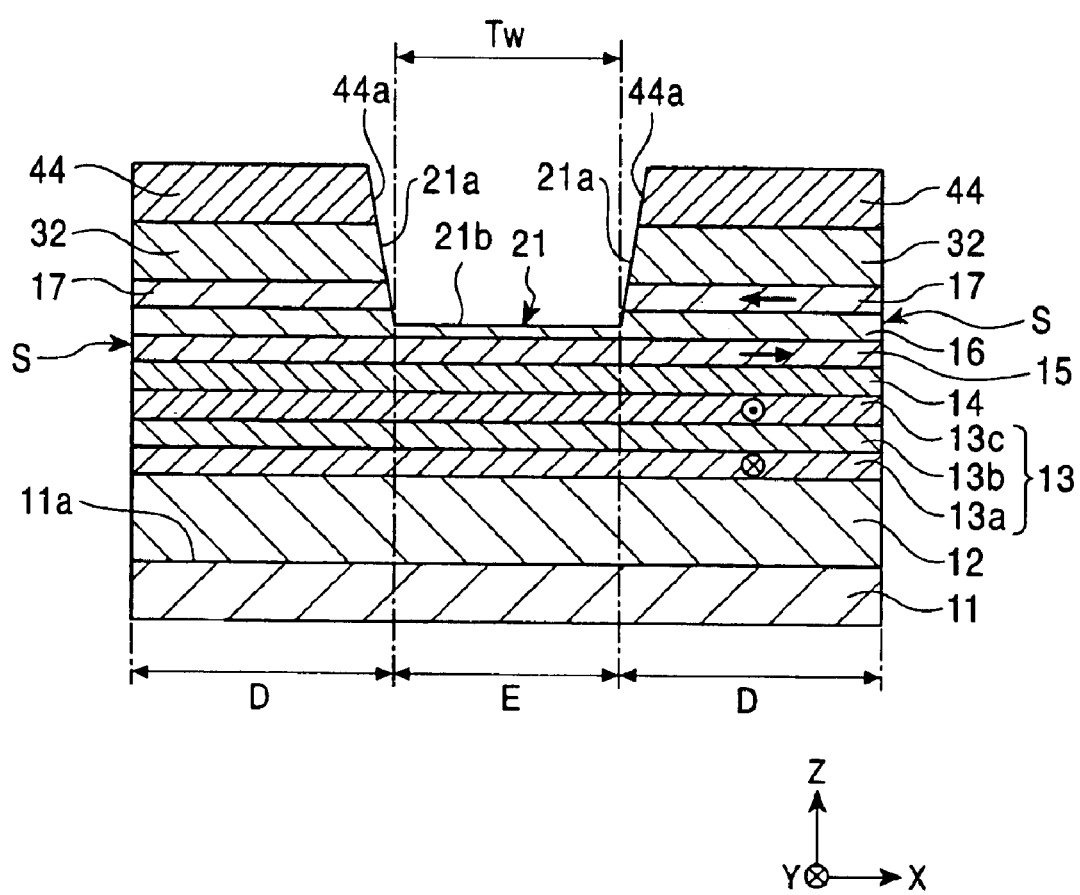
FIG. 6 is a cross-sectional view of a magnetic sensing element according to a sixth embodiment of the present invention.

In the method described above, the resist layer is deposited on the second antiferromagnetic layer 19, and, after the recess 21 is made in the second antiferromagnetic layer 19, the electrode layers 22 are deposited on the second antiferromagnetic layer 19. Alternatively, in a sixth embodiment, as shown in FIG. 6, after electrode layers 44 are deposited on a second antiferromagnetic layer 32, a recess 21 is made in the second antiferromagnetic layer 32 using the electrode layers 44 as masks. In a magnetic sensing element thus obtained, as shown in FIG. 6, inclined surfaces 44a of the electrode layers 44 and side faces 21a of the recess 21 form continuous surfaces.

The annealing step in the second magnetic field may be performed after the recess 21 is made in the second antiferromagnetic layer 19.

Although the first antiferromagnetic layer 12 is deposited directly on the substrate 11 in this embodiment, the first antiferromagnetic layer 12 may be deposited on the substrate 11 with an underlayer composed of an alumina film or Ta, or the like therebetween.

A second method for making the magnetic sensing element shown in FIG. 1 will be described below.

First, the first antiferromagnetic layer 12 is deposited on the substrate 11. The pinned magnetic layer 13 of synthetic ferripinned type comprising the first pinned magnetic sublayer 13a, the nonmagnetic intermediate sublayer 13b, and the second pinned magnetic sublayer 13c, is deposited on the first anti-ferromagnetic layer 12. Then, the nonmagnetic conductive layer 14, the free magnetic layer 15, the nonmagnetic interlayer 16, and the ferromagnetic layer 17 are deposited on the pinned magnetic layer 13 to form a laminate A2. The laminate A2 is continuously formed in the same vacuum deposition system by a thin-film forming process, such as sputtering or vapor deposition. Although not shown in the drawing, a protective layer composed of Ta or the like may be deposited on the ferromagnetic layer 17.

The materials for the first antiferromagnetic layer 12, the first pinned magnetic sublayer 13a, the nonmagnetic intermediate sublayer 13b, the second pinned magnetic sublayer 13c, the nonmagnetic conductive layer 14, the free magnetic layer 15, the nonmagnetic interlayer 16, and the ferromagnetic layer 17 and the thicknesses thereof are the same as those in the first method.

Next, a first annealing step is performed on the laminate A2 at a first annealing temperature in a first magnetic field directed in the Y direction, and thereby an exchange anisotropic magnetic field is generated between the first antiferromagnetic layer 12 and the first pinned magnetic sublayer 13a and the magnetization direction of the pinned magnetic layer 13 is pinned in the Y direction. In this embodiment, the first annealing temperature is set at about 270° C., and the first magnetic field has a magnitude of about 800 kA/m.

When the laminate A2 is annealed in the first magnetic field, an oxide layer having a thickness of about 10 to about 20 Å is formed on the surface of the protective layer. Therefore, the protective layer is removed by ion milling or RIE. Furthermore, the ferromagnetic layer 17 is milled so as to have a predetermined thickness. The ferromagnetic layer 17 is milled because the second antiferromagnetic layer 19 must be continuously formed in a vacuum on the ferromagnetic layer 17 in the subsequent step.

Next, another ferromagnetic layer 17 is deposited again on the ferromagnetic layer 17, which has been milled, and the second antiferromagnetic layer 19 is continuously deposited on the ferromagnetic layer 17. When the ferromagnetic layer 17 is deposited again, preferably, the same ferromagnetic material as that for the initially formed ferromagnetic layer 17 is used because satisfactory magnetic coupling is obtained. The second antiferromagnetic layer 19 has a thickness of about 80 to about 300 Å, for example, about 200 Å, near the center in the track width direction. The second antiferromagnetic layer 19 is composed of the same material as that used in the first production method described above.

In the PtMn alloy or the X—Mn alloy forming the first antiferromagnetic layer 12 and the second antiferromagnetic layer 19, the Pt content or the X content is preferably in the range of about 37 to about 63 atomic percent and, more preferably, in the range of about 47 to about 57 atomic percent.

In the Pt—Mn—X' alloy, the X'+Pt content is preferably in the range of 37 to 63 atomic percent, and more preferably, in the range of about 47 to about 57 atomic percent. Furthermore, in the Pt—Mn—X' alloy, the X' content is in the range of about 0.2 to about 10 atomic percent. However, when X' is at least one element selected from Pd, Ir, Rh, Ru, Os, Ni, and Fe, the X' content is preferably in the range of about 0.2 to about 40 atomic percent.

By annealing the first antiferromagnetic layer 12 and the second antiferromagnetic layer 19 composed of such alloys and having the appropriate compositions described above, a first antiferromagnetic layer 12 and a second antiferromagnetic layer 19 exhibiting a large exchange coupling magnetic field can be obtained. In particular, a first antiferromagnetic layer 12 and a second antiferromagnetic layer 19, respectively, composed of a PtMn alloy exhibit an exchange coupling magnetic field of about 48 kA/m or more, for example, exceeding about 64 kA/m, and have an extremely high blocking temperature of about 380° C. at which these antiferromagnetic layers lose the exchange coupling magnetic field.

Although these alloys have a disordered face-centered cubic (fcc) structure immediately after deposition, the structure is transformed into an ordered face-centered tetragonal (fct) structure of CuAuI type by annealing treatment.

In the magnetic sensing element of this embodiment, the first antiferromagnetic layer 12 and the second antiferromagnetic layer 19 may be formed using the same antiferromagnetic material.

A protective layer composed of a nonmagnetic material, such as Ta, may be formed on the second antiferromagnetic layer 19.

A second annealing step is performed on a laminate B including the layers up to the second antiferromagnetic layer 19 at a second annealing temperature in a second magnetic field directed in the X direction. Thereby, an exchange anisotropic magnetic field is generated between the second antiferromagnetic layer 19 and the ferromagnetic layer 17, and the magnetization direction of the ferromagnetic layer 17 is pinned in the opposite direction of the X direction. In this embodiment, the second annealing temperature is about 250° C., and the magnitude of the second magnetic field is about 24 kA/m.

The exchange anisotropic magnetic field is generated between the second antiferromagnetic layer 19 and the ferromagnetic layer 17 for the first time in the second annealing step. Therefore, in order to direct the exchange anisotropic magnetic field between the second antiferromagnetic layer 19 and the ferromagnetic layer 17 in the opposite direction of the X direction, while maintaining the direction of the exchange anisotropic magnetic field between the first antiferromagnetic layer 12 and the first pinned magnetic sublayer 13a in the Y direction, the second annealing temperature must be lower than the blocking temperature at which the exchange coupling magnetic field by the first antiferromagnetic layer 12 is lost. Also, the second magnetic field must be smaller than the exchange anisotropic magnetic field between the first antiferromagnetic layer 12 and the pinned magnetic sublayer 13a. When the second annealing step is performed under the conditions described above, even if the first antiferromagnetic layer 12 and the second antiferromagnetic layer 19 are composed of the same antiferromagnetic material, it is possible to direct the exchange anisotropic magnetic field between the second antiferromagnetic layer 19 and the ferromagnetic layer 17 in the opposite direction of the X direction, while maintaining the exchange anisotropic magnetic field between the first antiferromagnetic layer 12 and the pinned magnetic sublayer 13a in the Y direction. That is, the magnetization direction of the free magnetic layer 15 can be easily pinned in a direction substantially orthogonal to the magnetization direction of the pinned magnetic layer 13.

Next, a resist layer is deposited on the second antiferromagnetic layer 19 and a mask is formed on the second antiferromagnetic layer 19 extending a distance of the track width Tw. The unmasked section of the second antiferromagnetic layer 19 is then etched perpendicular to the surface of the substrate 11. The recess 21 is formed by ion milling or RIE in a direction perpendicular to the track width direction with side faces 21a that are perpendicular to the track width direction. Also, recess 21 is made so that the bottom face 21b lies in the nonmagnetic interlayer 16.

The magnetization direction of the ferromagnetic layer 17 is pinned by the exchange coupling with the second antiferromagnetic layer 19 only at ends D in the track width direction. Therefore, the magnetization direction of the free magnetic layer 15, which is disposed under the ferromagnetic layer 17 with the nonmagnetic interlayer 16 therebetween, is also pinned by the RKKY interaction with the ferromagnetic layer 17 at ends D.

In the absence of an applied external magnetic field, the magnetization direction of the free magnetic layer 15 in the region E corresponding to the bottom face 21b of the recess 21 is aligned in the X direction, following the pinned magnetization direction at ends D. When an external magnetic field is applied, the magnetization direction of the free magnetic layer 15 is changed.

The track width of the magnetic sensing element is determined by the width Tw of the recess 21. As described above, since the recess 21 can be made by simply etching the second antiferromagnetic layer 19 having a uniform thickness perpendicular to the surface of the substrate 11, the recess 21 can be made with a precise track width Tw. That is, the track width Tw of the magnetic sensing element can be accurately defined.

After the recess 21 is made, a lift-off resist layer is formed on the second antiferromagnetic layer 19 so as to cover a region having a width that is larger than the width (track width Tw) of the recess 21. The electrode layers 22 are then deposited by sputtering or vapor deposition on the regions of the antiferromagnetic layer 19 not covered by the lift-off resist layer. The electrode layers 22 are made of, for example, Au, W, Cr, or Ta. After the electrode layers 22 are formed, the resist layer is removed, and the magnetic sensing element is thereby obtained.

In the magnetic sensing element produced by the second method, steps are present between the recess 21 and the electrode layers 22 in the track width direction. The electrode layers 22 may be deposited on the second antiferromagnetic layer 19 with protective layers composed of Ta, Cr, or the like therebetween.

In the method described above, the resist layer is deposited on the second antiferromagnetic layer 19, and after the recess 21 is made in the second antiferromagnetic layer 19, the electrode layers 22 are deposited on the second antiferromagnetic layer 19. Alternatively, in a sixth embodiment, as shown in FIG. 6, after electrode layers 44 are deposited on a second antiferromagnetic layer 32, a recess 21 is made in the second antiferromagnetic layer 32 using the electrode layers 44 as masks. In a magnetic sensing element thus obtained, as shown in FIG. 6, inclined surfaces 44a of the electrode layers 44 and side faces 21a of the recess 21 form continuous surfaces.

The annealing step in the second magnetic field may be performed after the recess 21 is made in the second antiferromagnetic layer 19.

Although the first antiferromagnetic layer 12 is deposited directly on the substrate 11 in this embodiment, the first antiferromagnetic layer 12 may be deposited on the substrate 11 with an underlayer composed of an alumina film or Ta, or the like, therebetween.

Figure 2:
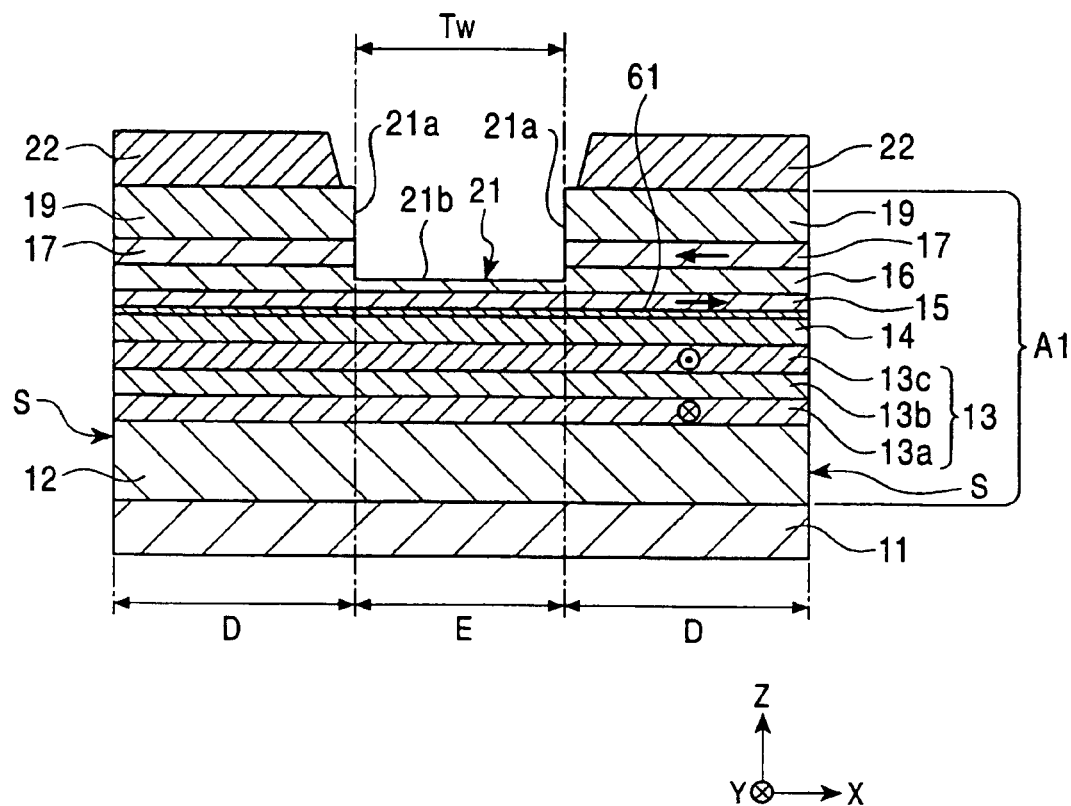
FIG. 2 is a cross-sectional view of a magnetic sensing element according to a second embodiment of the present invention.

FIG. 2 is a cross-sectional view of a magnetic sensing element in accordance with a second embodiment of the present invention, viewed from the surface facing a recording medium. Similar to the first embodiment, the magnetic sensing element shown in FIG. 2 also includes a first antiferromagnetic layer 12, a first pinned magnetic sublayer 13a, a nonmagnetic intermediate sublayer 13b, a second pinned magnetic sublayer 13c, a nonmagnetic conductive layer 14, a free magnetic layer 15, a nonmagnetic interlayer 16, and a ferromagnetic layer 17 sequentially deposited on a substrate 11.

The first antiferromagnetic layer 12, the pinned magnetic layer 13, the nonmagnetic conductive layer 14, the free magnetic layer 15, the nonmagnetic interlayer 16, and the ferromagnetic layer 17 are formed of the same materials as those used for the magnetic sensing element shown in FIG. 1.

The thin-film magnetic element in this embodiment differs from the thin-film magnetic element shown in FIG. 1 in that an interlayer 61 is provided between the free magnetic layer 15 and the nonmagnetic conductive layer 14. The interlayer 61 is preferably composed of either a CoFe alloy or Co but, more preferably, of a CoFe alloy.

By providing the interlayer 61, diffusion of metallic elements, at the interface with the nonmagnetic conductive layer 14 can be avoided, and also a change in resistance ($\Delta R$) and a rate of the change in resistance ($\Delta R/R$) can be improved. The interlayer 61 has a thickness of approximately 5 Å.

When the free magnetic layer 15 in contact with the nonmagnetic conductive layer 14 is composed of the CoFeNi alloy having the compositional ratio described above, diffusion of metallic elements at the interface with the nonmagnetic conductive layer 14 can be appropriately suppressed. Therefore, the need for forming the interlayer 61 between the free magnetic layer 15 and the nonmagnetic conductive layer 14 is less in comparison with the case in which the free magnetic layer 15 is composed of a magnetic material, such as an NiFe alloy, that does not include Co.

However, even when the free magnetic layer 15 is composed of the CoFeNi alloy, the interlayer 61 is preferably provided between the free magnetic layer 15 and the nonmagnetic conductive layer 14, because diffusion of metallic elements between the free magnetic layer 15 and the nonmagnetic conductive layer 14 can be more securely avoided.

When the interlayer 61 is provided between the free magnetic layer 15 and the nonmagnetic conductive layer 14, and at least one of the free magnetic layer 15 and the ferromagnetic layer 17 is composed of the CoFeNi alloy, preferably, the Fe content in the CoFeNi alloy, is in the range of about 7 to about 15 atomic percent, the Ni content is in the range of about 5 to about 15 atomic percent, and the balance is Co.

Consequently, an exchange coupling magnetic field due to the RKKY interaction between the free magnetic layer 15 and the ferromagnetic layer 17 can be increased. Specifically, the magnetic field at which the antiparallel state is lost, (i.e., the spin-flop magnetic field ($H_{sf}$)) can be increased to approximately 293 kA/m. Therefore, the magnetization directions of the free magnetic layer 15 and the ferromagnetic layer 17 at both ends can be appropriately pinned in an antiparallel state, thus suppressing side reading.

In the present invention, preferably, both the free magnetic layer 15 and the ferromagnetic layer 17 are composed of the CoFeNi alloy. Thereby, a stable, high spin-flop magnetic field can be obtained.

If the CoFeNi alloy, having the compositional ratio described above, is used, it is possible to set the magnetostriction of the free magnetic layer 15 and the ferromagnetic layer 17 in the range of about $-3 \times 10^{-6}$ to about $3 \times 10^{-6}$, and the coercive force can be decreased to about 790 A/m or less. Furthermore, the soft magnetic properties of the free magnetic layer 15 can be improved.

Figure 3:
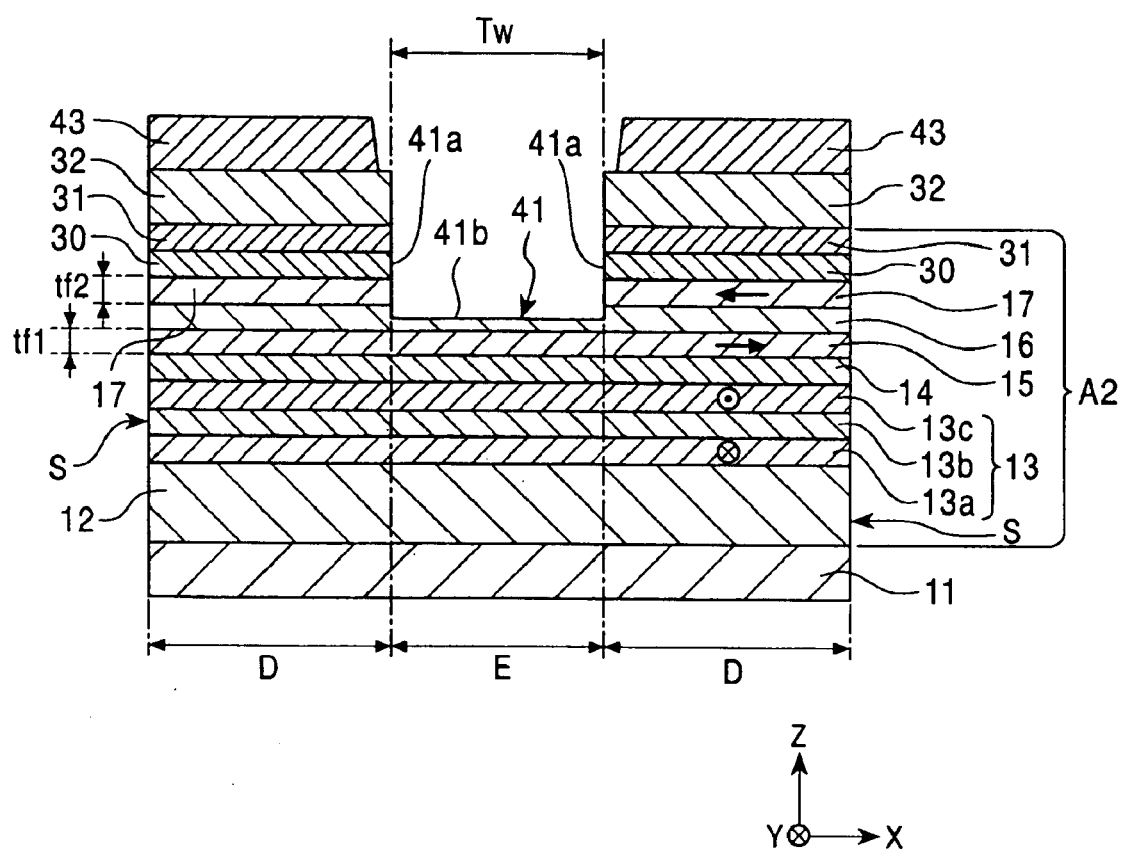
FIG. 3 is a cross-sectional view of a magnetic sensing element according to a third embodiment of the present invention.

FIG. 3 is a cross-sectional view of a magnetic sensing element in accordance with a third embodiment of the present invention, viewed from the surface facing a recording medium.

Similar to the first embodiment, the magnetic sensing element shown in FIG. 3 also includes a first antiferromagnetic layer 12, a first pinned magnetic sublayer 13a, a nonmagnetic intermediate sublayer 13b, a second pinned magnetic sublayer 13c, a nonmagnetic conductive layer 14, a free magnetic layer 15, a nonmagnetic interlayer 16, and a ferromagnetic layer 17 sequentially deposited on a substrate 11.

The first antiferromagnetic layer 12, the pinned magnetic layer 13, the nonmagnetic conductive layer 14, the free magnetic layer 15, the nonmagnetic interlayer 16, and the ferromagnetic layer 17 are formed of the same materials as those used for the magnetic sensing element shown in FIG. 1.

In the magnetic sensing element shown in FIG. 3, a nonmagnetic layer 30 and a third antiferromagnetic layer 31 are formed between the ferromagnetic layer 17 and a second antiferromagnetic layer 32. The third antiferromagnetic layer 31 is composed of any one of a PtMn alloy, an X—Mn alloy, where X is at least one element selected from the group consisting of Pd, Ir, Rh, Ru, Os, Ni, and Fe, and a Pt—Mn—X' alloy, where X' is at least one element selected from the group consisting of Pd, Ir, Rh, Ru, Au, Ag, Os, Cr, Ni, Ar, Ne, Xe, and Kr. The third antiferromagnetic layer 31 prevents the nonmagnetic layer 30 from being oxidized when annealing treatment is performed in a magnetic field to generate an exchange anisotropic magnetic field in the first antiferromagnetic layer 12. A method for making the magnetic sensing element shown in FIG. 3 will be described below.

The nonmagnetic layer 30 is composed of Ru and has a thickness of about 8 to about 11 Å. The nonmagnetic layer 30 may be composed of at least one element of Ru, Cu, Ag, and Au.

An electrode underlayer (protective layer) composed of Ta, Cr, or the like, may be disposed between the second antiferromagnetic layer 32 and an electrode layer 43.

Additionally, an antidiffusion layer composed of Co or the like may be formed between the free magnetic layer 15 and the nonmagnetic conductive layer 14. The antidiffusion layer prevents interdiffusion between the free magnetic layer 15 and the nonmagnetic conductive layer 14. An antidiffusion layer, composed of Co or the like, may also be formed between the second pinned magnetic sublayer 13c and the nonmagnetic conductive layer 14. This antidiffusion layer prevents interdiffusion between the second pinned magnetic sublayer 13c and the nonmagnetic conductive layer 14.

In the magnetic sensing element shown in FIG. 3, the magnetization direction of the ferromagnetic layer 17 is pinned in the track width direction (in the direction opposite to the X direction) by the RKKY interaction with the second antiferromagnetic layer 32 and the third antiferromagnetic layer 31. Furthermore, the magnetization direction of the free magnetic layer 15 formed under the ferromagnetic layer 17 with the nonmagnetic interlayer 16 therebetween is aligned in the track width direction (in the X direction) by the RKKY interaction with the ferromagnetic interlayer 17. That is, in the regions below the second antiferromagnetic layer 32 (at ends D in the track width direction), the ferromagnetic layer 17, the nonmagnetic interlayer 16, and the free magnetic layer 15 constitute a synthetic ferrimagnetic structure, and thus the magnetization direction of the free magnetic layer 15 is easily aligned in the track width direction.

Consequently, even if the RKKY interaction between the ferromagnetic layer 17 and the second antiferromagnetic layer 32 as well as the third antiferromagnetic layer 31 is relatively weak, the magnetization direction of the free magnetic layer 15 can be easily aligned in a direction substantially orthogonal to the magnetization direction of the pinned magnetic layer 13. Preferably, the magnetization direction of the free magnetic layer 15 is perpendicular to the magnetization direction of the pinned magnetic layer 13.

In this embodiment, a recess 41 is made so as to pass through the second antiferromagnetic layer 32, the third antiferromagnetic layer 31, the nonmagnetic layer 30, and the ferromagnetic layer 17, and a bottom face 41b lies in the nonmagnetic interlayer 16. The width in the track width direction of the bottom face 41b is equal to the track width Tw. Side faces 41a of the recess 41 are perpendicular to the track width direction.

Also, in this embodiment, the sections of the second antiferromagnetic layer 32 facing the track width region also do not taper. The magnetization direction of the free magnetic layer 15 is pinned by exchange coupling with the second antiferromagnetic layer 32 and the third antiferromagnetic layer 31. The third antiferromagnetic layer has a thickness sufficient for exhibiting antiferromagnetism at ends D in the track width direction other than a region E, corresponding to the bottom face 41b of the recess 41.

In the absence of an applied external magnetic field, the region E of the free magnetic layer 15 is aligned in the X direction, following ends D in which the magnetization direction is pinned by exchange coupling with the second antiferromagnetic layer 32 and the third antiferromagnetic layer 31. In the presence of an applied external magnetic field, the magnetization direction of the region E of the free magnetic layer 15 is changed.

Accordingly, the track width Tw of the magnetic sensing element is defined by the width of the bottom face 41b of the recess 41, and moreover, it is possible to avoid side reading in which recorded signals are read in regions outside the track width Tw.

As described above, the recess 41 can be made by simply etching the second antiferromagnetic layer 32 perpendicular to the surface of the substrate 11 using RIE or ion milling. Therefore, the recess 41 can be made with a precise track width Tw. That is, the track width of the magnetic sensing element can be accurately defined.

Since insensitive regions do not occur in the region of the track width (optical track width) Tw, which has been physically set during the formation of the magnetic sensing element, it is possible to suppress a reduction in read output when the optical track width Tw is decreased as the recording density is increased. Furthermore, in this embodiment, since side faces S of the magnetic sensing element can be formed so as to be perpendicular to the track width direction, variations in the length of the free magnetic layer 15 in the track width direction can be suppressed.

In the magnetic sensing element shown in FIG. 3, the nonmagnetic interlayer 16 functions as a protective layer for the free magnetic layer 15 in the region corresponding to the track width Tw. By forming a nonmagnetic interlayer 16 using a conductive material, the nonmagnetic interlayer 16 can function as a back layer exhibiting a spin filter effect.

Figure 4:
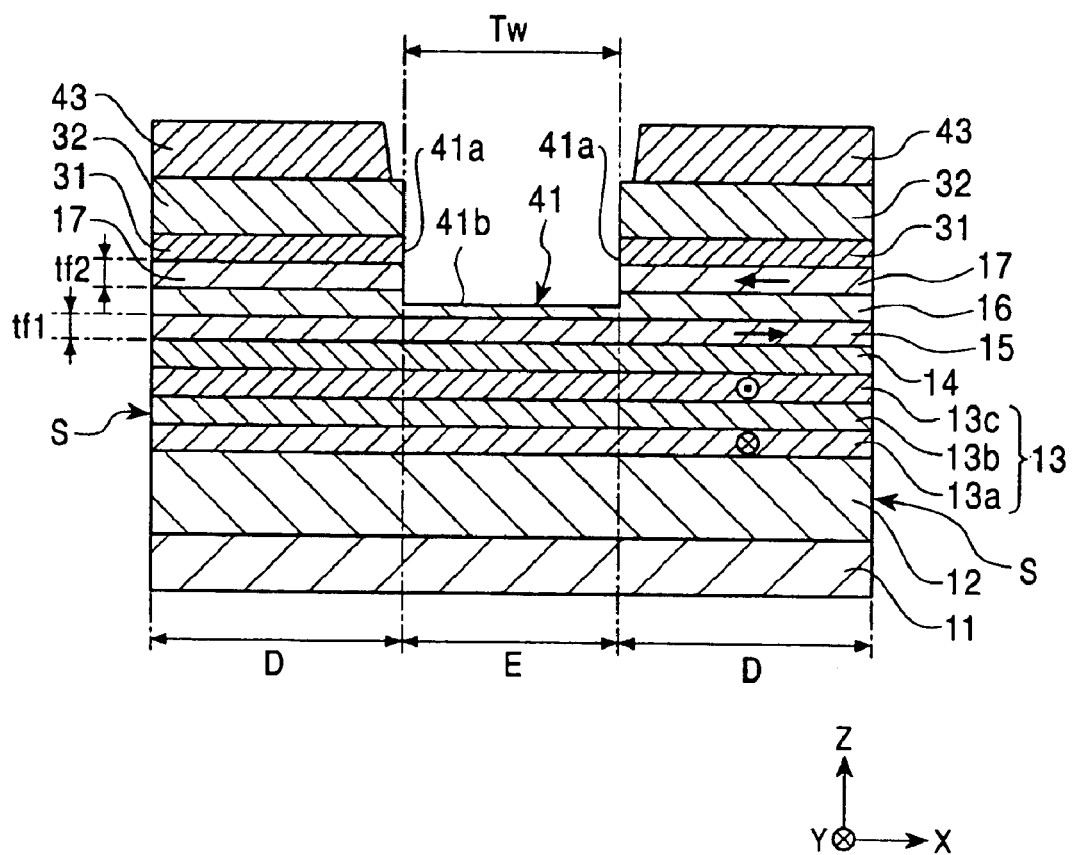
FIG. 4 is a cross-sectional view of a magnetic sensing element according to a fourth embodiment of the present invention.

As shown in FIG. 4 (fourth embodiment), the third antiferromagnetic layer 31 may be deposited directly on the ferromagnetic layer 17. In the magnetic sensing element shown in FIG. 4, the magnetization direction of the ferromagnetic layer 17 is aligned in the direction opposite to the X direction by exchange coupling with the third antiferromagnetic layer 31 and the second antiferromagnetic layer 32. Furthermore, the magnetization direction of the free magnetic layer 15 formed under the ferromagnetic layer 17 is aligned in the track width direction (in the X direction) by the RKKY interaction with the ferromagnetic interlayer 17. That is, in the regions below the second antiferromagnetic layer 32 (at ends D in-the track width direction), the ferromagnetic layer 17, the nonmagnetic interlayer 16, and the free magnetic layer 15 constitute a synthetic ferrimagnetic structure, and thus the magnetization direction of the free magnetic layer 15 is easily aligned in the track width direction.

Consequently, even if exchange coupling between the ferromagnetic layer 17 and the second antiferromagnetic layer 32 as well as the third antiferromagnetic layer 31 is relatively weak, the magnetization direction of the free magnetic layer 15 can be easily aligned in a direction substantially orthogonal to the magnetization direction of the pinned magnetic layer 13. Preferably, the magnetization direction of the free magnetic layer 15 is perpendicular to the magnetization direction of the pinned magnetic layer 13.

Only at ends D in the track width direction, other than the region corresponding to the bottom face 41b of the recess 41, is the magnetization direction of the free magnetic layer 15 is reliably pinned by exchange coupling with the second antiferromagnetic layer 32 and the third antiferromagnetic layer 31.

In the absence of an applied external magnetic field, the region E of the free magnetic layer 15 corresponding to the bottom face 41b of the recess 41 is aligned in the X direction, following ends D in which the magnetization direction is pinned by exchange coupling with the second antiferromagnetic layer 32 and the third antiferromagnetic layer 31. The magnetization direction of the region E of the free magnetic layer 15 is changed in the presence of an applied external magnetic field.

In the magnetic sensing element shown FIG. 4, the nonmagnetic interlayer 16 also functions as a protective layer for the free magnetic layer 15 in the track width Tw region. By forming a nonmagnetic interlayer 16 using a conductive material, the nonmagnetic interlayer 16 can function as a back layer exhibiting a spin filter effect.

Even when the first antiferromagnetic layer 12 and the second antiferromagnetic layer 32 are composed of the same antiferromagnetic material, it is possible to direct the exchange anisotropic magnetic field between the ferromagnetic layer 17 and the second antiferromagnetic layer 32 and the third antiferromagnetic layer 31 in the direction opposite to the X direction, while maintaining the direction of the exchange anisotropic magnetic field between the first antiferromagnetic layer 12 and the first pinned magnetic sublayer 13a in the Y direction.

Figure 5:
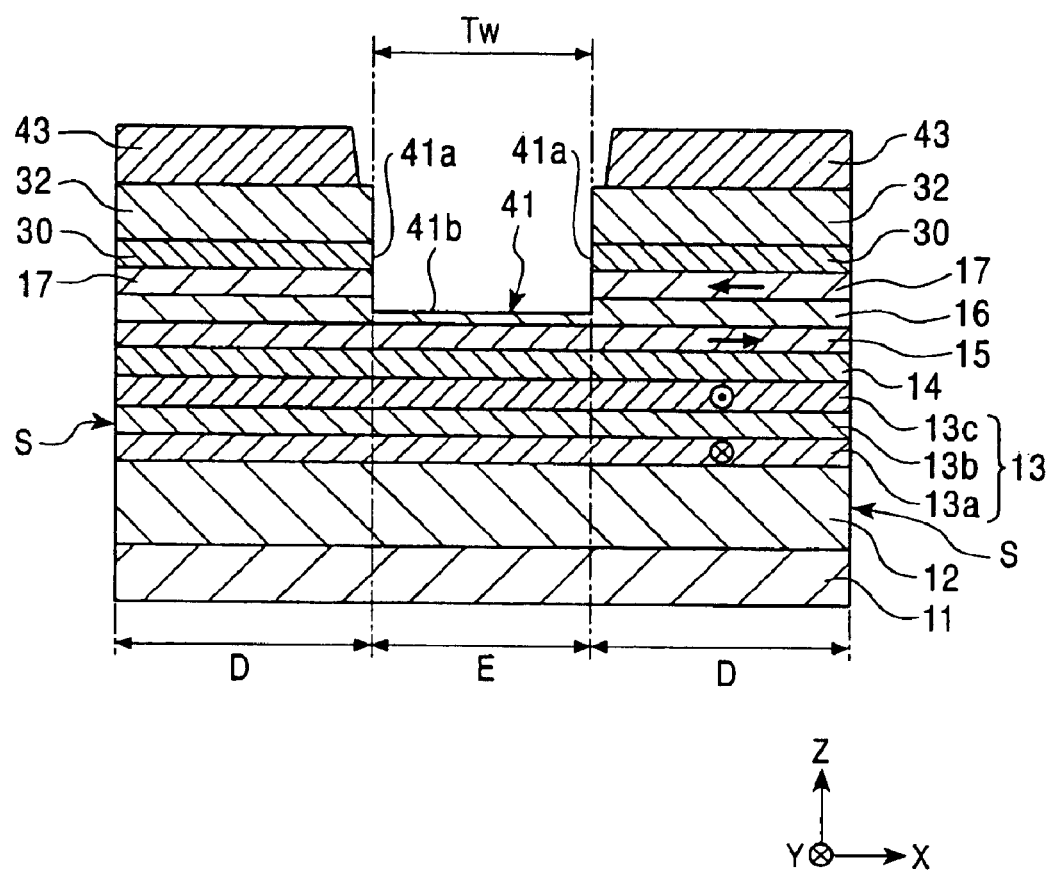
FIG. 5 is a cross-sectional view of a magnetic sensing element according to a fifth embodiment of the present invention.

Alternatively, as shown in FIG. 5 (fifth embodiment), the second antiferromagnetic layer 32 may be directly deposited on the nonmagnetic layer 30. In the magnetic sensing element shown in FIG. 5, the magnetization direction of the ferromagnetic layer 17 is aligned in the direction opposite to the X direction by the RKKY interaction with the second antiferromagnetic layer 32.

Furthermore, the magnetization direction of the free magnetic layer 15 formed under the ferromagnetic layer 17 with the nonmagnetic interlayer 16 therebetween is aligned in the track width direction (in the X direction) by the RKKY interaction with the ferromagnetic interlayer 17. That is, in the regions below the second antiferromagnetic layer 32 (at ends D in the track width direction), the ferromagnetic layer 17, the nonmagnetic interlayer 16, and the free magnetic layer 15 constitute a synthetic ferrimagnetic structure, and thus the magnetization direction of the free magnetic layer 15 is easily aligned in the track width direction.

Consequently, even if the RKKY interaction between the second antiferromagnetic layer 32 and the ferromagnetic layer 17 is relatively weak, the magnetization direction of the free magnetic layer 15 can be easily aligned in a direction substantially orthogonal to the magnetization direction of the pinned magnetic layer 13. Preferably, the magnetization direction of the free magnetic layer 15 is perpendicular to the magnetization direction of the pinned magnetic layer 13.

Only at ends D in the track width direction, other than the region corresponding to the bottom face 41b of the recess 41, is the magnetization direction of the free magnetic layer 15 reliably pinned by magnetic coupling with the second antiferromagnetic layer 32.

In the absence of an applied external magnetic field, the region E of the free magnetic layer 15, corresponding to the bottom face 41b of the recess 41, is aligned in the X direction, following ends D in which the magnetization direction is pinned by the RKKY interaction with the second antiferromagnetic layer 32. In the presence of an applied external magnetic field, the magnetization direction of the free magnetic layer 15 is changed.

In the magnetic sensing element shown FIG. 5, the nonmagnetic interlayer 16 also functions as a protective layer for the free magnetic layer 15 in the track width Tw region. By forming a nonmagnetic interlayer 16 using a conductive material, the nonmagnetic interlayer 16 can function as a back layer exhibiting a spin filter effect.

Even when the first antiferromagnetic layer 12 and the second antiferromagnetic layer 32 are composed of the same antiferromagnetic material, it is possible to direct the exchange anisotropic magnetic field between the second antiferromagnetic layer 32 and the ferromagnetic layer 17 in the direction opposite to the X direction, while maintaining the direction of the exchange anisotropic magnetic field between the first antiferromagnetic layer 12 and the first pinned magnetic sublayer 13a in the Y direction.

In this spin-valve magnetic sensing element, the magnetization direction of the free magnetic layer 15 is varied from the X direction to the Y direction when a steady-state current is applied through the electrode layers 43 to the free magnetic layer 15, the nonmagnetic conductive layer 14, and the pinned magnetic layer 13 and a leakage magnetic field from a magnetic recording medium travelling in the Z direction is applied in the Y direction. Electrical resistance changes due to the relationship between the varied magnetization direction of the free magnetic layer 15 and the magnetization direction of the second pinned magnetic sublayer 13c. Accordingly, the leakage magnetic field from the magnetic recording medium is detected by a voltage change based on the change in the electrical resistance.

A method for making the magnetic sensing element shown in FIG. 3 will be described below.

First, the first antiferromagnetic layer 12, the pinned magnetic layer 13, the nonmagnetic conductive layer 14, the free magnetic layer 15, the nonmagnetic interlayer 16, the ferromagnetic layer 17, the nonmagnetic layer 30, and the third antiferromagnetic layer 31 are deposited in that order on the substrate 11 to form a laminate A2.

The first antiferromagnetic layer 12, the pinned magnetic layer 13, the nonmagnetic conductive layer 14, the free magnetic layer 15, the nonmagnetic interlayer 16, the ferromagnetic layer 17, the nonmagnetic layer 30, and the third antiferromagnetic layer 31 are continuously formed in the same vacuum deposition system by a thin-film forming process, such as sputtering or vapor deposition.

The materials for the first antiferromagnetic layer 12, the pinned magnetic layer 13, the nonmagnetic conductive layer 14, the free magnetic layer 15, the nonmagnetic interlayer 16, and the ferromagnetic layer 17 are the same as those used in the method for making the magnetic sensing element shown in FIG. 1.

The nonmagnetic layer 30 is composed of Ru and has a thickness of about 8 to about 11 Å. The nonmagnetic layer 30 may be composed of at least one element of Ru, Cu, Ag, and Au.

The third antiferromagnetic layer 31 is composed of any one of a PtMn alloy, an X—Mn alloy, where X is at least one element selected from the group consisting of Pd, Ir, Rh, Ru, Os, Ni, and Fe, and a Pt—Mn—X' alloy, where X' is at least one element selected from the group consisting of Pd, Ir, Rh, Ru, Au, Ag, Os, Cr, Ni, Ar, Ne, Xe, and Kr.

Next, the laminate A2 is annealed at a first annealing temperature in a first magnetic field directed in the Y direction, and thereby an exchange anisotropic magnetic field is generated in the first antiferromagnetic layer 12 and the magnetization direction of the pinned magnetic layer 13 is pinned in the Y direction. In this embodiment, the first annealing temperature is about 270° C. and the magnitude of the first magnetic field is about 800 kA/m.

The third antiferromagnetic layer 31 has a thickness of about 30 Å. If the thickness of the third antiferromagnetic layer 31 is about 30 Å or less, even if the third antiferromagnetic layer 31 is annealed in a magnetic field, transformation from the disordered structure to the ordered structure does not occur and an exchange anisotropic magnetic field due to the RKKY interaction with the ferromagnetic layer 17 through the nonmagnetic layer 30 is not generated. Therefore, when the laminate A2 is annealed in the first magnetic field, an exchange anisotropic magnetic field is not generated in the third antiferromagnetic layer 31, and the ferromagnetic layer 17 is not pinned in the Y direction.

Also, when the laminate A2 is annealed in the first magnetic field, the third antiferromagnetic layer 31 is oxidized to form an oxide layer having a thickness of approximately 10 to 20 Å. The surface of the third antiferromagnetic layer 31 is milled approximately 20 Å by ion milling to remove the oxidized portion.

Next, the second antiferromagnetic layer 32 is deposited on the laminate A2. The second antiferromagnetic layer 32 is composed of any one of a Ptmn alloy, an X—Mn alloy, where X is at least one element selected from the group consisting of Pd, Ir, Rh, Ru, Os, Ni, and Fe, and a Pt—Mn—X' alloy, where X' is at least one element selected from the group consisting of Pd, Ir, Rh, Ru, Au, Ag, Os, Cr, Ni, Ar, Ne, Xe, and Kr, the same as the first antiferromagnetic layer 12.

The second antiferromagnetic layer 32 has a thickness of about 80 to about 300 Å, for example, about 200 Å, near the center in the track width direction.

In the PtMn alloy or the X—Mn alloy forming the first antiferromagnetic layer 12 and the second antiferromagnetic layer 32, the Pt content or the X content is preferably in the range of about 37 to about 63 atomic percent and, more preferably, in the range of about 47 to about 57 atomic percent.

In the Pt—Mn—X' alloy, the X'+Pt content is preferably in the range of about 37 to about 63 atomic percent and, preferably, in the range of about 47 to about 57 atomic percent. Furthermore, in the Pt—Mn—X' alloy, the X' content is in the range of about 0.2 to about 10 atomic percent. However, when X' is at least one element selected from Pd, Ir, Rh, Ru, Os, Ni, and Fe, the X' content is preferably in the range of about 0.2 to about 40 atomic percent.

By annealing the first antiferromagnetic layer 12 and the second antiferromagnetic layer 32 composed of such alloys and having the appropriate compositions described above, a first antiferromagnetic layer 12 and a second antiferromagnetic layer 32 can be obtained exhibiting a large exchange coupling magnetic field. In particular, a first antiferromagnetic layer 12 and a second antiferromagnetic layer 32, respectively, are composed of a PtMn alloy that exhibit an exchange coupling magnetic field of about 48 kA/m or more, for example, exceeding about 64 kA/m, and that have an extremely high blocking temperature of about 380° C. at which these antiferromagnetic layers lose the exchange coupling magnetic field.

Although these alloys have a disordered face-centered cubic (fcc) structure immediately after deposition, the structure is transformed into an ordered face-centered tetragonal (fct) structure of CuAuI type by annealing treatment.

In the magnetic sensing element of this embodiment, the first antiferromagnetic layer 12 and the second antiferromagnetic layer 32 may be formed using the same antiferromagnetic material.

A protective layer composed of a nonmagnetic material, such as Ta, may be formed on the second antiferromagnetic layer 32.

Next, a second annealing step is performed on the laminate including the layers up to the second antiferromagnetic layer 32 at a second annealing temperature in a second magnetic field directed opposite to the X direction. Thereby, an exchange anisotropic magnetic field is generated between the second antiferromagnetic layer 32 and the ferromagnetic layer 17, and the magnetization direction of the ferromagnetic layer 17 is pinned in the opposite direction of the X direction. If the pinned magnetization direction of the ferromagnetic layer 17 is opposite to the X direction, the magnetization direction of the free magnetic layer 15 is pinned in the X direction by the RKKY interaction with the ferromagnetic layer 17 through the nonmagnetic interlayer 16. In this embodiment, the second annealing temperature is about 250° C., and the magnitude of the second magnetic field is about 24 kA/m.

An exchange anisotropic magnetic field is generated in the second antiferromagnetic layer 32 for the first time in the second annealing step. Therefore, in order to direct the exchange anisotropic magnetic field between the second antiferromagnetic layer 32 and the ferromagnetic layer 17 in the opposite direction of the X direction, while maintaining the direction of the exchange anisotropic magnetic field between the first antiferromagnetic layer 12 and the first pinned magnetic sublayer 13*a* in the Y direction, the second annealing temperature must be set at a temperature that is lower than the blocking temperature at which the exchange coupling magnetic field by the first antiferromagnetic layer 12 is lost. Also, the second magnetic field must be smaller than the exchange anisotropic magnetic field between the first antiferromagnetic layer 12 and the pinned magnetic sublayer 13*a*. When the second annealing step is performed under the conditions described above, even if the first antiferromagnetic layer 12 and the second antiferromagnetic layer 32 are composed of the same antiferromagnetic material, it is possible to direct the exchange anisotropic magnetic field between the second antiferromagnetic layer 32 and the ferromagnetic layer 17 opposite to the X direction, while maintaining the exchange anisotropic magnetic field between the first antiferromagnetic layer 12 and the first pinned magnetic sublayer 13*a* in the Y direction. That is, the magnetization direction of the free magnetic layer 15 can be easily pinned in a direction substantially orthogonal to the magnetization direction of the pinned magnetic layer 13.

Next, a resist layer is deposited on the second antiferromagnetic layer 32 and a mask is formed a width corresponding to the track width Tw on the second antiferromagnetic layer 32. The unmasked section of the second antiferromagnetic layer 32 is then etched perpendicular to the surface of the substrate 11. The recess 41 is formed by ion milling or RIE in a direction perpendicular to the track width direction with side faces 41*a* that are perpendicular to the track width direction. Also, the recess 41 is formed so that the bottom face 41*b* lies in the nonmagnetic interlayer 16.

The magnetization direction of the ferromagnetic layer 17 is pinned by the exchange coupling with the second antiferromagnetic layer 32 and the third antiferromagnetic layer 31 only at ends D in the track width direction. Therefore, the magnetization direction of the free magnetic layer 15, which is disposed under the ferromagnetic layer 17 with the nonmagnetic interlayer 16 therebetween, is also pinned by the RKKY interaction with the ferromagnetic layer 17 only at ends D.

In the absence of an applied external magnetic field, the magnetization direction of the free magnetic layer 15 in the region E corresponding to the bottom face 41*b* of the recess 41 is aligned in the X direction, following the pinned magnetization direction at ends D. The magnetization direction of the free magnetic layer 15 is changed.

Therefore, the track width of the magnetic sensing element is determined by the width Tw of the recess 41. As described above, since the recess 41 can be made by simply etching the second antiferromagnetic layer 32 having a uniform thickness perpendicular to the surface of the substrate 11, the recess 41 has a precise track width Tw. That is, the track width of the magnetic sensing element can be accurately defined.

After the recess 41 is made, a lift-off resist layer is formed on the second antiferromagnetic layer 32 so as to cover a region having a width that is larger than the width (track width Tw) of the recess 41. The electrode layers 43 are then deposited by sputtering or vapor deposition on the regions of the antiferromagnetic layer 32 not covered by the lift-off resist layer. The electrode layers 43 are made of, for example, Au, W, Cr, Ta, or the like. After the electrode layers 43 are formed, the resist layer is removed, and the magnetic sensing element is thereby obtained.

In the magnetic sensing element thus produced, steps are present between the recess 41 and the electrode layers 43 in the track width direction. The electrode layers 43 may be deposited on the second antiferromagnetic layer 32 with protective layers composed of Ta, Cr, or the like therebetween. The protective layers function as electrode underlayers.

Figure 7:
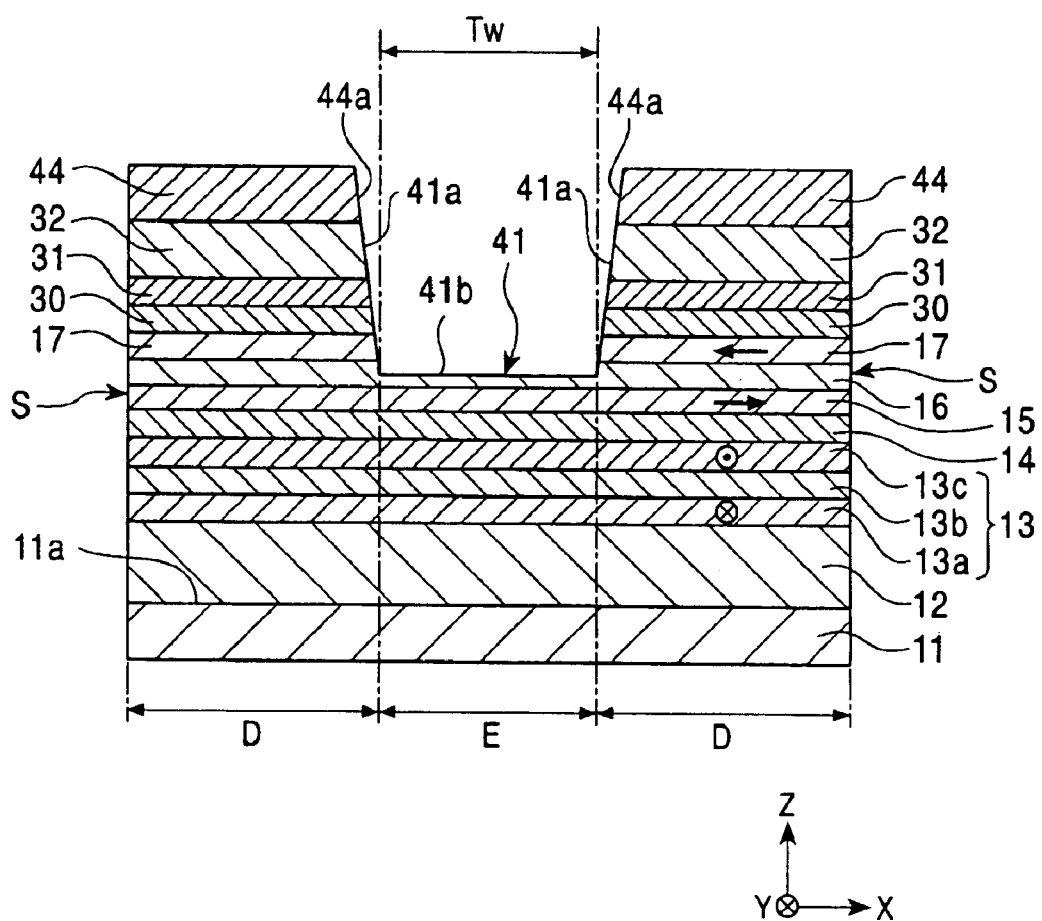
FIG. 7 is a cross-sectional view of a magnetic sensing element according to a seventh embodiment of the present invention.

In the method described above, the resist layer is deposited on the second antiferromagnetic layer 32, and after the recess 41 is made in the second antiferromagnetic layer 32, the electrode layers 43 are deposited on the second antiferromagnetic layer 32. Alternatively, in a seventh embodiment, as shown in FIG. 7, after electrode layers 44 are deposited on a second antiferromagnetic layer 32, a recess 41 is made in the second antiferromagnetic layer 32 using the electrode layers 44 as masks. In a magnetic sensing element thus obtained, as shown in FIG. 7, inclined surfaces 44*a* of the electrode layers 44 and side faces 41*a* of the recess 41 form continuous surfaces.

The annealing step in the second magnetic field may be performed after the recess 41 is made in the second antiferromagnetic layer 32.

Although the first antiferromagnetic layer 12 is deposited directly on the substrate 11 in this embodiment, the first antiferromagnetic layer 12 may be deposited on the substrate 11 with an underlayer composed of an alumina film or Ta, or the like, therebetween.

As shown in FIG. 8, in accordance with an eighth embodiment of the present invention, electrode layers 50 are joined with both sides of a laminate including a first antiferromagnetic layer 12 to a second antiferromagnetic layer 32.

In a magnetic sensing element in the eighth embodiment, it is possible to improve the proportion of a sensing current that is applied to the nonmagnetic conductive layer 14 and the free magnetic layer 15 from the electrode layers 50 without being transmitted through the second antiferromagnetic layer 32, which has a higher resistance than that of the nonmagnetic conductive layer 14 or the free magnetic layer 15. It is also possible to reduce connection resistance between the laminate, which contributes to the rate of the change in resistance, and the electrode layers 50. Accordingly, the rate of the change in resistance (ΔR/R) of the spin-valve magnetic sensing element can be increased.

Since the sensing current can be directly applied to the vicinity of the free magnetic layer 15 through the electrode layers 50, while the free magnetic layer 15 is in a single domain state, side reading is avoided. Thus, the magnetic sensing element is suitable for recording density magnetic media.

The electrodes 50 may be disposed at both sides in the track width direction of at least the free magnetic layer 15, the nonmagnetic conductive layer 14, and the pinned magnetic layer 13.

Additionally, in the magnetic sensing element in the embodiment described above, the pinned magnetic layer 13 may be a single-layered ferromagnetic layer.

In any one of the magnetic sensing elements shown in FIGS. 3 to 8, at least one of the free magnetic layer 15 and the ferromagnetic layer 17 is preferably composed of a CoFeNi alloy is, in which the Fe content is in the range of about 9 to about 17 atomic percent, the Ni content is in the range of about 0.5 to about 10 atomic percent, and the balance is Co.

Consequently, the exchange coupling magnetic field due to the RKKY interaction between the free magnetic layer 15 and the ferromagnetic layer 17 can be increased. Specifically, the magnetic field at which the antiparallel state is lost, (i.e., the spin-flop magnetic field ($H_{sf}$)), can be increased to approximately 293 kA/m.

If the compositional ranges described above are satisfied, the magnetostriction of the free magnetic layer 15 and the ferromagnetic layer 17 can be set in the range of about $-3\times10^{-6}$ to about $3\times10^{-6}$, and the coercive force can be set at about 790 A/m or less.

Moreover, soft magnetic properties of the free magnetic layer 15 can be improved, and reductions in a change in resistance (ΔR) and a rate of the change in resistance (ΔR/R) due to diffusion of Ni at the interface with the nonmagnetic conductive layer 14 can be appropriately suppressed.

An interlayer composed of a CoFe alloy or a Co alloy may be provided between the free magnetic layer 15 and the nonmagnetic conductive layer 14.

When the interlayer is provided, in the CoFeNi alloy described above, preferably, the Fe content is in the range of about 7 to about 15 atomic percent, the Ni content is in the range of about 5 to about 15 atomic percent, and the balance is Co.

When a magnetic head is fabricated using any one of the magnetic sensing elements shown in FIGS. 1 to 8, an underlayer composed of an insulating material, such as alumina, a lower shield layer composed of a magnetic alloy deposited on the underlayer, and a lower gap layer composed of an insulting material deposited on the lower shield are disposed between the substrate 11 and the first antiferromagnetic layer 12. The magnetic sensing element is deposited on the lower gap layer. An upper gap layer composed of an insulating material and an upper shield layer composed of a magnetic alloy deposited on the upper gap layer are formed on the magnetic sensing element. An inductive element for writing may be deposited on the upper shield layer.

FIGS. 14 to 19 are cross-sectional views, as seen from a face opposing a recording medium, showing a method for making the magnetic sensing element in accordance with a ninth embodiment of the present invention.

Figure 14:
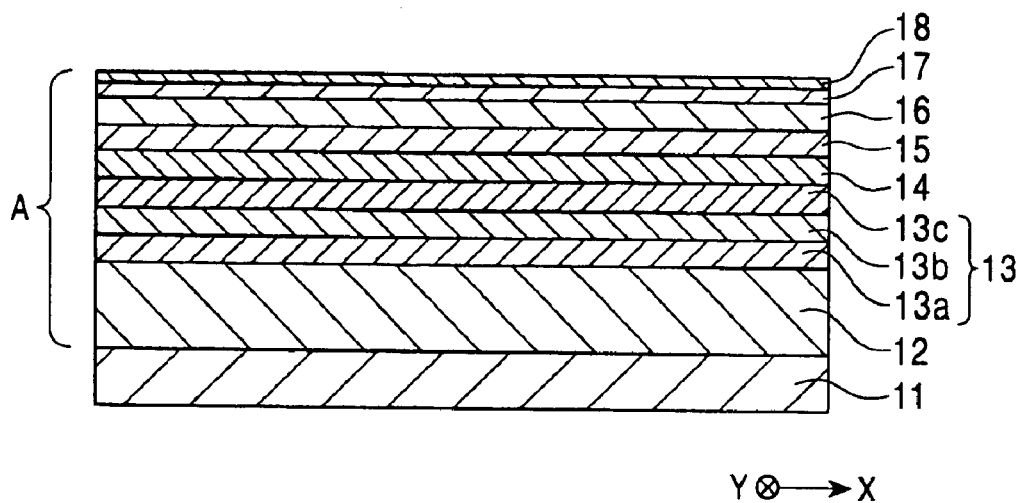
FIG. 14 is a cross-sectional view showing a step of a method for making a magnetic sensing element according to a ninth embodiment of the present invention.

Referring to FIG. 14, a first antiferromagnetic layer 12 is formed on a substrate 11. Next, a pinned magnetic layer 13 of a synthetic ferripinned type including a first pinned magnetic sublayer 13a, a nonmagnetic intermediate sublayer 13b, and a second pinned magnetic sublayer 13c is deposited on the first antiferromagnetic layer 12. A nonmagnetic conductive layer 14, a free magnetic layer 15, a nonmagnetic interlayer 16, a ferromagnetic layer 17, and a protective layer 18 are deposited in that order on the pinned magnetic layer 13 to form a laminate A.

The first antiferromagnetic layer 12, the pinned magnetic layer 13, the nonmagnetic conductive layer 14, the free magnetic layer 15, the nonmagnetic interlayer 16, the ferromagnetic layer 17, and the protective layer 18 may be deposited by a thin-film deposition process, for example using a sputtering or evaporating process in the same vacuum deposition chamber.

The first antiferromagnetic layer 12 is formed of a PtMn alloy, an X—Mn alloy, or a Pt—Mn—X' alloy wherein X is at least one metal selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The first antiferromagnetic layer 12 composed of the above alloy is annealed to generate a large exchange coupling magnetic field between the first antiferromagnetic layer 12 and the pinned magnetic layer 13 which constitute an exchange coupling film. When a PtMn alloy is used, the resulting exchange coupling film including the first antiferromagnetic layer 12 and the pinned magnetic layer 13 exhibits a large exchange coupling magnetic field of at least about 48 kA/m and particularly exceeding about 64 kA/m and a high blocking temperature of about 380° C., wherein the blocking temperature means a temperature at which the exchange coupling magnetic field disappears.

These alloys have a disordered face centered cubic (fcc) structure after the formation of the laminate. This structure is transformed into a CuAuI-type ordered face centered tetragonal (fct) structure by annealing.

The thickness of the first antiferromagnetic layer 12 is in the range of about 80 Å to about 300 Å in the center in the track width direction.

The first pinned magnetic sublayer 13a, the second pinned magnetic sublayer 13c, the free magnetic layer 15, and the ferromagnetic layer 17 are generally formed of ferromagnetic materials, for example, NiFe alloys, elemental cobalt, CoNiFe alloys, CoFe alloys, and CoNi alloys. These layers are preferably formed of NiFe alloys, elemental Co, and CoFe alloys. The first pinned magnetic sublayer 13a and the second pinned magnetic sublayer 13c are preferably composed of the same material. Also, the free magnetic layer 15 and the ferromagnetic layer 17 are composed of the same material.

Each of the nonmagnetic intermediate sublayer 13b and the nonmagnetic interlayer 16 is formed of at least one nonmagnetic material selected from Ru, Rh, Ir, Cr, Re, and Cu. Among these, Ru is preferable.

The nonmagnetic conductive layer 14 which prevents magnetic coupling and which conducts a sensing current is preferably formed of a nonmagnetic conductive material, for example, Cu, Cr, Au, or Ag. Among these, Cu is more preferable.

The protective layer 18 protects the ferromagnetic layer 17 from oxidation when the laminate A is annealed in a magnetic field and is composed of Ta or the like.

The laminate A is annealed in a first magnetic field oriented in the Y direction at a first annealing temperature to pin the magnetization of the pinned magnetic layer 13 in the Y direction by an exchange coupling magnetic field generated between the first antiferromagnetic layer 12 and the pinned magnetic layer 13. In this embodiment, the first annealing temperature is about 270° C. and the magnitude of the first magnetic field is about 800 kA/m.

During the annealing of the laminate A in the first magnetic field, a surface with a thickness of about 10 Å to about 20 Å of the protective layer 18 is oxidized. Thus, the protective layer 18 is removed by ion milling or reactive ion etching (RIE).

Figure 15:
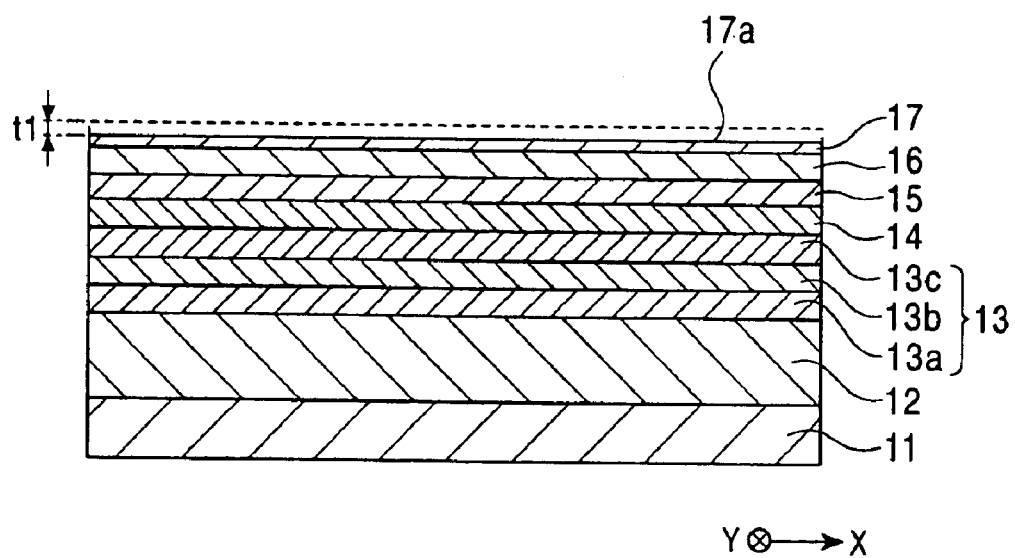
FIG. 15 is a cross-sectional view showing a step subsequent to the step shown in FIG. 14.

Furthermore, the ferromagnetic layer 17 is etched by a predetermined thickness, as shown in FIG. 15. The etched thickness t1 of the ferromagnetic layer 17 is not limited and is, for example, about 10 Å. As described below, an additional ferromagnetic layer 17 and a second antiferromagnetic layer 19 are deposited on the etched surface by a continuous vacuum deposition process.

Figure 16:
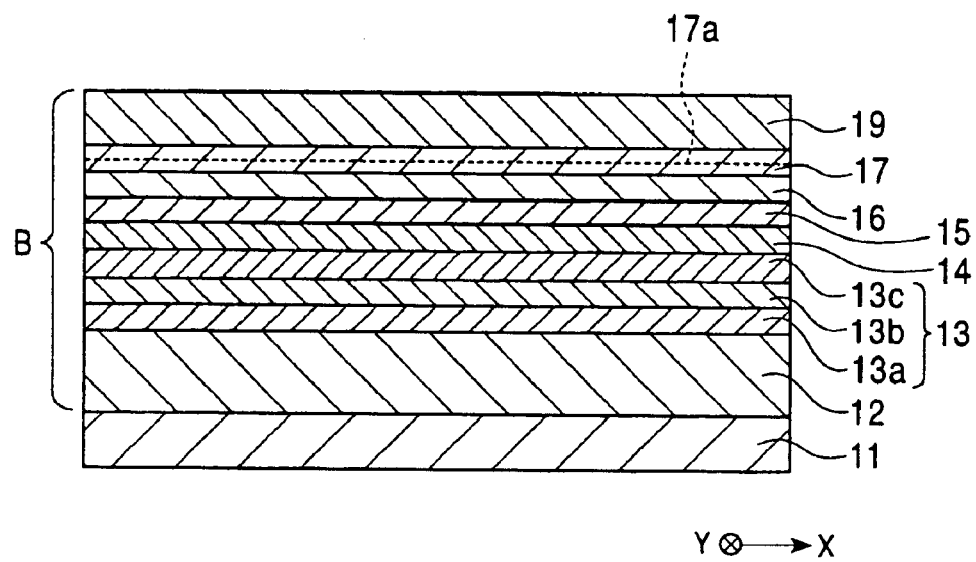
FIG. 16 is a cross-sectional view showing a step subsequent to the step shown in FIG. 15.

Referring to FIG. 16, the ferromagnetic layer 17 is additionally deposited on the etched surface 17a of the original ferromagnetic layer 17, and then the second antiferromagnetic layer 19 is deposited on the additional ferromagnetic layer 17 by the continuous deposition process (hereinafter, the laminate from the first antiferromagnetic layer 12 to the second antiferromagnetic layer 19 is referred to as a laminate B). The additional ferromagnetic layer 17 has the same composition as that of the original ferromagnetic layer 17. The etched thickness t1 is not necessarily the same as the thickness of the additional ferromagnetic layer 17 deposited in this process.

The second antiferromagnetic layer 19 is also formed of a PtMn alloy, an X—Mn alloy, or a Pt—Mn—X' alloy wherein X is at least one metal selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr, as in the first antiferromagnetic layer 12.

The thickness of the second antiferromagnetic layer 19 is in the range of about 80 Å to about 300 Å and preferably about 200 Å in the center of the laminate A in the track width direction.

In the PtMn alloy and the X—Mn alloy for forming the first antiferromagnetic layer 12 and the second antiferromagnetic layer 19, the Pt content and the X content are preferably in the range of about 37 to about 63 atomic percent and more preferably in the range of about 47 to about 57 atomic percent.

In the Pt—Mn—X' alloy, the X'+Pt content is preferably in the range of about 37 to about 63 atomic percent and, more preferably, in the range of about 47 to about 57 atomic percent. Moreover, the X' content is preferably in the range of 0.2 to 10 atomic percent. When X' is at least one element selected from Pd, Ir, Rh, Ru, Os, Ni, and Fe, the X'content is preferably in the range of about 0.2 to about 40 atomic percent.

A first antiferromagnetic layer and a second antiferromagnetic layer formed of annealed alloys having the above-described optimized compositions can generate a large exchange coupling magnetic field. In particular, a first antiferromagnetic layer and a second antiferromagnetic layer formed of a PtMn alloy exhibit a large exchange coupling magnetic field of about 48 kA/m or more, for example, about 64 kA/m by magnetic coupling with the ferromagnetic layer and a significantly high blocking temperature of about 380° C.

These alloys have a disordered fcc structure after the deposition and this structure is transformed into a CuAuI-type ordered fct structure.

In the magnetic sensing element in this embodiment, the first antiferromagnetic layer 12 and the second antiferromagnetic layer 19 may be composed of the same antiferromagnetic material.

The second antiferromagnetic layer 19 may be covered with a protective layer composed of a nonmagnetic material such as Ta.

The laminate B is annealed in a second magnetic field oriented in the X direction at a second annealing temperature to pin the magnetization of the ferromagnetic layer 17 in the X direction by an exchange anisotropic magnetic field generated between the second antiferromagnetic layer 19 and the ferromagnetic layer 17. In this embodiment, the second annealing temperature is about 250° C. and the magnitude of the second magnetic field is about 24 kA/m.

The exchange anisotropic magnetic field by the second antiferromagnetic layer 19 is not generated until the laminate B is annealed in the second magnetic field. Thus, in the second annealing process, the second annealing temperature is set to be lower than the blocking temperature at which the exchange coupling magnetic field by the first antiferromagnetic layer 12 disappears, and the magnitude of the second magnetic field is set to be smaller than that of the exchange anisotropic magnetic field by the first antiferromagnetic layer 12. As a result, the exchange anisotropic magnetic field between the first antiferromagnetic layer 12 and the first pinned magnetic sublayer 13a is fixed in the Y direction and the exchange anisotropic magnetic field by the second antiferromagnetic layer 19 is oriented in the X direction. Even when the first antiferromagnetic layer 12 and the second antiferromagnetic layer 19 are formed of the same material and annealed in the second magnetic field under the above conditions, the exchange anisotropic magnetic field by the second antiferromagnetic layer 19 can be oriented in the X direction, while the exchange anisotropic magnetic field by the first antiferromagnetic layer 12 is fixed in the Y direction. In other words, the magnetization of the free magnetic layer 15 is readily oriented in a direction which is substantially orthogonal to the magnetization direction of the pinned magnetic layer 13.

Figure 17:
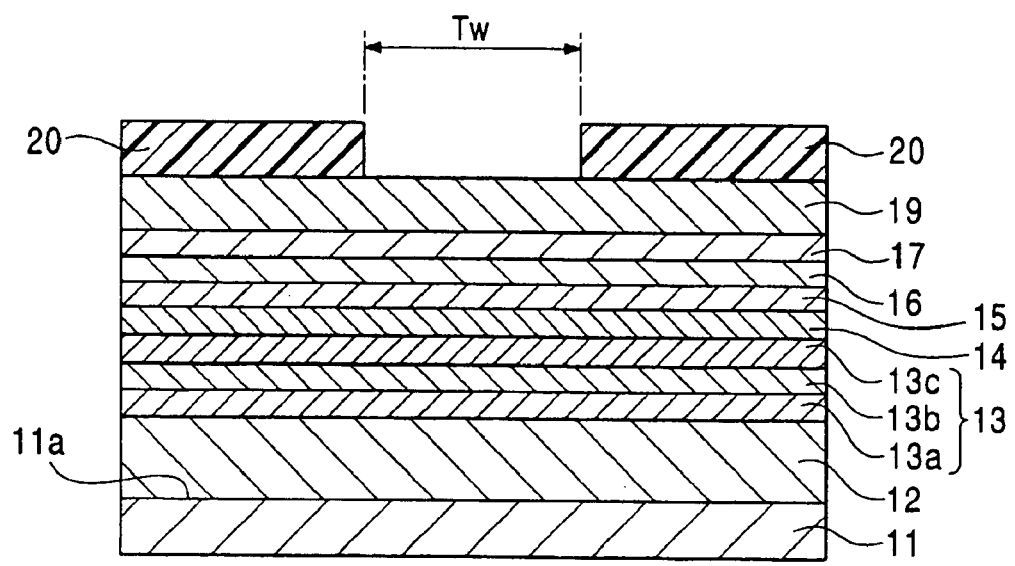
FIG. 17 is a cross-sectional view showing a step subsequent to the step shown in FIG. 16.

Referring to FIG. 17, the second antiferromagnetic layer 19 are masked with resist layers 20 deposited thereon, such that an opening having the track width Tw is formed on the second antiferromagnetic layer 19.

Figure 18:
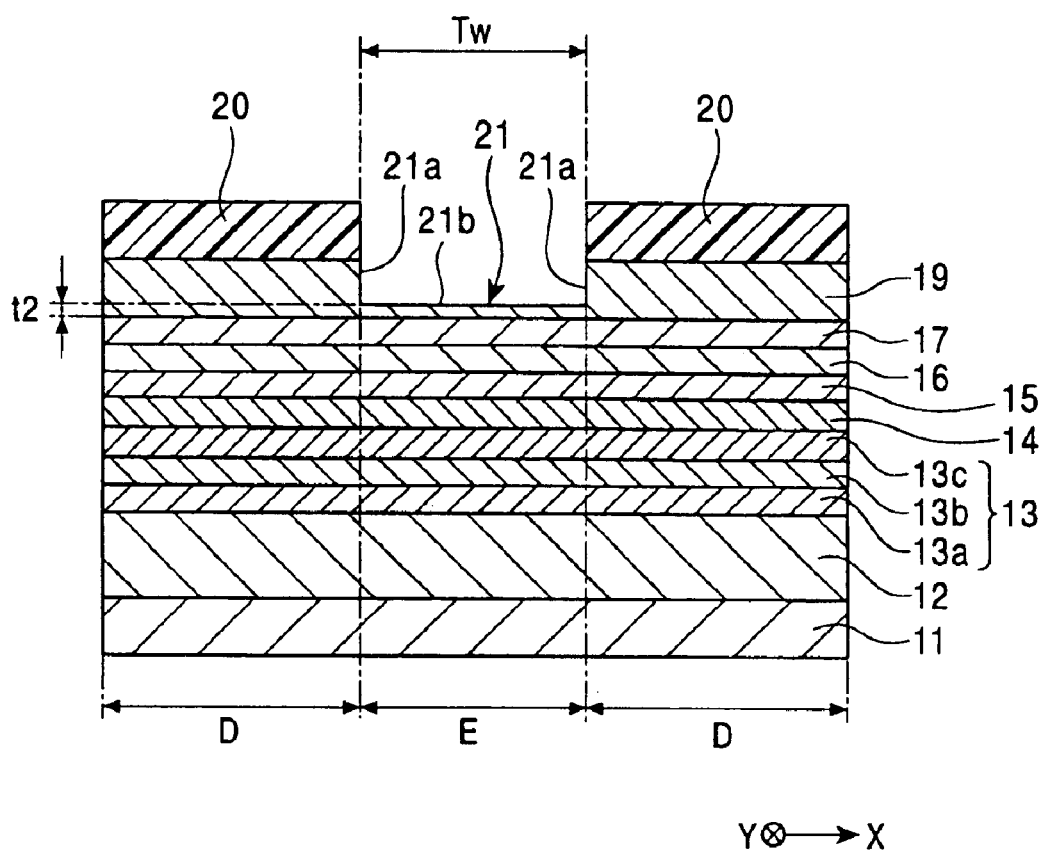
FIG. 18 is a cross-sectional view showing a step subsequent to the step shown in FIG. 17.

Referring to FIG. 18, the unmasked portion of the second antiferromagnetic layer 19 in the opening is etched in the vertical direction relative to the surface of the substrate 11, namely, to the track width direction (X direction in the drawing) by ion milling or RIE to form a recess 21 that defines a track width region E. Thus, the recess 21 has side faces 21a which are perpendicular to the track width direction. In this drawing, the bottom face 21b of the recess 21 lies in the second antiferromagnetic layer 19. Herein, the thickness t2 of the second antiferromagnetic layer 19 at the bottom face 21b of the recess 21 is not more than about 30 Å.

Within such a thickness, the second antiferromagnetic layer 19 at the bottom face 21b does not undergo disordered-to-ordered transformation during annealing in the second magnetic field. Thus, no exchange coupling magnetic field is generated between the second antiferromagnetic layer 19 and the ferromagnetic layer 17.

On the other hand, in end regions D other than the track width region E, the second antiferromagnetic layer 19 has a thickness that is sufficient to yield antiferromagnetism for firmly fixing the magnetization directions of the ferromagnetic layer 17 and the free magnetic layer 15. In other words, the magnetization direction of the ferromagnetic layer 17 is fixed only in the end regions D in the track width direction by exchange magnetic coupling with the second antiferromagnetic layer 19. Thus, the magnetization direction of the free magnetic layer 15, lying below the ferromagnetic layer 17, is also fixed only in the end regions D by the RKKY interaction with the ferromagnetic layer 17.

When no external magnetic field is applied, the magnetization of the free magnetic layer 15 in the track width region E is oriented in the X direction by the effects of the pinned magnetizations in the end regions D. When an external magnetic field is applied, the magnetization direction of the free magnetic layer 15 changes.

Thus, the track width of the magnetic sensing element is determined by the width Tw of the recess 21, which prevents side reading that causes erroneous reading of recorded signals at regions other than the track width Tw. In this embodiment, the recess 21 can be readily formed by milling the second antiferromagnetic layer 19 to a uniform thickness in the vertical direction by RIE or ion milling, as described above. Thus, the recess 21 has a precise track width Tw. Accordingly, the track width Tw of the magnetic sensing element can be precisely defined.

Figure 19:
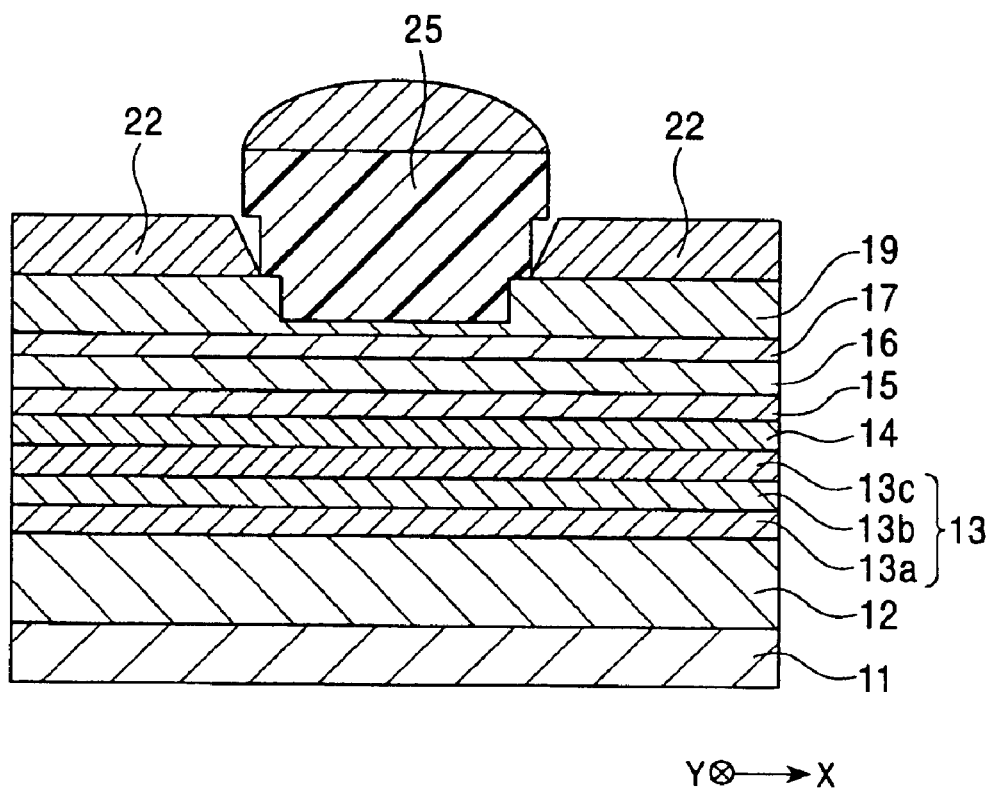
FIG. 19 is a cross-sectional view showing a step subsequent to the step shown in FIG. 18.

Referring to FIG. 19, after the resist layers 20 are removed, a lift-off resist layer 25 is formed on the second antiferromagnetic layer 19 so as to cover a region that is wider than the width (track width Tw) of the recess 21. Electrode layers 22 are deposited on the uncovered regions of the second antiferromagnetic layer 19 by sputtering or evaporation. The electrode layers 22 are formed of, for example, Au, W, Cr, or Ta. Next, the lift-off resist layer 25 is removed to prepare a magnetic sensing element shown in FIG. 20.

The magnetic sensing element formed according to this embodiment has steps along the track width direction between the electrode layers 22 and the recess 21. The second antiferromagnetic layer 19 and the electrode layers 22 may be separated by protective layers composed of, for example, Ta or Cr.

In this embodiment, the resist layers 20 are deposited on the second antiferromagnetic layer 19, and the recess 21 is formed in the second antiferromagnetic layer 19, and then the electrode layers 22 are deposited on the second antiferromagnetic layer 19. Alternatively, the following procedure may be employed. An electrode layer is deposited on the second antiferromagnetic layer 19, and a pair of resist layers is deposited on the electrode layer at a distance corresponding to the track width in the track width direction. Then, a recess is formed through the electrode layer and the second antiferromagnetic layer 19. The annealing in the second magnetic field may be performed after the recess 21 is formed in the second antiferromagnetic layer 19.

In this embodiment, the first antiferromagnetic layer 12 is directly formed on the substrate 11. Alternatively, the first antiferromagnetic layer 12 may be formed on an underlayer composed of alumina, Ta, or the like, which is formed on the substrate 11.

In the formation of the laminate A, an antidiffusion layer composed Co or the like may be formed between the free magnetic layer 15 and the nonmagnetic conductive layer 14. The antidiffusion layer prevents interdiffusion between the free magnetic layer 15 and the nonmagnetic conductive layer 14. Moreover, another antidiffusion layer composed of Co or the like may be formed between the second pinned magnetic sublayer 13c and the nonmagnetic conductive layer 14 to prevent interdiffusion therebetween.

The free magnetic layer 15 and the ferromagnetic layer 17 have different magnetic moments per unit area. The magnetic moment per unit area is represented by the product of the saturation magnetization $M_s$ and the thickness t. For example, the free magnetic layer 15 and the ferromagnetic layer 17 are formed using the same material so that the thicknesses thereof are different from each other. The magnitudes of the magnetic moments per unit area thereof are different from each other.

When the free magnetic layer 15 and the nonmagnetic conductive layer 14 are separated by the antidiffusion layer, the sum of the magnetic moments per unit area of the free magnetic layer 15 and the antidiffusion layer is preferably different from the magnetic moment per unit area of the ferromagnetic layer 17.

Figure 20:
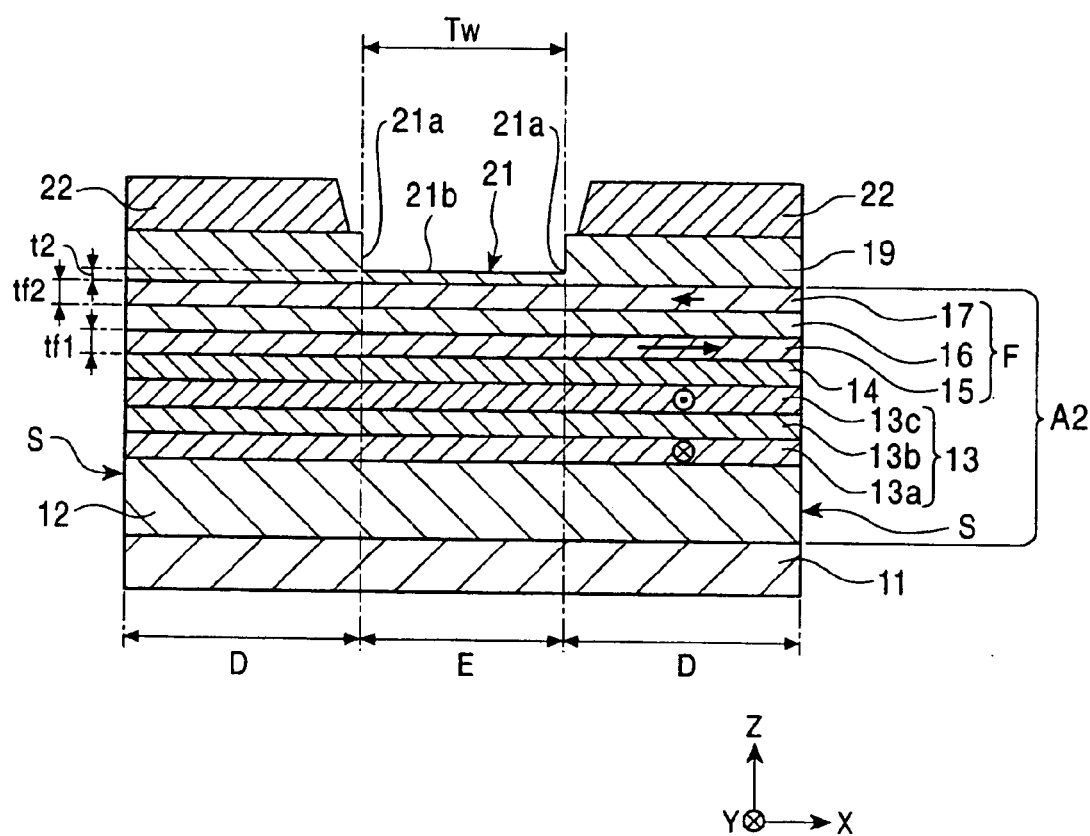
FIG. 20 is a cross-sectional view of a magnetic sensing element manufactured by the method according to the ninth embodiment of the present invention viewed from the side opposing a recording medium.

Referring to FIG. 20, in the magnetic sensing element formed by the above-described process, the bottom face 21b of the recess 21 lies in the second antiferromagnetic layer 19 which functions as a longitudinal bias layer. Thus, the magnetic sensing element exhibits a ferrimagnetic state in which the magnetization direction of the free magnetic layer 15 and the magnetization direction of the ferromagnetic layer 17 separated by the nonmagnetic interlayer 16 are antiparallel to each other. Herein, a multilayer structure including the free magnetic layer 15, the nonmagnetic interlayer 16, and the ferromagnetic layer 17 functions as one free magnetic layer, namely, a synthetic ferrimagnetic free layer F. The effect of the synthetic ferrimagnetic free layer F is equivalent to that achieved by a reduction in the thickness of the free magnetic layer 15 for facilitating a variation in magnetization of the free magnetic layer 15. Thus, the magnetic sensing element exhibits enhanced sensitivity to a magnetic field.

The sum of the magnetic moment of the free magnetic layer 15 and the magnetic moment of the ferromagnetic layer 17 is equal to the magnetization direction of the synthetic ferrimagnetic free layer F.

Herein, only the magnetization direction of the free magnetic layer 15 contributes to the output in connection with the magnetization direction of the pinned magnetic layer 13.

When the magnetic thickness of the free magnetic layer is different from the magnetic thickness of the ferromagnetic layer, the spin-flop magnetic field of the synthetic ferrimagnetic free layer F is increased. Herein, the spin-flop magnetic field represents an external magnetic field which disorders an antiparallel arrangement between the magnetization directions of two magnetic layers when the external magnetic field is applied thereto.

FIG. 11 is a conceptual diagram of a hysteresis loop for the synthetic ferrimagnetic free layer F. This M-H curve represents a change in the magnetization M of the synthetic ferrimagnetic free layer F versus the external magnetic field which is applied to the synthetic ferrimagnetic free layer F in the track width direction. In the following description, the free magnetic layer 15 is referred to as a first free magnetic layer, the ferromagnetic layer 17 is referred to as a second free magnetic layer, and the synthetic ferrimagnetic free layer F is referred to as a free magnetic layer.

In FIG. 11, arrows F1 represent the magnetization directions of the first free magnetic layer, and arrows F2 represent the magnetization directions of the second free magnetic layer.

As shown in FIG. 11, in a small external magnetic field, the first free magnetic layer and the second free magnetic layer exhibit a ferrimagnetic state which is represented by an antiparallel arrangement between the arrow F1 and the arrow F2. When the external magnetic field exceeds a certain value, the RKKY interaction between the first free magnetic layer and the second free magnetic layer is decoupled and the ferrimagnetic state disappears. This transition is called the spin-flop transition. The external magnetic field when the spin-flop transition occurs corresponds to the spin-flop magnetic field which is represented by $H_{sf}$ in FIG. 11. The coercive force of the free magnetic layer is represented by $H_{cf}$.

When the magnitude of the magnetic moment per unit area of the first free magnetic layer is different from that of the second free magnetic layer, the spin-flop magnetic field $H_{sf}$ of the free magnetic layers becomes large. Thus, the free magnetic layers exhibit a ferrimagnetic state over a wide range of magnitude of magnetic field. Thus, the ferrimagnetic state of the free magnetic layer becomes more stable.

In this embodiment, at least one of the free magnetic layer 15 and the ferromagnetic layer 17 is preferably formed of a magnetic material having the following composition.

A composition represented by CoFeNi, wherein the Fe content is in the range of about 9 to about 17 atomic percent, the Ni content is in the range of about 0.5 to about 10 atomic percent, and the balance is the Co content.

The exchange coupling magnetic field due to the RKKY interaction can thereby be enhanced between the free magnetic layer 15 and the ferromagnetic layer 17. For example, the spin-flop magnetic field $H_{sf}$ when the antiparallel arrangement disappears can be increased to about 293 kA/m.

As a result, the magnetizations at the both ends of the free magnetic layer 15 and the ferromagnetic layer 17 can be pinned at an adequate antiparallel state, suppressing side reading.

Preferably, both the free magnetic layer 15 and the ferromagnetic layer 17 are formed of the above CoFeNi alloy in order to generate a higher spin-flop magnetic field which maintains the antiparallel state between the free magnetic layer 15 and the ferromagnetic layer 17.

The free magnetic layer 15 and the ferromagnetic layer 17 having the above-mentioned composition exhibit a magnetostriction in the range of about $-3\times10^{-6}$ to about $3\times10^{-6}$ and a coercive force of about 790 A/m or less.

Furthermore, the above composition contributes to improved soft magnetic characteristics of the free magnetic layer 15 and suppressed interdiffusion through the nonmagnetic conductive layer 14, thus preventing a reduction in the change in resistance ($\Delta R$) and a reduction in the rate of change in resistance ($\Delta R/R$).

The thickness tf2 of the ferromagnetic layer 17 is preferably in the range of about 0.5 to about 2.5 nm. The thickness tF1 of the free magnetic layer 15 is preferably about 2.5 to about 4.5 nm, more preferably in the range of about 3.0 to about 4.0 nm and, most preferably, in the range of about 3.5 to about 4.0 nm. Outside of the above range, the spin-valve magnetic sensing element does not exhibit a large rate of change in resistance.

In the magnetic sensing element shown in FIG. 20, the second antiferromagnetic layer 19, which functions as a longitudinal bias layer, has a thickness which is sufficient to generate antiferromagnetism over the entire regions (end regions D) other than the track width region E so that the magnetizations of the ferromagnetic layer 17 and the free magnetic layer 15 are firmly fixed in these end regions D.

In the region E, the magnetizations of the free magnetic layer 15 and the ferromagnetic layer 17 below the bottom face 21b of the recess 21 are oriented in the X direction affected by the fixed magnetizations of the end regions D when no external magnetic field is applied, and the magnetization direction of the free magnetic layer 15 vary with the external magnetic field.

Thus, the track width of the magnetic sensing element is determined by the width Tw of the recess 21, and side reading at regions other than the track width Tw is prevented.

The antiferromagnetic coupling with the second antiferromagnetic layer 19 acts only in the end regions D, which lie outside the bottom face 21b of the recess 21 in the track width direction, and does not occur in the track width region E below the bottom face 21b.

Thus, the track width region E having the track width Tw, corresponding to the width of the recess 21 in the second antiferromagnetic layer 19, is a sensitive region having a magnetoresistive effect which substantially contributes to reading the recording magnetic field. Since the track width region E having the track width Tw (optical track width) includes no insensitive region, the magnetic sensing element exhibits high reading output even when the optical track width Tw is decreased to meet higher recording density.

Moreover, side faces S of the magnetic sensing element are perpendicular to the track width direction according to the method of this embodiment. Thus, the free magnetic layer 15 has a uniform thickness in the track width direction.

In the step shown in FIG. 14, the first pinned magnetic sublayer 13a and the second pinned magnetic sublayer 13c are formed such that the magnitudes of the magnetic moments per unit thereof are different from each other. Thus, the laminate including the first pinned magnetic sublayer 13a and the second pinned magnetic sublayer 13c separated by the nonmagnetic intermediate sublayer 13b functions as one pinned magnetic layer 13.

The first pinned magnetic sublayer 13a is in contact with the first antiferromagnetic layer 12. An exchange anisotropic magnetic field is generated at the interface between the first pinned magnetic sublayer 13a and the first antiferromagnetic layer 12 during annealing in a magnetic field to pin the magnetization of the first pinned magnetic sublayer 13a in the Y direction in the drawing. As a result, the magnetization of the second pinned magnetic sublayer 13c opposing the first pinned magnetic sublayer 13a thorough the nonmagnetic intermediate sublayer 13b is pinned in the opposite direction to the Y direction.

The sum (synthetic magnetic moment) of the magnetic moment of the first pinned magnetic sublayer 13a and the magnetic moment of the second pinned magnetic sublayer 13c is equal to the magnetization direction of the pinned magnetic layer 13.

As described above, the magnetization direction of the first pinned magnetic sublayer 13a and the magnetization direction of the second pinned magnetic sublayer 13c are antiparallel to each other and are in a ferrimagnetic state. Since the first pinned magnetic sublayer 13a and the second pinned magnetic sublayer 13c mutually pin the magnetization directions thereof, the overall magnetization of the pinned magnetic layer 13 is stably pinned in one direction.

The first pinned magnetic sublayer 13a and the second pinned magnetic sublayer 13c are formed of ferromagnetic materials, such as NiFe alloys, elemental Co, CoNiFe alloys, CoFe alloys, and CoNi alloys. Among these, NiFe alloys and elemental Co are preferred. Preferably, the first pinned magnetic sublayer 13a and the second pinned magnetic sublayer 13c are formed of the same material.

In FIG. 20, the first pinned magnetic sublayer 13a and the second pinned magnetic sublayer 13c are formed of the same material and have different thicknesses so as to have different magnetic moments per unit area.

The nonmagnetic intermediate sublayer 13b is formed of at least one nonmagnetic metal selected from Ru, Rh, Ir, Cr, Re, and Cu. Among these, Ru is preferable.

As described above, the pinned magnetic layer 13 is a laminate of the first pinned magnetic sublayer 13a, the nonmagnetic intermediate sublayer 13b, and the second pinned magnetic sublayer 13c; hence, the first pinned magnetic sublayer 13a and the second pinned magnetic sublayer 13c mutually pin the magnetization directions thereof. As a result, the overall magnetization of the pinned magnetic layer 13 is firmly pinned in one direction. For example, a large exchange coupling magnetic field $H_{ex}$ of about 80 to about 160 kA/m is generated between the first antiferromagnetic layer 12 and the pinned magnetic layer 13. Thus, by annealing in the first magnetic field for orienting the magnetization of the first pinned magnetic sublayer 13a, and then by annealing in the second magnetic field in the track width direction, a large longitudinal bias magnetic field by the second antiferromagnetic layer 19 is generated without orientation of the magnetization of the pinned magnetic layer 13 in the track width direction.

In this embodiment, demagnetizing fields (dipole magnetic field) $H_d$ due to the pinned magnetization of the pinned magnetic layer 13 counteract each other by magnetostatic coupling between the first pinned magnetic sublayer 13a and the second pinned magnetic sublayer 13c. As a result, contribution of the demagnetizing fields by the pinned magnetization of the pinned magnetic layer 13 to the variable magnetization of the free magnetic layer 15 is moderated. Accordingly, the variable magnetization of the free magnetic layer 15 can be readily oriented in a desired direction, and the resulting spin-valve magnetic sensing element can output highly symmetrical signals (reduced asymmetry).

If the pinned magnetic layer 13 has a single layer structure, the demagnetizing field (dipole magnetic field) $H_d$ by the pinned magnetization of the pinned magnetic layer 13 does not exhibit a uniform distribution in the height direction of the element; the demagnetizing field is high at the ends and low in the center. Such nonuniformity may preclude a single-domain alignment in the free magnetic layer 15. In this embodiment, the pinned magnetic layer 13 has the above-described layered structure; hence, the demagnetizing field $H_d$ is substantially zero. Since magnetic nonuniformity due to magnetic walls does not occur in the free magnetic layer 15, no Barkhausen noise occurs in the present invention.

When a stationary current flows from the electrode layers 22 in the synthetic ferrimagnetic free layer F, the nonmagnetic conductive layer 14, and the pinned magnetic layer 13 in the presence of a leakage magnetic field in the Y direction from a recording magnetic medium which moves in the Z direction, the magnetization of the free magnetic layer 15 of the synthetic ferrimagnetic free layer F changes from the X direction toward the Y direction. The electric resistance changes by the correlation between the variable magnetization of the free magnetic layer 15 and the pinned magnetization of the second pinned magnetic sublayer 13c, and the leakage magnetic field from the magnetic recording medium is detected as a change in voltage in response to such a change in resistance.

In the step shown in FIG. 18, the recess 21 is formed such that the bottom face 21b lies in the second antiferromagnetic layer 19. Alternatively, in the present invention; the bottom face 21b may lie in the ferromagnetic layer 17, as shown in FIG. 21 (a tenth embodiment).

Figure 21:
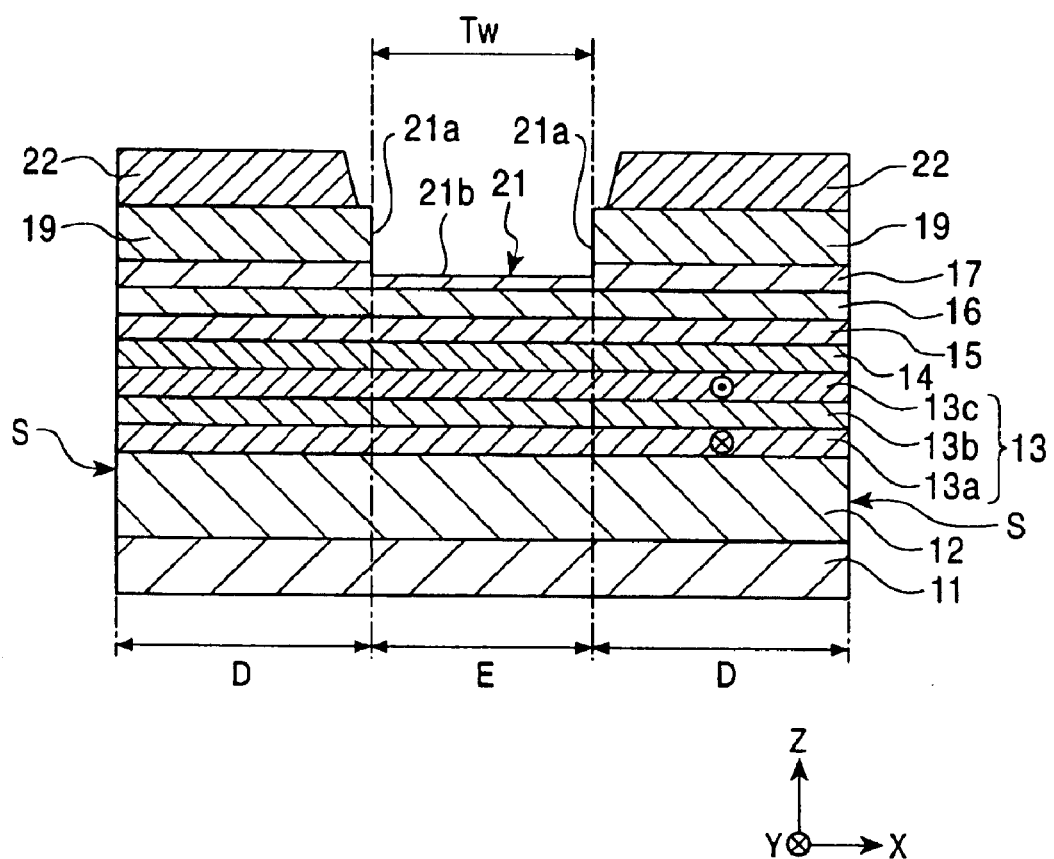
FIG. 21 is a cross-sectional view of a magnetic sensing element manufactured by a method according to a tenth embodiment of the present invention viewed from the side opposing a recording medium.

In the magnetic sensing element shown in FIG. 21, the second antiferromagnetic layer 19 is removed in the region E with the track width Tw. Thus, the second antiferromagnetic layer 19 will not remain on the bottom face 21b of the recess 21, even if the second antiferromagnetic layer 19 has a nonuniform thickness. Since the second antiferromagnetic layer 19 is not present on the bottom face 21b of the recess 21, the track width Tw can be precisely defined. Thus, the resulting spin-valve magnetic sensing element is suitable for higher recording density. The second antiferromagnetic layer 19 itself can be readily removed.

Alternatively, the recess 21 may be formed such that the bottom face 21b thereof lies in the nonmagnetic interlayer 16, as shown in FIG. 1.

In the magnetic sensing element shown in FIG. 1, the magnetization of the ferromagnetic layer 17 is fixed in the track width direction (opposite direction to the X direction) by magnetic coupling (exchange coupling) with the second antiferromagnetic layer 19, and the magnetization of the free magnetic layer 15 below the ferromagnetic layer 17 with the nonmagnetic interlayer 16 therebetween is oriented in the track width direction (X direction) by the RKKY interaction with the ferromagnetic layer 17. That is, the ferromagnetic layer 17, the nonmagnetic interlayer 16, and the free magnetic layer 15 has a synthetic ferrimagnetic structure below the second antiferromagnetic layer 19 in the end regions D in the track width direction. As a result, the magnetization of the free magnetic layer 15 can be readily oriented in the track width direction.

Even if the exchange coupling magnetic field between the second antiferromagnetic layer 19 and the ferromagnetic layer 17 is relatively weak, the magnetization of the free magnetic layer 15 can be oriented in a direction which is substantially perpendicular to the magnetization direction of the pinned magnetic layer 13.

In the magnetic sensing element shown in FIG. 1, the nonmagnetic interlayer 16 functions as a protective layer for the free magnetic layer 15 in the track width region E. Moreover, a nonmagnetic interlayer 16 formed of a conductive material also functions as a back layer.

The spin filter effect will now be described. FIG. 9 is a schematic view for illustrating the spin filter effect in a spin-valve magnetic sensing element not having a back layer, and FIG. 10 is a schematic view for illustrating the spin filter effect in a spin-valve magnetic sensing element having a back layer Bs.

The giant magnetoresistive (GMR) effect is primarily caused by spin-dependent scattering of electrons. The GMR effect is based on the difference between λ+ and λ−, wherein λ+ represents the mean free path of electrons having a spin that is parallel to the magnetization direction of a magnetic layer, namely, the free magnetic layer (spin-up electrons), and λ− represents the mean free path of electrons having a spin that is antiparallel to the magnetization direction of the free magnetic layer (spin-down electrons). In FIGS. 9 and 10, the spin-up electrons are represented by upward arrows and the spin-down electrons are represented by downward arrows. Spin-up electrons having a spin parallel to the magnetization direction of the free magnetic layer can pass through the free magnetic layer without scattering, whereas spin-down electrons having a spin antiparallel to the magnetization direction are scattered in the free magnetic layer by the following reason. The spin-up electrons have a mean free path λ+ of, for example, about 50 Å, whereas the spin-down electrons have a mean free path λ− of about 6 Å which is about one-tenth of the mean free path λ+. The free magnetic layer 115 has a thickness that is larger than the mean free path λ− (6 Å) of the spin-down electrons and is smaller than the mean free path λ+ (50 Å) of the spin-up electrons.

Accordingly, the spin-up electrons having a spin parallel to the magnetization direction of the free magnetic layer 115 can pass through the free magnetic layer 115, whereas the spin-down electrons having a spin antiparallel to the magnetization direction are scattered (filtered out) in the free magnetic layer 115.

Spin-down electrons which are generated in a pinned magnetic layer 113 and that pass through a nonmagnetic metal layer 114 are scattered in the vicinity of the interface between the free magnetic layer 115 and the nonmagnetic metal layer 114 and thus substantially do not reach the free magnetic layer 115. Since the mean free path of the spin-down electrons does not change even when the magnetization direction of the free magnetic layer 115 rotates, the spin-down electrons do not affect the rate of change in resistance by the GMR effect. Thus, only the behavior of the spin-up electrons contributes to the GMR effect.

Spin-up electrons generated in the pinned magnetic layer 113 move in the nonmagnetic metal layer 114 having a thickness that is smaller than the mean free path λ+ of the spin-up electrons toward the free magnetic layer 115, and that pass through the free magnetic layer 115 without restriction, because the spin-up electrons have a spin parallel to the magnetization direction of the free magnetic layer 115.

In a state in which the magnetization direction of the pinned magnetic layer and the magnetization direction of the free magnetic layer are antiparallel to each other, the spin of the spin-up electrons are not parallel to the magnetization direction of the free magnetic layer 115. Thus, the spin-up electrons are scattered in the vicinity of the interface between the free magnetic layer 115 and the nonmagnetic metal layer 114. As a result, the mean free path of the spin-up electrons distinctly decreases, resulting in an increase in resistance. The rate of change in resistance has a positive correlation with the change in the effective mean free path of the spin-up electrons.

When the back layer Bs is provided, as shown in FIG. 10, the spin-up electrons that pass through the free magnetic layer 115 move in the back layer Bs by an additional mean free path $\lambda+_b$, which is determined by the material constituting the back layer Bs, and are scattered in the back layer Bs. In other words, the back layer Bs increases the mean free path λ+ of the spin-up electrons by the additional mean free path $\lambda+_b$.

Since the nonmagnetic interlayer 16 functions as a back layer in this embodiment, the mean free path of the spin up conduction electrons is elongated. Thus, the spin-valve magnetic sensing element has a large rate of change in mean free path of spin-up electrons by an applied external magnetic field and thus a large rate of change in resistance (ΔR/R) by magnetism.

Figure 22:
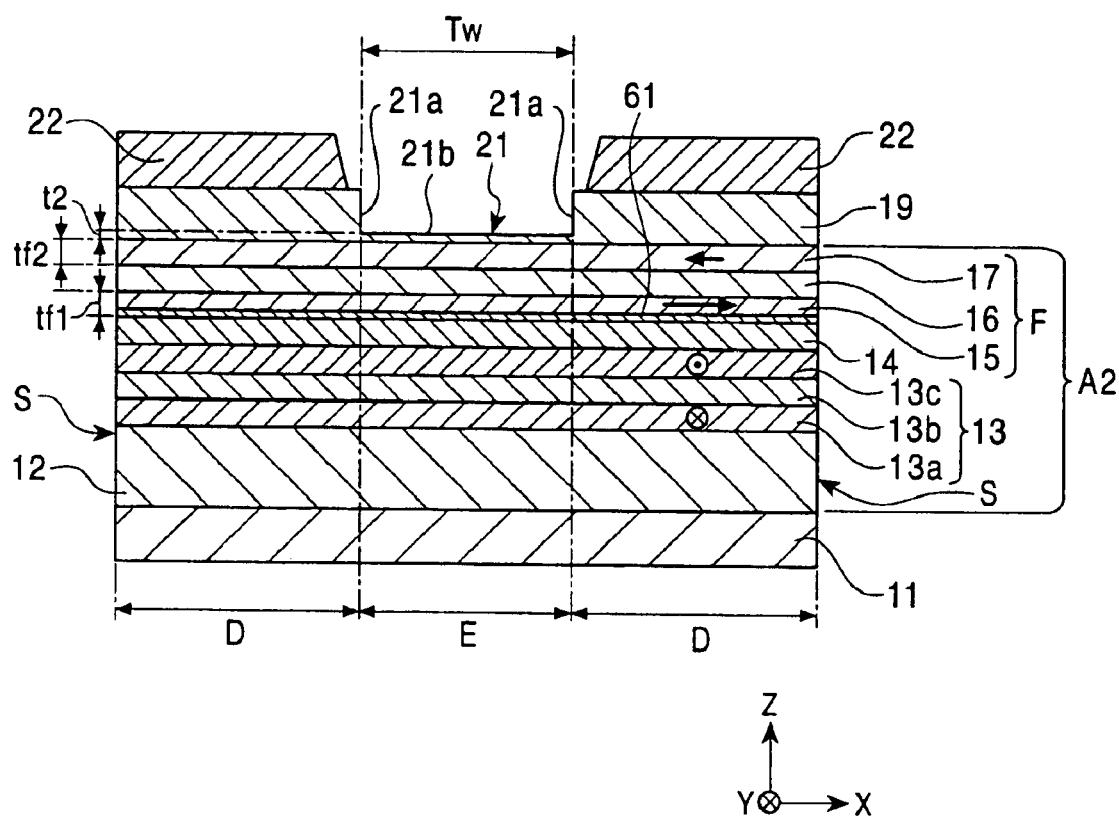
FIG. 22 is a cross-sectional view of a magnetic sensing element manufactured by the method according to an eleventh embodiment of the present invention viewed from the side opposing a recording medium.

FIG. 22 is a cross-sectional view, as seen from a face opposing a recording medium, of a magnetic sensing element in accordance with an eleventh embodiment of the present invention.

In this embodiment, the free magnetic layer 15 and the nonmagnetic conductive layer 14 are separated by an interlayer 61. Preferably, the interlayer 61 is composed of a CoFe alloy or a Co alloy. More preferably, the interlayer 61 is composed of a CoFe alloy. The interlayer 61 prevents diffusion of metallic elements at the interface to the nonmagnetic conductive layer 14, resulting in an increased change in resistance (66 R) and an increased rate of change in resistance (ΔR/R). The interlayer 61 generally has a thickness of about 5 Å.

When the free magnetic layer 15 is formed of a CoFeNi alloy having the above-described composition, diffusion of metals between the free magnetic layer 15 and the nonmagnetic conductive layer 14 is suppressed. In such a case, the interlayer 61 is not always necessary. When the free magnetic layer 15 is formed of a magnetic material not containing Co, for example, a NiFe alloy, the interlayer 61 is preferably provided to prevent diffusion of metals.

However, the interlayer 61 is preferably provided even when the free magnetic layer 15 is formed of the CoFeNi alloy to further suppress diffusion of metals between the free magnetic layer 15 and the nonmagnetic conductive layer 14.

When the interlayer 61 is provided between the free magnetic layer 15 and the nonmagnetic conductive layer 14, one of the free magnetic layer 15 and the nonmagnetic conductive layer 14 being composed of the CoFeNi alloy, the CoFeNi alloy preferably has an Fe content in the range of about 7 to about 15 atomic percent and a Ni content in the range of about 5 to about 15 atomic percent, the balance being Co.

The exchange coupling magnetic field by the RKKY interaction between the free magnetic layer 15 and the ferromagnetic layer 17 can thereby be increased. In detail, the spin-flop magnetic field $H_{sf}$, which is a magnetic field when the antiparallel arrangement is disordered, can be increased to about 293 kA/m.

Accordingly, the magnetization of the free magnetic layer 15 and the magnetization of the ferromagnetic layer 17 can be fixed in an antiparallel arrangement at the both ends, suppressing side reading.

In this embodiment, both the free magnetic layer 15 and the ferromagnetic layer 17 are formed of the CoFeNi alloy to generate a higher spin-flop magnetic field.

The free magnetic layer 15 and the ferromagnetic layer 17 having the above-mentioned composition exhibit a magnetostriction in the range of about $-3\times10^{-6}$ to about $3\times10^{-6}$ and a coercive force of about 790 A/m or less. Moreover, the free magnetic layer 15 has improved soft magnetic characteristics.

In this embodiment, the free magnetic layer 15 and the nonmagnetic conductive layer 14 may be separated by an interlayer 61 and the bottom face 21b of the recess 21 may lie in the nonmagnetic interlayer 16, as shown in FIG. 2. The interlayer 61 is preferably formed of a CoFe alloy or a Co alloy. More preferably the interlayer 61 is formed of a CoFe alloy.

In the magnetic sensing element shown in FIG. 2, the ferromagnetic layer 17 is magnetized in the track width direction opposite to the X direction by magnetic coupling (exchange coupling) with the second antiferromagnetic layer 19. The free magnetic layer 15 lying below the ferromagnetic layer 17 with the nonmagnetic interlayer 16 is magnetized in the track width direction (X direction in the drawing) by the RKKY interaction with the ferromagnetic layer 17. That is, the ferromagnetic layer 17, the nonmagnetic interlayer 16, and the free magnetic layer 15 has a synthetic ferrimagnetic structure below the second antiferromagnetic layer 19 in the end regions D in the track width direction. As a result, the magnetization of the free magnetic layer 15 can be readily oriented in the track width direction.

When at least one of the free magnetic layer 15 and the ferromagnetic layer 17 is formed of a CoFeNi alloy in this embodiment in which the interlayer 61 is provided between the free magnetic layer 15 and the nonmagnetic conductive layer 14, the CoFeNi alloy preferably has an Fe content in the range of about 7 to about 15 atomic percent and a Ni content in the range of about 5 to about 15 atomic percent, the balance being Co. The exchange coupling magnetic field by the RKKY interaction between the free magnetic layer 15 and the ferromagnetic layer 17 can thereby be increased. In detail, the spin-flop magnetic field $H_{sf}$, which is a magnetic field when the antiparallel arrangement is disordered, can be increased to about 293 kA/m. The magnetizations of the free magnetic layer 15 and the ferromagnetic layer 17 can thereby be pinned in an antiparallel arrangement at both ends thereof, thus suppressing side reading.

Preferably, both the free magnetic layer 15 and the ferromagnetic layer 17 are formed of the above-described CoFeNi alloy to yield a higher spin-flop magnetic field.

The free magnetic layer 15 and the ferromagnetic layer 17 having the above-mentioned composition exhibit a magnetostriction in the range of about $-3 \times 10^{-6}$ to about $3 \times 10^{-6}$ and a coercive force of about 790 A/m or less. Moreover, the free magnetic layer 15 has improved soft magnetic characteristics.

In the magnetic sensing element shown in FIG. 2, the nonmagnetic interlayer 16 functions as a protective layer for the free magnetic layer 15 in the track width region E. Moreover, a nonmagnetic interlayer 16 formed of a conductive material also functions as a back layer.

FIGS. 23 to 27 are cross-sectional views, as seen from a face opposing a recording medium, showing a method for making the magnetic sensing element in accordance with the present invention.

Figure 23:
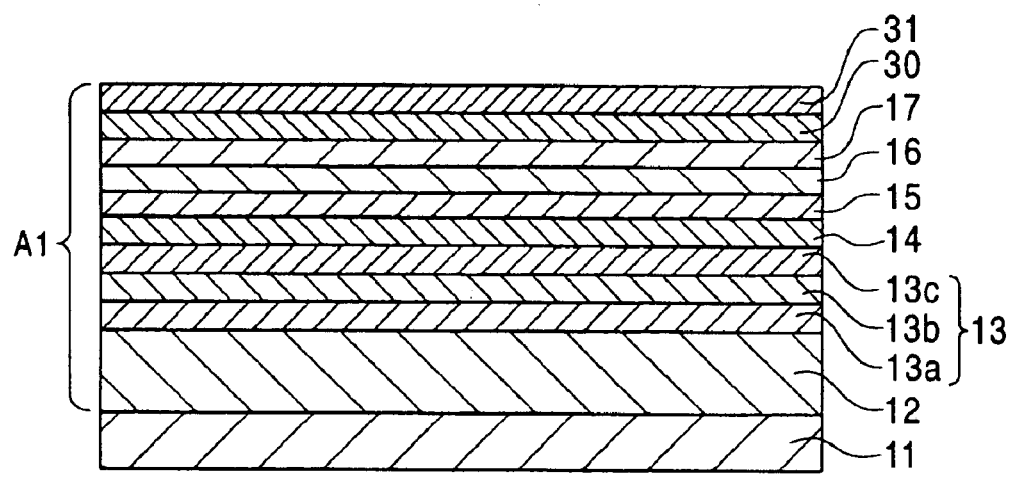
FIG. 23 is a cross-sectional view showing a step of a method for making a magnetic sensing element according to a twelfth embodiment of the present invention.

Referring to FIG. 23, a first antiferromagnetic layer 12 is formed on a substrate 11. Next, a pinned magnetic layer 13 of a synthetic ferripinned type including a first pinned magnetic sublayer 13a, a nonmagnetic intermediate sublayer 13b, and a second pinned magnetic sublayer 13c is deposited on the first antiferromagnetic layer 12. A nonmagnetic conductive layer 14, a free magnetic layer 15, a nonmagnetic interlayer 16, a ferromagnetic layer 17, a nonmagnetic layer 30, and a third antiferromagnetic layer 31 are sequentially deposited on the pinned magnetic layer 13 to form a laminate A1.

The first antiferromagnetic layer 12, the pinned magnetic layer 13, the nonmagnetic conductive layer 14, the free magnetic layer 15, the nonmagnetic interlayer 16, the ferromagnetic layer 17, the nonmagnetic layer 30, and the third antiferromagnetic layer 31 may be deposited by a thin-film deposition process, for example, a sputtering or evaporating process, in the same vacuum deposition chamber.

The first antiferromagnetic layer 12 and the third antiferromagnetic layer 31 are formed of a PtMn alloy, an XMn alloy, or a Pt—Mn—X' alloy, where X is at least one metal selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The first antiferromagnetic layer 12 and the third antiferromagnetic layer 31 composed of the above alloy are annealed to generate a large exchange coupling magnetic field. When a PtMn alloy is used, the first antiferromagnetic layer 12 and the third antiferromagnetic layer 31 generate a large exchange coupling magnetic field of at least about 48 kA/m and particularly exceeding about 64 kA/m and a high blocking temperature of about 380° C., wherein the blocking temperature means a temperature at which the exchange coupling magnetic field disappears.

These alloys have a disordered face centered cubic (fcc) structure after the formation of the laminate. This structure is transformed into a CuAuI-type ordered face centered tetragonal (fct) structure by annealing.

The thickness of the first antiferromagnetic layer 12 is in the range of about 80 Å to about 300 Å, in the center in the track width direction. The thickness of the third antiferromagnetic layer 31 is about 30 Å, which does not generate an exchange coupling magnetic field by annealing.

The first pinned magnetic sublayer 13a and the second pinned magnetic sublayer 13c are formed of ferromagnetic materials, for example. NiFe alloys, elemental cobalt, CoNiFe alloys, CoFe alloys, and CoNi alloys. These layers are preferably formed of NiFe alloys and elemental Co. The first pinned magnetic sublayer 13a and the second pinned magnetic sublayer 13c are preferably composed of the same material.

The nonmagnetic intermediate sublayer 13b is formed of at least one nonmagnetic material selected from Ru, Rh, Ir, Cr, Re, and Cu. Among these, Ru is preferable.

The nonmagnetic conductive layer 14 which prevents magnetic coupling and which conducts a sensing current is preferably formed of a nonmagnetic conductive material, for example, Cu, Cr, Au, or Ag. Among these, Cu is more preferable.

The free magnetic layer 15 and the ferromagnetic layer 17 are generally formed of ferromagnetic materials, for example, NiFe alloys, elemental cobalt, CoNiFe alloys, CoFe alloys, and CoNi alloys. These layers are preferably formed of NiFe alloys and elemental Co. The free magnetic layer 15 and the ferromagnetic layer 17 are preferably composed of the same material.

The nonmagnetic layer 30 is formed of Ru and has a thickness in the range of about 8 to about 11 Å. The nonmagnetic layer 30 may be formed of at least one nonmagnetic material selected from Ru, Cu, Ag, and Au.

The laminate A1 is annealed in a first magnetic field oriented in the Y direction at a first annealing temperature to pin the magnetization of the pinned magnetic layer 13 in the Y direction by an exchange coupling magnetic field generated between the first antiferromagnetic layer 12 and the pinned magnetic layer 13. In this embodiment, the first annealing temperature is about 270° C. and the magnitude of the first magnetic field is about 800 kA/m.

Herein, the thickness of the third antiferromagnetic layer 31 is about 30 Å. The third antiferromagnetic layer 31 does not undergo disordered-to-ordered transformation during annealing in the first magnetic field. Thus, no exchange coupling magnetic field is generated by the third antiferromagnetic layer 31. As a result, the magnetization of the ferromagnetic layer 17 and the magnetization of the free magnetic layer 15 are not fixed in the Y direction.

During the annealing of the laminate A in the first magnetic field, a surface of the third antiferromagnetic layer 31 is oxidized to a thickness of about 10 Å to about 20 Å. The oxidized surface of the third antiferromagnetic layer 31 is then etched away by ion milling. Since the third antiferromagnetic layer 31 is provided as the uppermost layer on the laminate A1 in this embodiment, the nonmagnetic layer 30 and the ferromagnetic layer 17 are not oxidized. In the present invention, the oxidized surface formed during the annealing in the first magnetic field may be removed by ion milling without depositing the third antiferromagnetic layer 31 on the nonmagnetic layer 30.

Figure 24:
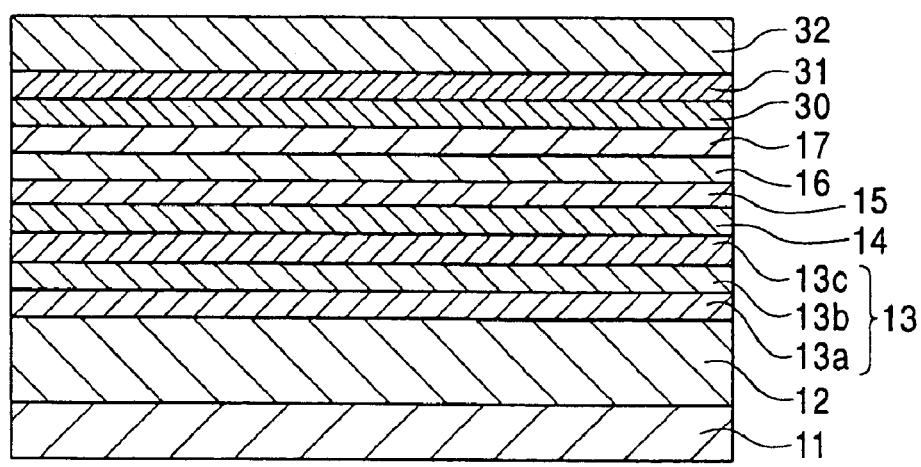
FIG. 24 is a cross-sectional view showing a step subsequent to the step shown in FIG. 23.

Referring to FIG. 24, a second antiferromagnetic layer 32 is formed on the laminate A1 (hereinafter, the resulting laminate including the second antiferromagnetic layer 32 is referred to as a laminate B).

In similarity to the first antiferromagnetic layer 12, the second antiferromagnetic layer 32 is formed of a PtMn alloy, an X—Mn alloy, or a Pt—Mn—X' alloy, where X is at least one metal selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The thickness of the second antiferromagnetic layer 32 is in the range of about 80 Å to about 300 Å and preferably about 200 Å in the center of the laminate A in the track width direction.

In the PtMn alloy and the X—Mn alloy used to form the second antiferromagnetic layer 32, the Pt content and the X content are preferably in the range of about 37 to about 63 atomic percent and, more preferably, in the range of about 47 to about 57 atomic percent.

In the Pt—Mn—X' alloy, the X'+Pt content is preferably in the range of about 37 to about 63 atomic percent and, more preferably, in the range of about 47 to about 57 atomic percent. Moreover, the X' content is preferably in the range of about 0.2 to about 10 atomic percent. When X' is at least one element selected from Pd, Ir, Rh, Ru, Os, Ni, and Fe, the X' content is preferably in the range of about 0.2 to about 40 atomic percent.

A second antiferromagnetic layer 32, formed of an alloy having the above-described optimized composition and once annealed, can generate a large exchange coupling magnetic field among the second antiferromagnetic layer 32, the third antiferromagnetic layer 31, and the ferromagnetic layer 17. In particular, a second antiferromagnetic layer 32 formed of a PtMn alloy exhibits a large exchange coupling magnetic field of about 48 kA/m or more, for example, about 64 kA/m, by magnetic coupling with the ferromagnetic layer and a significantly high blocking temperature of about 380° C.

This alloy has a disordered fcc structure after the deposition and this structure is transformed into a CuAuI-type ordered fct structure.

In the magnetic sensing element in this embodiment, the first antiferromagnetic layer 12 and the second antiferromagnetic layer 32 may be composed of the same antiferromagnetic material. The second antiferromagnetic layer 32 may be covered with a protective layer composed of a nonmagnetic material, such as Ta.

The laminate B is annealed in a second magnetic field oriented in the X direction at a second annealing temperature to pin the magnetization of the ferromagnetic layer 17 in the direction opposite to the X direction by an exchange anisotropic magnetic field generated by the RKKY interaction among the second antiferromagnetic layer 32, the third antiferromagnetic layer 31, and the ferromagnetic layer 17. The magnetization of the free magnetic layer 15 is fixed in the X direction by the RKKY interaction with the ferromagnetic layer 17 via the nonmagnetic interlayer 16. In this embodiment, the second annealing temperature is about 250° C. and the magnitude of the second magnetic field is about 24 kA/m.

The exchange anisotropic magnetic field by the third antiferromagnetic layer 31 and the second antiferromagnetic layer 32 is not generated until the laminate B is annealed in the second magnetic field. Thus, in the second annealing process, the second annealing temperature is set to be lower than the blocking temperature at which the exchange coupling magnetic field by the first antiferromagnetic layer 12 disappears, and the magnitude of the second magnetic field is set to be smaller than that of the exchange anisotropic magnetic field by the first antiferromagnetic layer 12. As a result, the exchange anisotropic magnetic field by the first antiferromagnetic layer 12 is fixed in the Y direction and the exchange anisotropic magnetic field by the second antiferromagnetic layer 32 is oriented in the X direction. Even when the first antiferromagnetic layer 12 and the second antiferromagnetic layer 32 are formed of the same material and annealed in the second magnetic field under the above conditions, the exchange anisotropic magnetic field by the second antiferromagnetic layer 32 can be oriented in the X direction while the exchange anisotropic magnetic field by the first antiferromagnetic layer 12 is fixed in the Y direction. In other words, the magnetization of the free magnetic layer 15 is readily oriented in a direction that is substantially orthogonal to the magnetization direction of the pinned magnetic layer 13.

Figure 25:
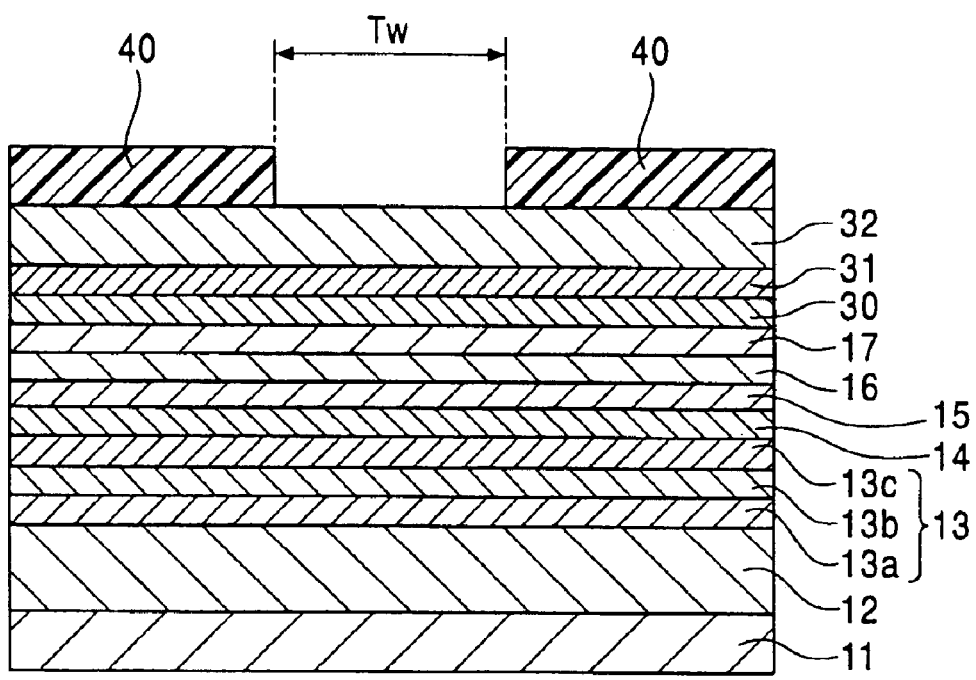
FIG. 25 is a cross-sectional view showing a step subsequent to the step shown in FIG. 24.

Referring to FIG. 25, the second antiferromagnetic layer 32 is masked with resist layers 40 deposited thereon, such that an opening having the track width Tw is formed on the second antiferromagnetic layer 32.

Figure 26:
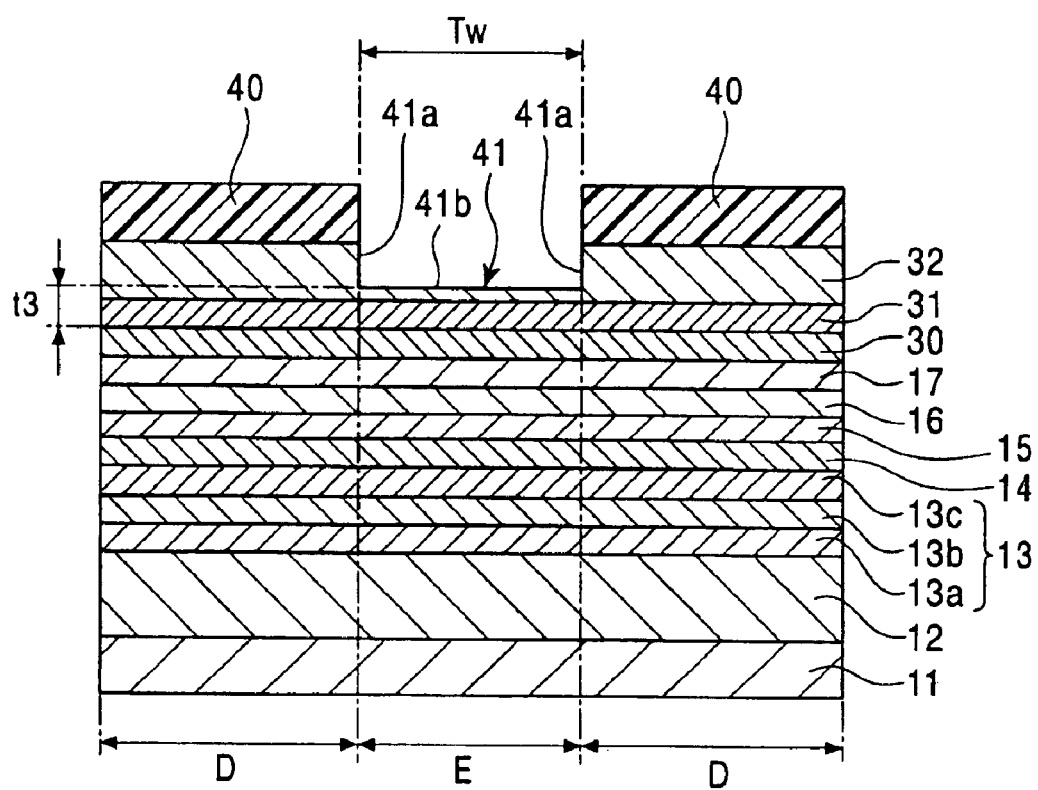
FIG. 26 is a cross-sectional view showing a step subsequent to the step shown in FIG. 25.

Referring to FIG. 26, the unmasked portion of the second antiferromagnetic layer 32 in the opening is etched in the vertical direction relative to the surface of the substrate 11, namely, to the track width direction (X direction in the drawing) by ion milling or RIE to form a recess 41, which defines a track width region E. The recess 41 has side faces 41a that are perpendicular to the track width direction. In this drawing, the bottom face 41b of the recess 41 lies in the second antiferromagnetic layer 32. Alternatively, the bottom face 41b may lie in the third antiferromagnetic layer 31.

Herein, the total thickness t3 of the second antiferromagnetic layer 32 below the recess 41 and the third antiferromagnetic layer 31 is not more than about 30 Å. Within such a thickness, the second antiferromagnetic layer 32 below the recess 41 and the third antiferromagnetic layer 31 do not undergo disordered-to-ordered transformation during annealing in the second magnetic field. Thus, no exchange coupling magnetic field is generated in the second antiferromagnetic layer 32 and the third antiferromagnetic layer 31 below the recess 41.

On the other hand, the magnetization direction of the ferromagnetic layer 17 is fixed only in the end regions D in the track width direction by the RKKY interaction with the second antiferromagnetic layer 32 and the third antiferromagnetic layer 31 via the nonmagnetic interlayer 16. Thus, the magnetization direction of the free magnetic layer 15 lying below the ferromagnetic layer 17 with the nonmagnetic interlayer 16 is also fixed only in the end regions D by the RKKY interaction with the ferromagnetic layer 17.

When no external magnetic field is applied, the magnetization of the free magnetic layer 15 in the track width region E is oriented in the X direction by the effects of the pinned magnetizations in the end regions D. When an external magnetic field is applied, the magnetization direction of the free magnetic layer 15 changes. Thus, the track width of the magnetic sensing element is determined by the width Tw of the recess 41.

In this embodiment, the recess 41 can be readily formed by milling the second antiferromagnetic layer 32 or the second and third antiferromagnetic layers 32 and 31, each having a uniform thickness in the vertical direction, by RIE or ion milling, as described above. Thus, the recess 41 has a precise track width Tw. Accordingly, the track width Tw of the magnetic sensing element can be precisely defined.

Figure 27:
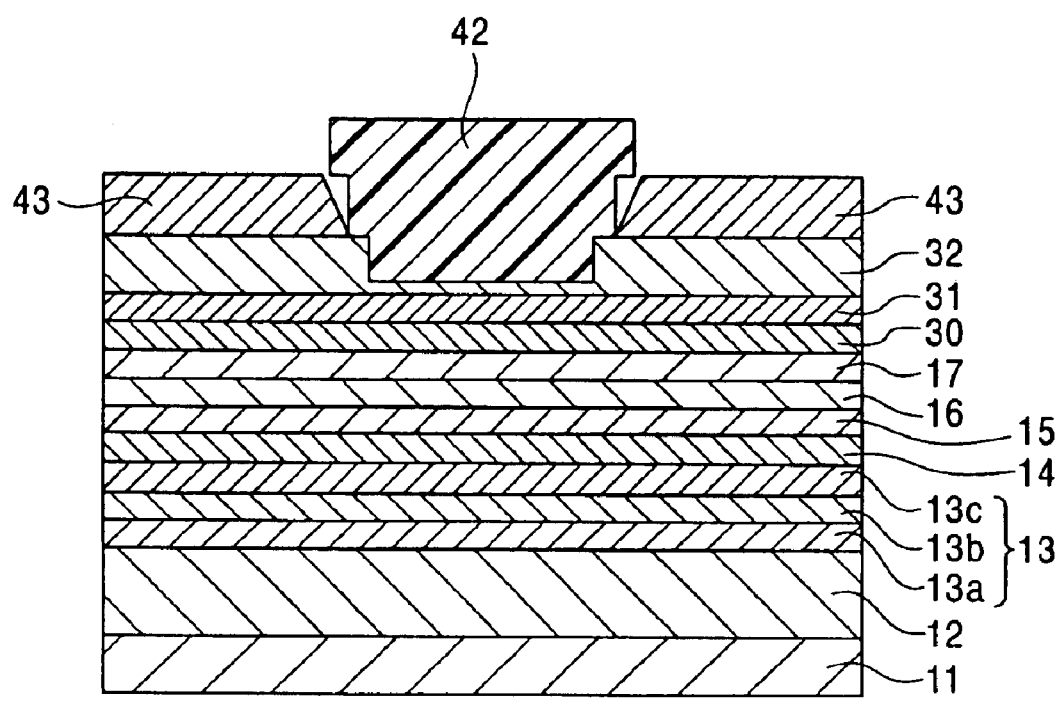
FIG. 27 is a cross-sectional view showing a step subsequent to the step shown in FIG. 26.

Referring to FIG. 27, after the resist layers 40 are removed, a lift-off resist layer 42 is formed on the second antiferromagnetic layer 32 so as to cover a region that is wider than the width (track width Tw) of the recess 41. Electrode layers 43 are deposited on the uncovered regions of the second antiferromagnetic layer 32 by sputtering or evaporation. The electrode layers 43 are formed of, for example, Au, W, Cr, or Ta. Next, the lift-off resist layer 42 is removed to prepare a magnetic sensing element shown in FIG. 28.

The magnetic sensing element formed according to this embodiment has steps along the track width direction between the electrode layers 43 and the recess 41. The second antiferromagnetic layer 32 and the electrode layers 43 may be separated by protective layers composed of, for example, Ta or Cr.

In this embodiment, the resist layers 40 are deposited on the second antiferromagnetic layer 32, the recess 41 is formed on the second antiferromagnetic layer 43, and then the electrode layers 43 are deposited on the second antiferromagnetic layer 32. Alternatively, the following procedure may be employed. An electrode layer is deposited on the second antiferromagnetic layer 32, a pair of resist layers is deposited on the electrode layer at a distance corresponding to the track width in the track width direction, and then a recess is formed through the electrode layer and the second antiferromagnetic layer 32.

The annealing in the second magnetic field may be performed after the recess 41 is formed on the second antiferromagnetic layer 32 or after the recess 41 is formed on the third antiferromagnetic layer 31 through the second antiferromagnetic layer 32.

In this embodiment, the first antiferromagnetic layer 12 is directly formed on the substrate 11. Alternatively, the first antiferromagnetic layer 12 may be formed on an underlayer, composed of alumina, Ta, or the like, which is formed on the substrate 11.

In the formation of the laminate A1, an antidiffusion layer composed Co or the like may be formed between the free magnetic layer 15 and the nonmagnetic conductive layer 14. The antidiffusion layer prevents interdiffusion between the free magnetic layer 15 and the nonmagnetic conductive layer 14. Moreover, another antidiffusion layer, composed of Co or the like, may be formed between the second pinned magnetic sublayer 13c and the nonmagnetic conductive layer 14 to prevent interdiffusion therebetween.

The free magnetic layer 15 and the ferromagnetic layer 17 have different magnetic moments per unit area. The magnetic moment per unit area is represented by the product of the saturation magnetization $M_s$ and the thickness t. For example, the free magnetic layer 15 and the ferromagnetic layer 17 are formed using the same material so that the thicknesses are different from each other. Accordingly, magnitudes of the magnetic moments per unit area are different from each other.

When the free magnetic layer 15 and the nonmagnetic conductive layer 14 are separated by the antidiffusion layer, the sum of the magnetic moments per unit area of the free magnetic layer 15 and the antidiffusion layer is preferably different from the magnetic moment per unit area of the ferromagnetic layer 17.

Figure 28:
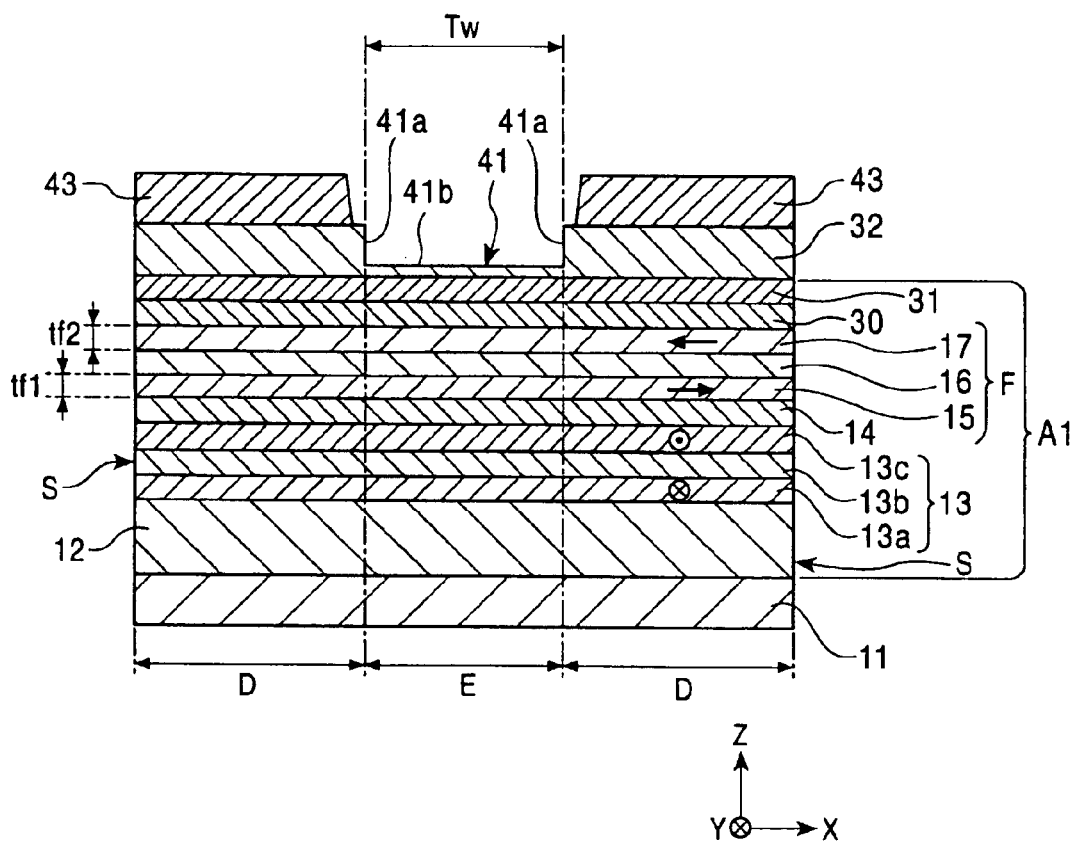
FIG. 28 is a cross-sectional view of a magnetic sensing element made by the method of the twelfth embodiment of the present invention viewed from the side opposing a recording medium.

Referring to FIG. 28, in the magnetic sensing element formed by the above-described process, the bottom face 41b of the recess 41 lies in the second antiferromagnetic layer 32. Thus, the magnetic sensing element exhibits a ferrimagnetic state in which the magnetization direction of the free magnetic layer 15 and the magnetization direction of the ferromagnetic layer 17 separated by the nonmagnetic interlayer 16 are antiparallel to each other. Herein, the multilayer structure including the free magnetic layer 15, the nonmagnetic interlayer 16, and the ferromagnetic layer 17 functions as one free magnetic layer, namely, a synthetic ferrimagnetic free layer F. The effect of the synthetic ferrimagnetic free layer F is equivalent to that achieved by a reduction in the thickness of the free magnetic layer 15 for facilitating a variation in magnetization of the free magnetic layer 15. Thus, the magnetic sensing element exhibits enhanced sensitivity to a magnetic field.

The sum of the magnetic moment of the free magnetic layer 15 and the magnetic moment of the ferromagnetic layer 17 is equal to the magnetization direction of the synthetic ferrimagnetic free layer F.

Herein, only the magnetization direction of the free magnetic layer 15 contributes to the output in connection with the magnetization direction of the pinned magnetic layer 13.

When the magnetic moment per unit area of the free magnetic layer 14 is different from that of the ferromagnetic layer 17, the spin-flop magnetic field $H_{sf}$ of the synthetic ferrimagnetic free layer F becomes large. Thus, the synthetic ferrimagnetic free layer F exhibits the ferrimagnetic state over a wide range of magnitude of magnetic field. Thus, the ferrimagnetic state of the synthetic ferrimagnetic free layer F becomes more stable.

The thickness tf2 of the ferromagnetic layer 17 is preferably in the range of about 0.5 to about 2.5 nm. The thickness tF1 of the free magnetic layer 15 is preferably in the range of about 2.5 to about 4.5 nm and, more preferably, in the range of about 3.0 to about 4.0 nm and, most preferably, in the range of 3.5 to 4.0 nm. Outside of the above range, the spin-valve magnetic sensing element does not exhibit a large rate of change in resistance.

In the magnetic sensing element shown in FIG. 28, the second antiferromagnetic layer 32, which functions as a longitudinal bias layer, has a thickness which is sufficient to generate antiferromagnetism over the entire regions (end regions D) other than the track width region E, so that the magnetizations of the ferromagnetic layer 17 and the free magnetic layer 15 are firmly fixed in the end regions D. In this embodiment, the magnetization of the ferromagnetic layer 17 is oriented by the RKKY interaction between the second antiferromagnetic layer 32 and the third antiferromagnetic layer 31, as described above. This configuration exhibits a larger coupling force than a configuration in which the second antiferromagnetic layer 32 and the third antiferromagnetic layer 31 are in direct contact with the ferromagnetic layer 17.

In the region E, the magnetizations of the free magnetic layer 15 and the ferromagnetic layer 17 below the bottom face 41b of the recess 41 are oriented in the X direction by the fixed magnetizations of the end regions D, when no external magnetic field is applied. The magnetization direction of the free magnetic layer 15 varies with the external magnetic field. Thus, the track width of the magnetic sensing element is determined by the width Tw of the recess 41, and side reading at regions other than the track width Tw is prevented.

The antiferromagnetic coupling between the second and third antiferromagnetic layers 32 and 31 and the ferromagnetic layer 17 acts only in the end regions D, which lie outside the bottom face 41b of the recess 41 in the track width direction, and does not act in the track width region E below the bottom face 41b.

Thus, the track width region E, having the track width Tw corresponding to the width of the recess 41 in the second antiferromagnetic layer 32, is a sensitive region having a magnetoresistive effect that substantially contributes to reading the recording magnetic field. Since the track width region E, having the track width Tw (optical track width), includes no insensitive region, the magnetic sensing element exhibits high reading output even when the optical track width Tw is decreased to meet higher recording density.

Moreover, side faces S of the magnetic sensing element are perpendicular to the track width direction according to the method of this embodiment. Thus, the free magnetic layer 15 has a uniform thickness in the track width direction.

In the step shown in FIG. 23, the first pinned magnetic sublayer 13a and the second pinned magnetic sublayer 13c are formed such that the magnitudes of the magnetic moments per unit thereof are different from each other. Thus, the laminate including the first pinned magnetic sublayer 13a and the second pinned magnetic sublayer 13c, separated by the nonmagnetic intermediate sublayer 13b, functions as one pinned magnetic layer 13.

The first pinned magnetic sublayer 13a is in contact with the first antiferromagnetic layer 12. An exchange anisotropic magnetic field is generated at the interface between the first pinned magnetic sublayer 13a and the first antiferromagnetic layer 12 during annealing in a magnetic field to pin the magnetization of the first pinned magnetic sublayer 13a in the Y direction in the drawing. As a result, the magnetization of the second pinned magnetic sublayer 13c opposing the first pinned magnetic sublayer 13a thorough the nonmagnetic intermediate sublayer 13b is pinned in the opposite direction to the Y direction.

The sum (synthetic magnetic moment) of the magnetic moment of the first pinned magnetic sublayer 13a and the magnetic moment of the second pinned magnetic sublayer 13c is equal to the magnetization direction of the pinned magnetic layer 13.

As described above, the magnetization direction of the first pinned magnetic sublayer 13a and the magnetization direction of the second pinned magnetic sublayer 13c are antiparallel to each other and are in a ferrimagnetic state. Since the first pinned magnetic sublayer 13a and the second pinned magnetic sublayer 13c mutually pin the magnetization directions thereof, the overall magnetization of the pinned magnetic layer 13 is firmly pinned in one direction.

The first pinned magnetic sublayer 13a and the second pinned magnetic sublayer 13c are formed of ferromagnetic materials, such as NiFe alloys, elemental Co, CoNiFe alloys, CoFe alloys, and CoNi alloys. Among these, NiFe alloys and elemental Co are preferred. Preferably, the first pinned magnetic sublayer 13a and the second pinned magnetic sublayer 13c are formed of the same material.

In FIG. 28, the first pinned magnetic sublayer 13a and the second pinned magnetic sublayer 13c are formed of the same material and have different thicknesses so as to have different magnetic moments per unit area.

The nonmagnetic intermediate sublayer 13b is formed of at least one nonmagnetic metal selected from Ru, Rh, Ir, Cr, Re, and Cu. Among these, Ru is preferable.

As described above, the pinned magnetic layer 13 is a laminate of the first pinned magnetic sublayer 13a, the nonmagnetic intermediate sublayer 13b, and the second pinned magnetic sublayer 13c; hence, the first pinned magnetic sublayer 13a and the second pinned magnetic sublayer 13c mutually pin the magnetization directions thereof. As a result, the overall magnetization of the pinned magnetic layer 13 is firmly pinned in one direction. For example, a large exchange coupling magnetic field $H_{ex}$ of about 80 to about 160 kA/m is generated between the first antiferromagnetic layer 12 and the pinned magnetic layer 13. Thus, by annealing in the first magnetic field for orienting the magnetization of the first pinned magnetic sublayer 13a in contact with the first antiferromagnetic layer 12 in the height direction, and then by annealing in the second magnetic field in the track width direction, a large longitudinal bias magnetic field by the second antiferromagnetic layer 32 is generated without orientation of the magnetization of the pinned magnetic layer 13 in the track width direction.

In this embodiment, demagnetizing fields (dipole magnetic field) $H_d$ due to the pinned magnetization of the pinned magnetic layer 13 counteract each other by magnetostatic coupling between the first pinned magnetic sublayer 13a and the second pinned magnetic sublayer 13c. As a result, contribution of the demagnetizing fields by the pinned magnetization of the pinned magnetic layer 13 to the variable magnetization of the free magnetic layer 15 is moderated.

Accordingly, the variable magnetization of the free magnetic layer 15 can be readily oriented in a desired direction, and the resulting spin-valve magnetic sensing element can output highly symmetrical signals (reduced asymmetry).

If the pinned magnetic layer 13 has a single layer structure, the demagnetizing field (dipole magnetic field) $H_d$ by the pinned magnetization of the pinned magnetic layer 13 does not exhibit a uniform distribution in the height direction of the element; the demagnetizing field is high at the ends and low in the center. Such nonuniformity may preclude a single-domain alignment in the free magnetic layer 15. In this embodiment, the pinned magnetic layer 13 has the above-described layered structure; hence, the demagnetizing field $H_d$ is substantially zero. Since magnetic nonuniformity due to magnetic walls does not occur in the free magnetic layer 15, no Barkhausen noise occurs.

Moreover, the nonmagnetic interlayer 30 formed of a conductive material also functions as a back layer having a spin filter effect.

In this embodiment, the third antiferromagnetic layer 31 may be formed as a specular reflection layer. In such a case, the third antiferromagnetic layer 31 may have a single- or multi-layer configuration composed of, for example, a met-alloid Heusler alloy, such as, NiMnSb or PtMnSb. This material forms a sufficiently high potential barrier to the adjoining layer, resulting in a high specular reflection effect.

The specular reflection effect will now be described with reference to FIGS. 37 and 38. As described above, the GMR effect is determined only by the behavior of the spin-up electrons. Referring to FIG. 38, in a state in which the magnetization direction of the pinned magnetic layer and the magnetization direction of the free magnetic layer are parallel to each other, the spin-up electrons enter the free magnetic layer 115 through the nonmagnetic conductive layer 114, move in the free magnetic layer 115, and reach the interface between the free magnetic layer 115 and the specular reflection layer S1.

Figure 37:
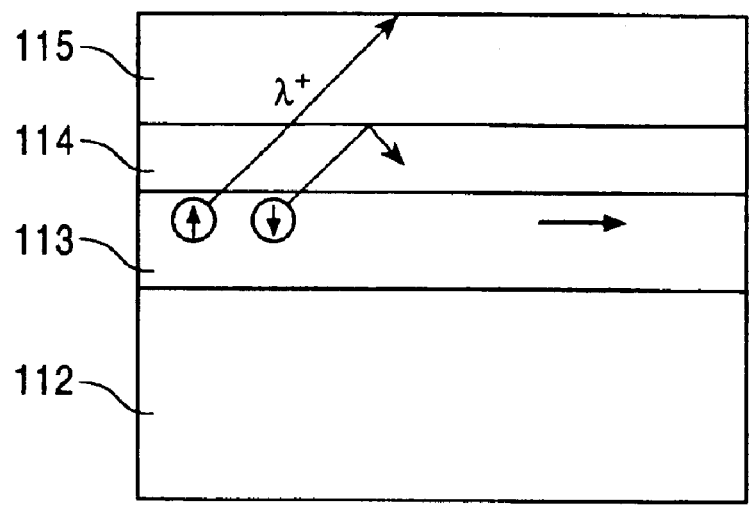
FIG. 37 is a schematic diagram for explaining a specular reflection effect using a specular reflection layer.
Figure 38:
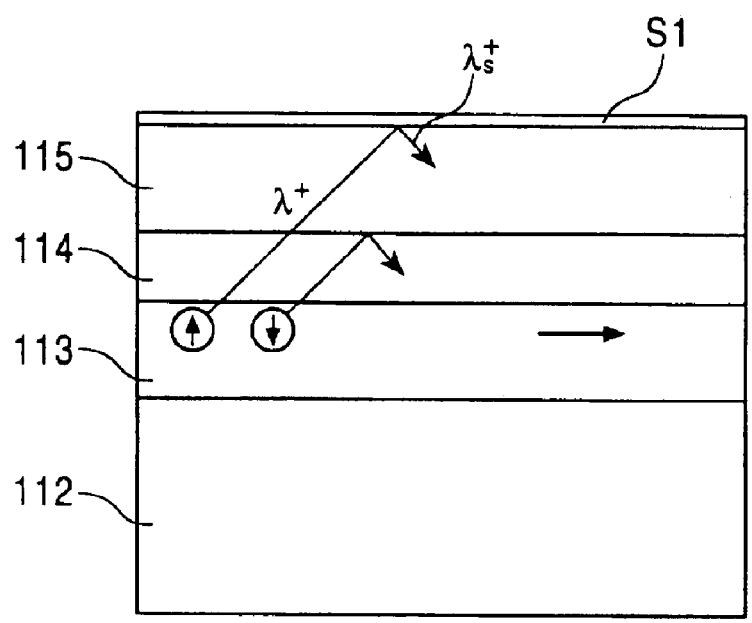
FIG. 38 is a schematic diagram for explaining the specular reflection effect using the specular reflection layer.

If no specular reflection layer is provided as shown in FIG. 37, the spin-up electrons move in the free magnetic layer 115 and are scattered at the upper face thereof. In this case, the mean free path of the spin-up electrons is $\lambda+$, as shown in the drawing.

In contrast, as shown in FIG. 38, the specular reflection layer S1 is provided, a potential barrier is formed at the interface between the free magnetic layer 115 and the specular reflection layer S1. Thus, the spin-up electrons are reflected at the interface (specular reflection or specular scattering).

In general, the spin states such as energy and quantum state of the conduction electrons vary by scattering. In the specular reflection, however, the spin-up electrons have a high probability of reflection with conservation of the spin state. As a result, the spin-up electrons move in the free magnetic layer as if these are not scattered therein.

This means that the mean free path of the spin-up electrons increases by the reflected mean free path $\lambda+_s$ as a result of the specular reflection.

In a state in which the magnetization direction of the pinned magnetic layer and the magnetization direction of the free magnetic layer are antiparallel to each other, the spin of the spin-up electrons are not parallel to the magnetization direction of the free magnetic layer 115 and thus the spin-up electrons are scattered in the vicinity of the interface between the free magnetic layer 115 and the nonmagnetic metal layer 114. As a result, the mean free path of the spin-up electrons distinctly decreases, resulting in an increase in resistance. The rate of change in resistance has a positive correlation with the change in the effective mean free path of the spin-up electrons.

Since the third antiferromagnetic layer 31 functions as a specular reflection layer in this embodiment, the mean free path of the spin up conduction electrons is elongated. Thus, the spin-valve magnetic sensing element has a large rate of change in mean free path of spin-up electrons by an applied external magnetic field and thus a large rate of change in resistance ($\Delta R/R$) by magnetism.

The increase in difference in the mean free path between the spin-up electrons and the spin-down electrons by the spin filter effect and the specular reflection effect is noticeable when the thickness of the free magnetic layer is relatively small.

Referring to FIG. 28, when a stationary current flows in the synthetic ferrimagnetic free layer F, the nonmagnetic conductive layer 14, and the pinned magnetic layer 13 via the electrode layers 43 in a leakage magnetic field in the Y direction from a recording magnetic medium which moves in the Z direction, the magnetization of the free magnetic layer 15 of the synthetic ferrimagnetic free layer F changes from the X direction toward the Y direction. The electric resistance changes by the correlation between the variable magnetization of the free magnetic layer 15 and the pinned magnetization of the second pinned magnetic sublayer 13c, and the leakage magnetic field from the magnetic recording medium is detected as a change in voltage in response to such a change in resistance.

In the step shown in FIG. 15, the recess 41 is formed such that the bottom face 41b lies in the second antiferromagnetic layer 32. In the present invention, the bottom face 41b may lie in the ferromagnetic layer 17, as shown in FIG. 29.

Figure 29:
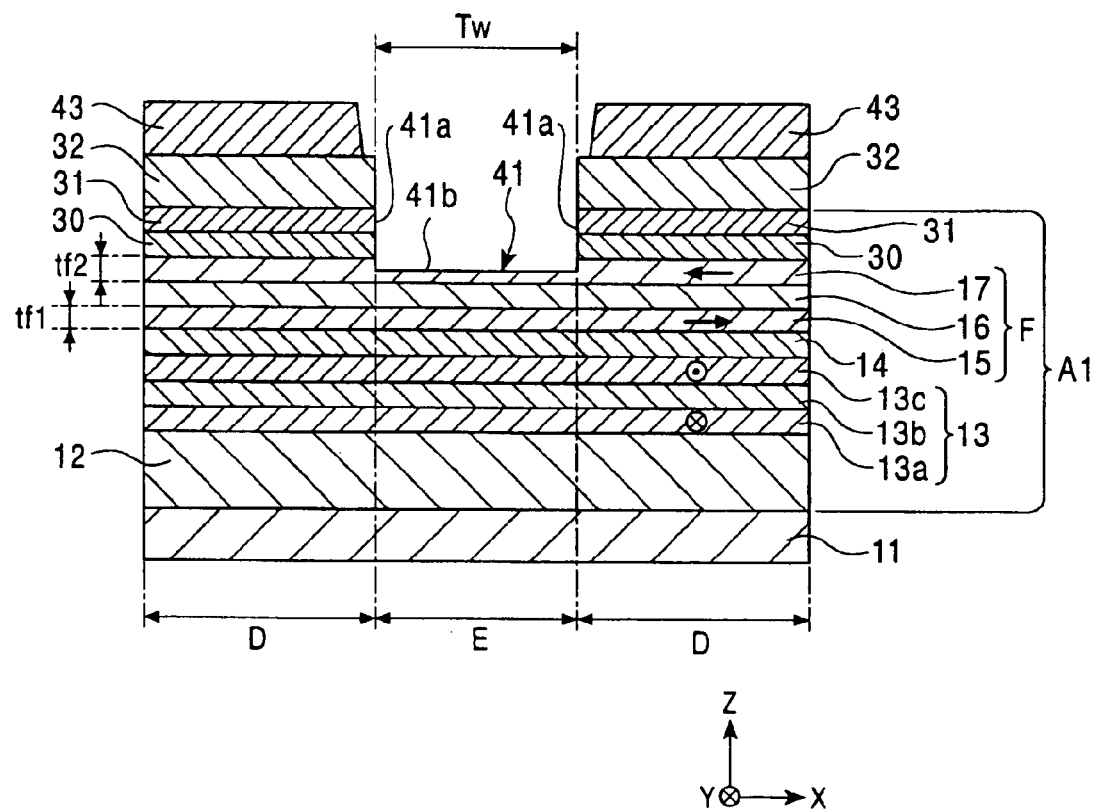
FIG. 29 is a cross-sectional view of a magnetic sensing element made by a method according to a thirteenth embodiment of the present invention.

In the magnetic sensing element shown in FIG. 29, the second antiferromagnetic layer 32 and the third antiferromagnetic layer 31 are completely removed in the region with the track width Tw. Thus, the second antiferromagnetic layer 32 and the third antiferromagnetic layer 31 (longitudinal bias layers) will not remain on the bottom face 41b of the recess 41, if the second antiferromagnetic layer 32 and the third antiferromagnetic layer 31 have nonuniform thicknesses. Since the longitudinal bias layers are not present on the bottom face 41b of the recess 41, the track width Tw can be precisely defined. Thus, the resulting spin-valve magnetic sensing element is suitable for higher recording density. The second antiferromagnetic layer 32 and the third antiferromagnetic layer 31 can be readily removed.

Alternatively, the recess 41 may be formed such that the bottom face 41b thereof lies in the nonmagnetic interlayer 16, as shown in FIG. 3.

In the magnetic sensing element shown in FIG. 3, the magnetization of the ferromagnetic layer 17 is fixed in the track width direction (opposite direction to the X direction) by the RKKY interaction with the second antiferromagnetic layer 32 and the third antiferromagnetic layer 31, which lie on the nonmagnetic layer 30, and the magnetization of the free magnetic layer 15 below the ferromagnetic layer 17, with the nonmagnetic interlayer 16 therebetween, is oriented in the track width direction (X direction) by the RKKY interaction with the ferromagnetic layer 17. That is, the ferromagnetic layer 17, the nonmagnetic interlayer 16, and the free magnetic layer 15 have a synthetic ferrimagnetic structure below the second antiferromagnetic layer 32 in the end regions D in the track width direction. As a result, the magnetization of the free magnetic layer 15 can be readily oriented in the track width direction.

Even if the RKKY interaction between the second and third antiferromagnetic layers 32 and 33 and the ferromagnetic layer 17 is relatively weak, the magnetization of the free magnetic layer 15 can be oriented in a direction that is substantially perpendicular to the magnetization direction of the pinned magnetic layer 13.

In the magnetic sensing element shown in FIG. 29, the nonmagnetic interlayer 16 functions as a protective layer for the free magnetic layer 15 in the track width region E. Moreover, a nonmagnetic interlayer 16 formed of a conductive material also functions as a back layer.

In the step shown in FIG. 23, the following procedure may be employed. After depositing the ferromagnetic layer 17, the third antiferromagnetic layer 31 is directly formed on the ferromagnetic layer 17 to form a multilayer composite A2, without providing the nonmagnetic layer 30. The multilayer composite A2 is annealed in the first magnetic field, and the second antiferromagnetic layer 32 is formed on the multiyear composite A2 to form the magnetic sensing element shown in FIG. 4.

In the magnetic sensing element shown in FIG. 4, the third antiferromagnetic layer 31 and the second antiferromagnetic layer 32 are deposited on the ferromagnetic layer 17. Thus, the ferromagnetic layer 17 is magnetized in the opposite direction to the X direction by exchange coupling with the third antiferromagnetic layer 31 and the second antiferromagnetic layer 32.

The magnetization of the free magnetic layer 15 formed below the ferromagnetic layer 17, with the nonmagnetic interlayer 16 therebetween, is oriented in the track width direction (X direction in the drawing). That is, the ferromagnetic layer 17, the nonmagnetic interlayer 16, and the free magnetic layer 15 have a synthetic ferrimagnetic structure below the second antiferromagnetic layer 32 and the third antiferromagnetic layer 31 in the end regions D in the track width direction. As a result, the magnetization of the free magnetic layer 15 can be readily oriented in the track width direction.

Even if the exchange coupling magnetic field between the second and third antiferromagnetic layers 32 and 31 and the ferromagnetic layer 17 is relatively weak, the magnetization of the free magnetic layer 15 can be oriented in a direction which is substantially perpendicular to the magnetization direction of the pinned magnetic layer 13.

The magnetization direction of the free magnetic layer 15 is fixed only in the end regions D in the track width direction by exchange magnetic coupling with the second antiferromagnetic layer 32 and the third antiferromagnetic layer 31.

When no external magnetic field is applied, the magnetization of the free magnetic layer 15 in the track width region E is oriented in the X direction by the effects of the pinned magnetizations in the end regions D. When an external magnetic field is applied, the magnetization direction of the free magnetic layer 15 changes.

In the magnetic sensing element shown in FIG. 4, the nonmagnetic interlayer 16 functions as a protective layer for the free magnetic layer 15 in the track width region E. Moreover, a nonmagnetic interlayer 16 formed of a conductive material also functions as a back layer.

In a process for depositing the third antiferromagnetic layer 31 without depositing the nonmagnetic layer 30 after the deposition of the free magnetic layer 15, the magnetization of the free magnetic layer 15 can be readily oriented in the direction that is substantially orthogonal to the magnetization direction of the pinned magnetic layer 13.

Even when the first antiferromagnetic layer 12 and the second antiferromagnetic layer 32 are formed of the same material, the exchange anisotropic magnetic field by the second antiferromagnetic layer 32 can be oriented in the X direction, while fixing the exchange anisotropic magnetic field by the first antiferromagnetic layer 12 in the Y direction, as in the ninth embodiment.

In the magnetic sensing element shown in FIG. 4, the recess 41 is formed such that the bottom face 41b lies in the nonmagnetic interlayer 16. In the present invention, the bottom face 41b may lie in the ferromagnetic layer 17, the third antiferromagnetic layer 31, or the 32. In such a case, the ferromagnetic layer 17, the nonmagnetic interlayer 16, and the free magnetic layer 15 function as a synthetic ferrimagnetic free layer.

In the step shown in FIG. 23, the following procedure may also be employed. After depositing the nonmagnetic layer 30, a multilayer composite A3 not having the third antiferromagnetic layer 31 is annealed in the first magnetic field, and the second antiferromagnetic layer 32 is deposited on the multilayer composite A3 to complete a magnetic sensing element shown in FIG. 5. Since an oxidized layer is formed on the nonmagnetic layer 30 during the annealing of the composite A3 in the first magnetic field, the oxidized layer formed on the nonmagnetic layer 30 must be removed by ion milling or the like before the second antiferromagnetic layer 32 is deposited.

In the magnetic sensing element shown in FIG. 5, the second antiferromagnetic layer 32 is deposited on the nonmagnetic layer 30. Thus, the magnetization of the ferromagnetic layer 17 is oriented in the opposite direction to the X direction in the drawing by the RKKY interact with the second antiferromagnetic layer 32.

The magnetization of the free magnetic layer 15 below the ferromagnetic layer 17 with the nonmagnetic interlayer 16 therebetween is oriented in the track width direction (X direction) by the RKKY interaction with the ferromagnetic layer 17. That is, the ferromagnetic layer 17, the nonmagnetic interlayer 16, and the free magnetic layer 15 have a synthetic ferrimagnetic structure below the second antiferromagnetic layer 32 in the end regions D in the track width direction. As a result, the magnetization of the free magnetic layer 15 can be readily oriented in the track width direction.

Even if the RKKY interaction between the second antiferromagnetic layer 32 and the ferromagnetic layer 17 is relatively weak, the magnetization of the free magnetic layer 15 can be oriented in a direction which is substantially perpendicular to the magnetization direction of the pinned magnetic layer 13.

The magnetization direction of the free magnetic layer 15 is fixed only in the both end regions D in the track width direction by exchange magnetic coupling with the second antiferromagnetic layer 32.

When no external magnetic field is applied, the magnetization of the free magnetic layer 15 in the track width region E is oriented in the X direction by the effects of the pinned magnetizations which are caused by the RKKY interaction with the second antiferromagnetic layer 32 in the end regions D. When an external magnetic field is applied, the magnetization direction of the free magnetic layer 15 changes.

In the magnetic sensing element shown in FIG. 5, the nonmagnetic interlayer 16 functions as a protective layer for the free magnetic layer 15 in the track width region E. Moreover, a nonmagnetic interlayer 16 formed of a conductive material also functions as a back layer.

In a process in which the third antiferromagnetic layer 31 is not deposited on the nonmagnetic layer 30, the magnetization of the free magnetic layer 15 can be readily oriented in a direction that is substantially orthogonal to the magnetization direction of the pinned magnetic layer 13.

When the first antiferromagnetic layer 12 and the second antiferromagnetic layer 32 are formed of the same material, the exchange anisotropic magnetic field by the second antiferromagnetic layer 32 can be oriented in the X direction, while fixing the exchange anisotropic magnetic field by the first antiferromagnetic layer 12 in the Y direction, as in the ninth embodiment.

In the magnetic sensing element shown in FIG. 5, the recess 41 is formed such that the bottom face 41b lies in the nonmagnetic interlayer 16. In the present invention, the bottom face 41b may lie in the ferromagnetic layer 17, the third antiferromagnetic layer 31, or the 32. In such a case, the ferromagnetic layer 17, the nonmagnetic interlayer 16, and the free magnetic layer 15 function as a synthetic ferrimagnetic free layer.

In the embodiment shown in FIGS. 14 to 19, the second antiferromagnetic layer 19 is deposited and is annealed in the second magnetic field and the resist layer is patterned on the second antiferromagnetic layer 19 to form the recess 21. Alternatively, the recess may be formed as follows. The second antiferromagnetic layer 19 is formed and is annealed in the second magnetic field, a pair of electrodes is formed on the second antiferromagnetic layer 19 at a distance in the track width direction, and the recess is formed using the electrode layers as masks.

Figure 30:
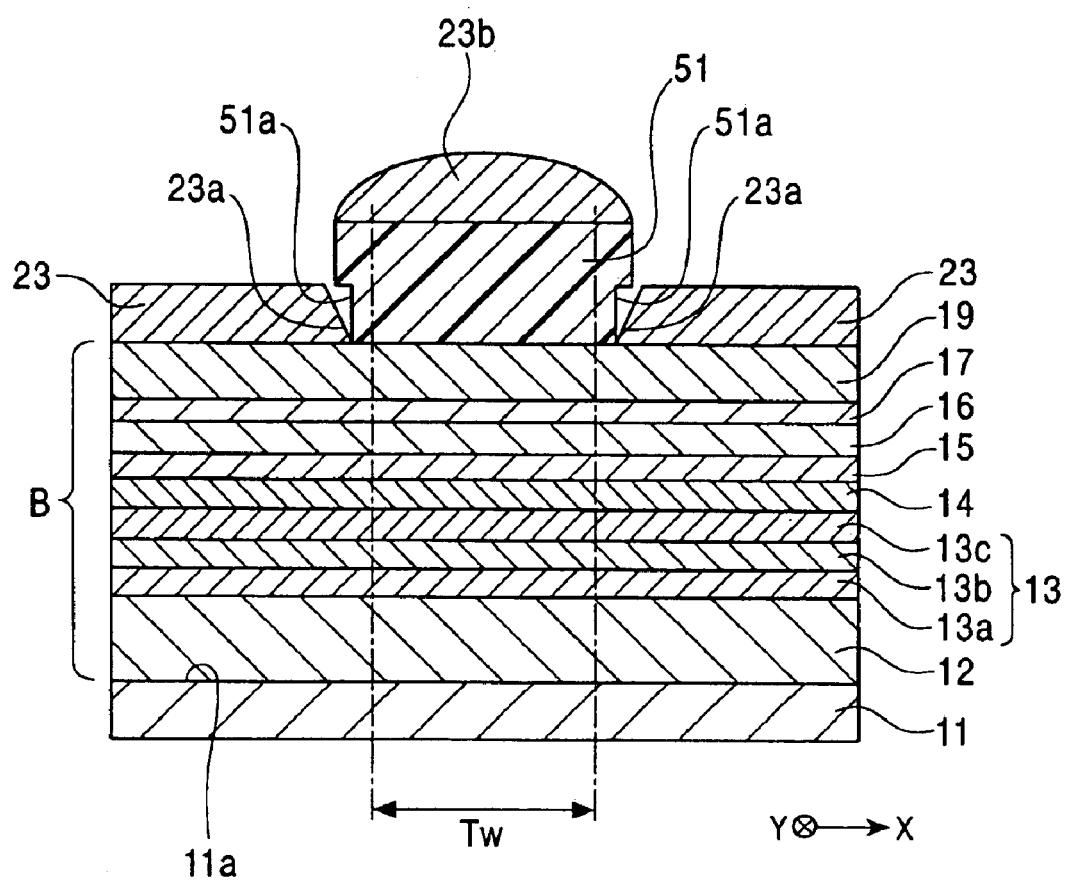
FIG. 30 is a cross-sectional view of a step of method for making a magnetic sensing element according to a fourteenth embodiment of the present invention.

After the step shown in FIG. 16, namely, after the annealing in the first magnetic field at the first annealing temperature, the laminate B provided with the second antiferromagnetic layer 19 is annealed in a second magnetic field oriented in the X direction at a second annealing temperature to generate an exchange anisotropic magnetic field between the second antiferromagnetic layer 19 and the ferromagnetic layer 17. Thus, fixing the magnetization of the free magnetic layer 15 in the X direction. As shown in FIG. 30, a lift-off resist layer 51 is formed on the second antiferromagnetic layer 19 so as to cover a region which is slightly wider than the width (track width Tw). The resist layer 51 has incisions 51a thereunder. The second antiferromagnetic layer 19 may be covered with a protective layer composed of Ta, Cr, or the like (not shown in the drawing).

Figure 31:
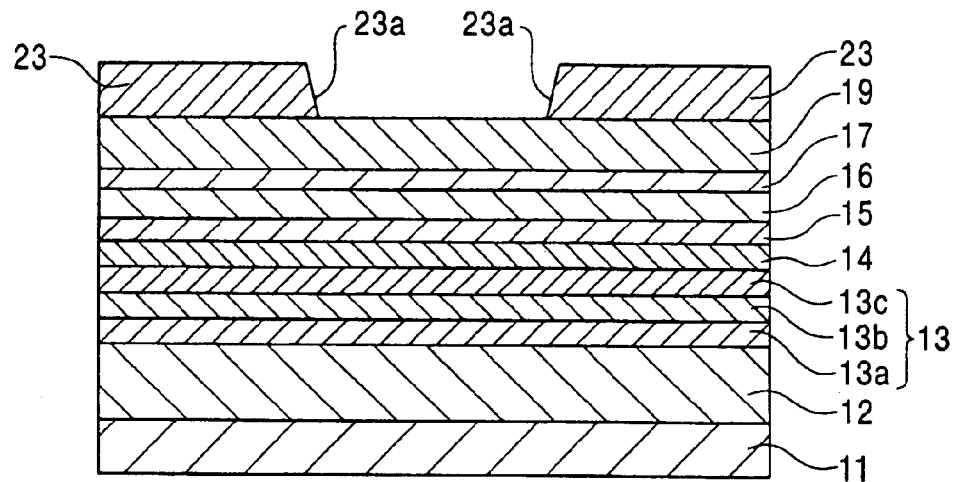
FIG. 31 is a cross-sectional view showing a step subsequent to the step shown in FIG. 30.

Referring to FIG. 31, electrode layers 23 are formed on the second antiferromagnetic layer 19, preferably by a sputtering process selected from an ion beam sputtering process, a long-throw sputtering process, and a collimation sputtering process. When the second antiferromagnetic layer 19 or the protective layer on the second antiferromagnetic layer 19 is oxidized during the annealing in the second magnetic field, the oxidized surface of the second antiferromagnetic layer 19 or protective layer is removed by ion milling.

In this embodiment, the substrate 11, provided with the laminate B, is placed perpendicularly to a target for forming the electrode layers 23, and the electrode layers 23 are deposited on the laminate B by an ion beam sputtering process in a direction that is perpendicular to the laminate B.

Sputtering particles will barely enter the incisions 51a of the resist layer 51 (shown in FIG. 30). Thus, the electrode layers 23 are thin in the vicinity of the incisions 51a and have sloping side faces 23a. The electrode layers 23 are formed of, for example, Au, W, Cr, or Ta. A layer 23b having the same composition as that of the electrode layers 23 is also formed on the resist layer 51. After the electrode layers 23 are formed, the resist layer 51 is removed as shown in FIG. 31.

Figure 32:
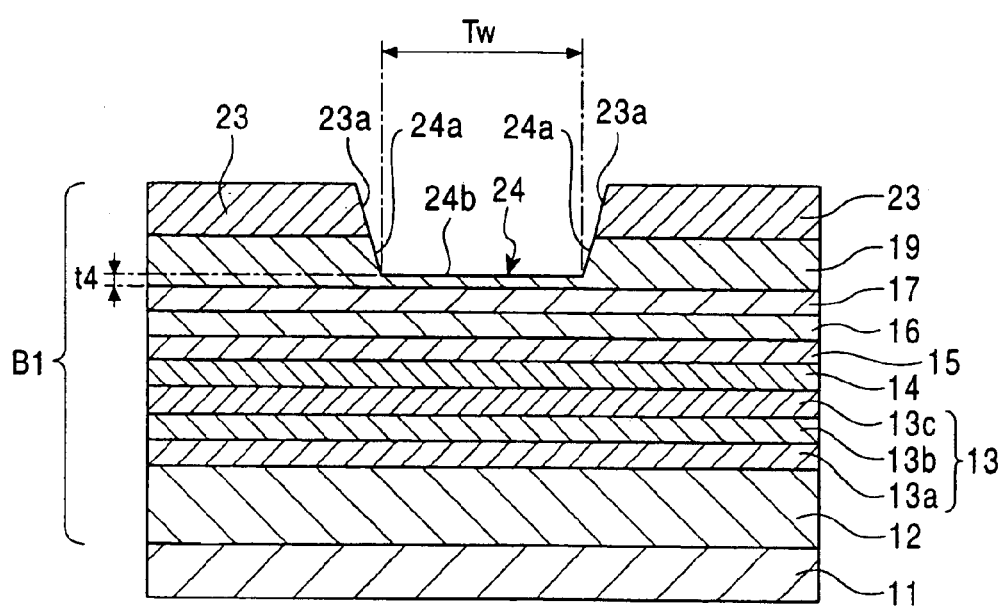
FIG. 32 is a cross-sectional view showing a step subsequent to the step shown in FIG. 31.

Referring to FIG. 32, the exposed portion of the second antiferromagnetic layer 19 is etched by ion milling or RIE using the electrode layers 23 as masks to form a recess 24. The recess 24 has side faces 24a that have the same slope as that of the side faces 23a of the electrode layers 23. In FIG. 32, the recess 24 is formed such that the bottom face 24b of the recess 24 lies in the second antiferromagnetic layer 19. The thickness of the second antiferromagnetic layer 19 in the etched region (below the recess 24) is not more than about 30 Å.

In this embodiment, the width of the bottom face 24b of the recess 24 defines the track width Tw. The width of the bottom face 24b may be determined by adjusting the size of the resist layer 51 in the step shown in FIG. 30 and the depth of the recess 24 in the step shown in FIG. 32.

In the step shown in FIG. 32, the recess 24 may be formed such that the bottom face 24b lies in the ferromagnetic layer 17 or in the nonmagnetic interlayer 16.

Figure 33:
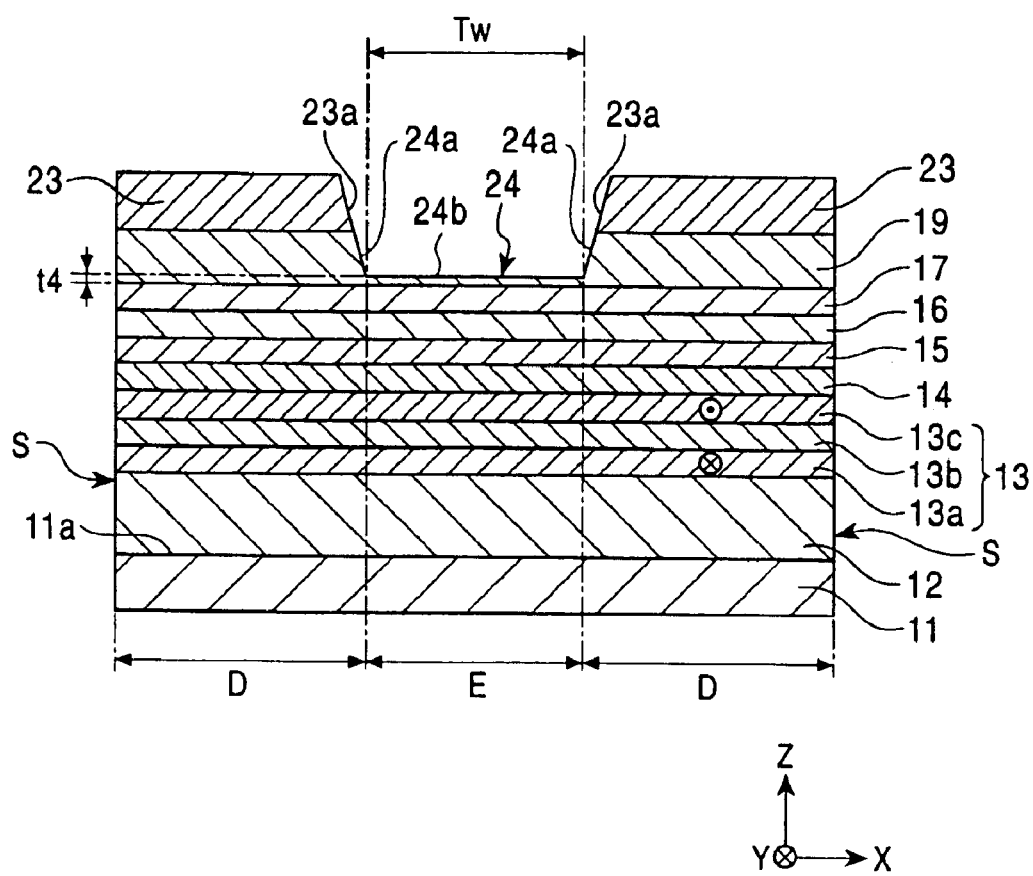
FIG. 33 is a cross-sectional view of a magnetic sensing element made by the method of the fourteenth embodiment of the present invention viewed from the side opposing a recording medium.

FIG. 33 is a cross-sectional view of the magnetic sensing element formed by the steps shown in FIGS. 30 to 32.

This magnetic sensing element is substantially the same as that shown in FIG. 20, except that side faces 24a of the recess 24 have a slope of 20° with respect to the normal to a surface 11a of the substrate 11.

The thickness of the second antiferromagnetic layer 19 below the recess 24 is not more than about 30 Å. Thus, the second antiferromagnetic layer 19 below the recess 24 does not undergo disordered-to-ordered transformation during annealing in a magnetic field and thus does not generate an exchange anisotropic magnetic field.

Accordingly, the magnetization of the ferromagnetic layer 17 and the magnetization of the free magnetic layer 15 are fixed only in the end regions D in the track width direction, other than the track width region E, by the exchange coupling with the second antiferromagnetic layer 19.

When no external magnetic field is applied, the magnetizations of the ferromagnetic layer 17 and free magnetic layer 15 in the track width region E are oriented in the X direction by the effects of the pinned magnetizations with the second antiferromagnetic layer 19 in the end regions D. When an external magnetic field is applied, the magnetization direction of the free magnetic layer 15 changes. Thus, the track width Tw of the magnetic sensing element is determined by the width of the bottom face 24b of the recess 24.

In the magnetic sensing element formed by the steps shown in FIGS. 30 to 32, the magnetization of the ferromagnetic layer 17 and the magnetization of the free magnetic layer 15 are readily fixed in a direction substantially perpendicular to the magnetization direction of the pinned magnetic layer 13, and the track width Tw of the magnetic sensing element is precisely defined.

Even when the first antiferromagnetic layer 12 and the second antiferromagnetic layer 19 are formed of the same material, the exchange anisotropic magnetic field by the second antiferromagnetic layer 19 can be oriented in the X direction while fixing the exchange anisotropic magnetic field by the first antiferromagnetic layer 12 in the Y direction.

In the embodiment shown in FIGS. 23 to 27, the second antiferromagnetic layer 32 is deposited and is annealed in the second magnetic field and the resist layer is patterned on the second antiferromagnetic layer 32 to form the recess 41. Alternatively, the recess may be formed as follows. The second antiferromagnetic layer 32 is formed and is annealed in the second magnetic field, a pair of electrodes are formed on the second antiferromagnetic layer 32 at a distance in the track width direction, and the recess is formed using the electrode layers as masks.

Figure 34:
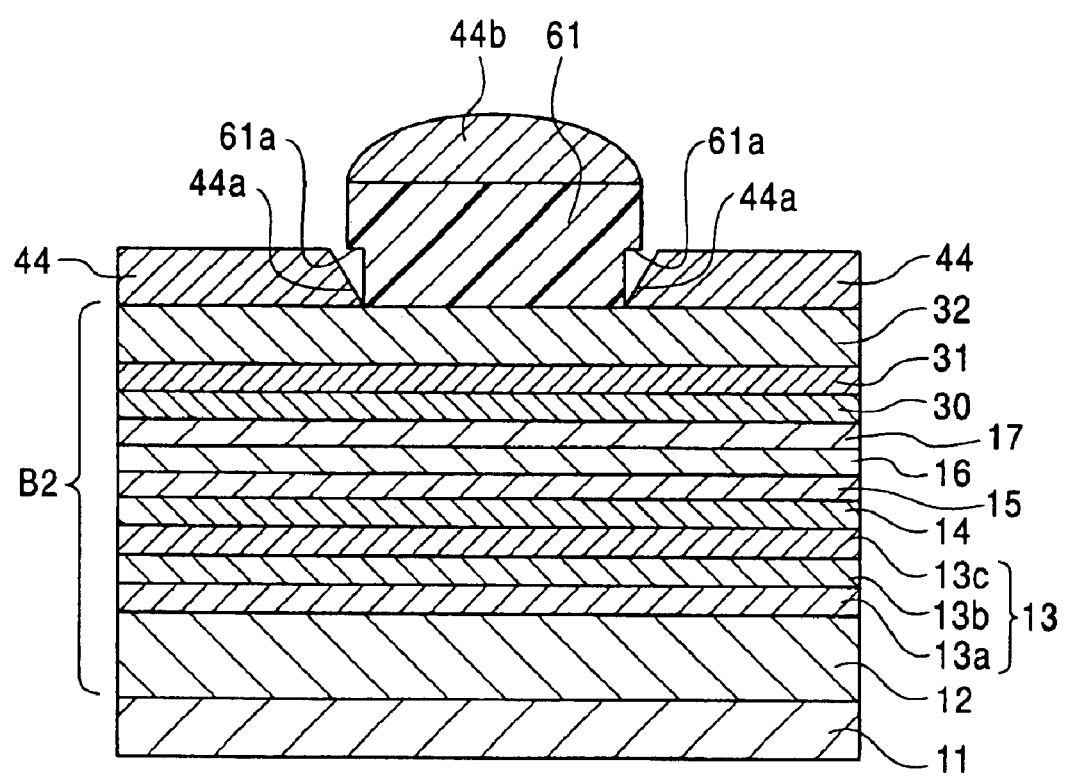
FIG. 34 is a cross-sectional view showing a step of a method for making a magnetic sensing element according to a fifteenth embodiment of the present invention.

After the step shown in FIG. 24, namely, after the annealing in the first magnetic field at the first annealing temperature, the laminate B2 provided with the second antiferromagnetic layer 32 is annealed in a second magnetic field oriented in the X direction at a second annealing temperature to generate an exchange anisotropic magnetic field by the second antiferromagnetic layer 32 and thus to fix the magnetization of the free magnetic layer 15 in the X direction. As shown in FIG. 34, a lift-off resist layer 61 is formed on the second antiferromagnetic layer 32 so as to cover a region which is slightly wider than the width (track width Tw). The resist layer 61 has incisions 61a thereunder. The second antiferromagnetic layer 32 may be covered with a protective layer composed of Ta, Cr, or the like (not shown in the drawing).

Referring to FIG. 34, electrode layers 44 are formed on the second antiferromagnetic layer 32, preferably by a sputtering process selected from an ion beam sputtering process, a long-throw sputtering process, and a collimation sputtering process. When the second antiferromagnetic layer 32 or the protective layer on the second antiferromagnetic layer 32 is oxidized during the annealing in the second magnetic field, the oxidized surface of the second antiferromagnetic layer 32 or protective layer is removed by ion milling.

In this embodiment, the substrate 11 provided with the laminate B2 is placed perpendicularly to a target for forming the electrode layers 44, and the electrode layers 44 are deposited on the laminate B2 by an ion beam sputtering process in a direction that is perpendicular to the laminate B2.

Figure 35:
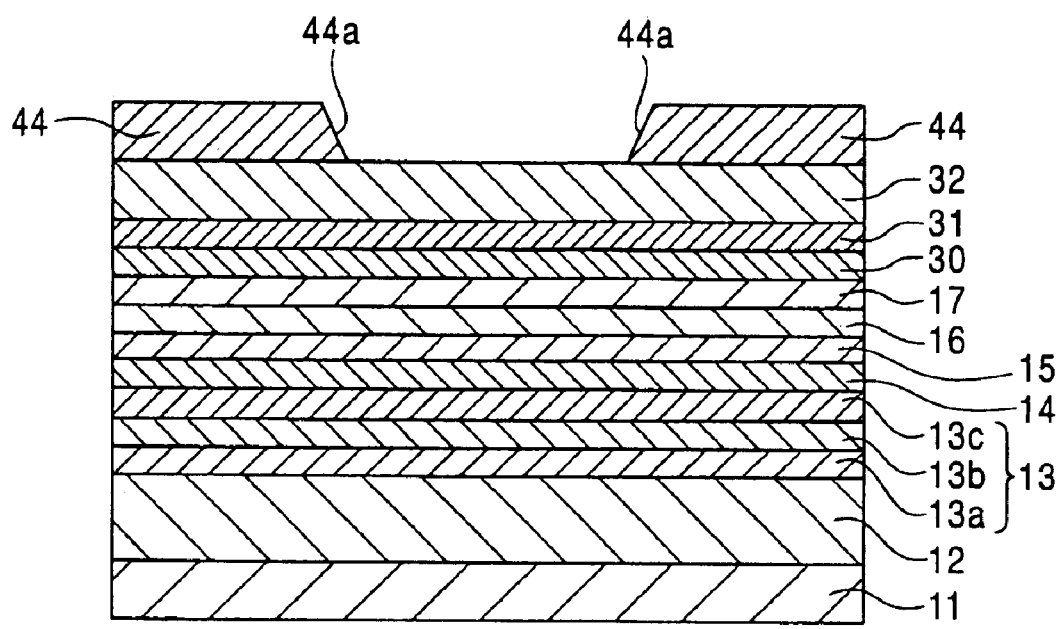
FIG. 35 is a cross-sectional view showing a step subsequent to the step shown in FIG. 34.

Sputtering particles will barely enter the incisions 61a of the resist layer 61. Thus, the electrode layers 44 are thin in the vicinity of the incisions 61a and have sloping side faces 44a. The electrode layers 44 are formed of, for example, Au, W, Cr, or Ta. A layer 44b having the same composition as that of the electrode layers 44 is also formed on the resist layer 61. After the electrode layers 44 are formed, the resist layer 61 is removed as shown in FIG. 35.

Figure 36:
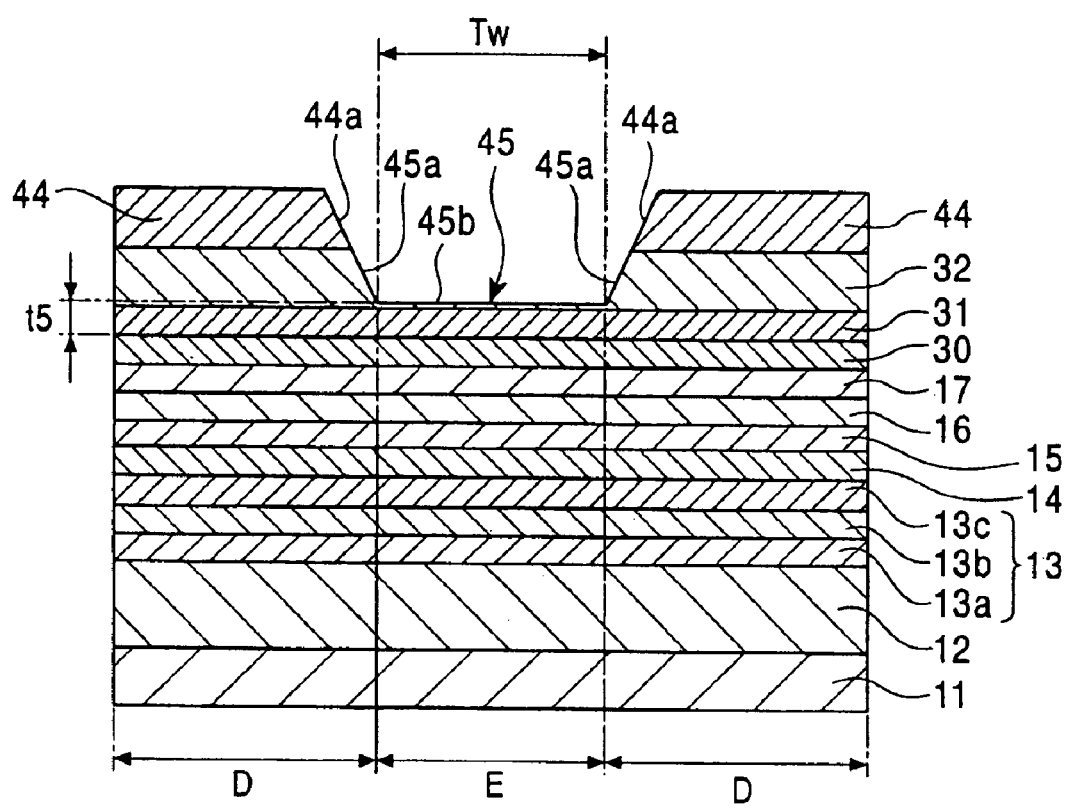
FIG. 36 is cross-sectional view showing a step subsequent to the step shown in FIG. 35.

Referring to FIG. 36, the exposed portion of the second antiferromagnetic layer 32 is etched by ion milling or RIE using the electrode layers 44 as masks to form a recess 45. The recess 45 has side faces 45a that have the same slope as that of the side faces 44a of the electrode layers 44. In FIG. 36, the recess 45 is formed such that the bottom face 45b of the recess 44 lies in the second antiferromagnetic layer 32. The thickness of the second antiferromagnetic layer 32 in the etched region (below the recess 45) is not more than about 30 Å.

In this embodiment, the width of the bottom face 45b of the recess 45 defines the track width Tw. The width of the bottom face 45b may be determined by adjusting the size of the resist layer 61 in the step shown in FIG. 34 and the depth of the recess 45 in the step shown in FIG. 36.

In the step shown in FIG. 36, the recess 45 may be formed such that the bottom face 45b lies in the ferromagnetic layer 17. Alternatively, the recess 45 may be formed such that the bottom face 45b lies in the nonmagnetic interlayer 16, as shown in FIG. 7. Alternatively, the recess 45 may be formed such that the bottom face 45b lies in the third antiferromagnetic layer 31 or in the nonmagnetic layer 30.

The magnetic sensing element shown in FIG. 36 is substantially the same as that shown in FIG. 28 except that side faces 45a of the recess 45 have a slope of 20° with respect to the normal to a surface 11a of the substrate 11.

The total thickness of the second antiferromagnetic layer 32 and the third antiferromagnetic layer 31 below the recess 45 is not more than about 30 Å. Thus, the second antiferromagnetic layer 32 and the third antiferromagnetic layer 31 below the recess 45 do not undergo disordered-to-ordered transformation during annealing in a magnetic field and thus does not generate a RKKY interaction through the nonmagnetic layer 30.

Accordingly, the magnetization of the ferromagnetic layer 17 and the magnetization of the free magnetic layer 15 are fixed only in the end regions D in the track width direction, other than the track width region E, by the RKKY interaction with the second antiferromagnetic layer 32 and the third antiferromagnetic layer 31.

When no external magnetic field is applied, the magnetizations of the ferromagnetic layer 17 and free magnetic layer 15 in the track width region E are oriented in the X direction by the effects of the pinned magnetizations by the RKKY interaction with the second antiferromagnetic layer 32 in the end regions D. When an external magnetic field is applied, the magnetization direction of the free magnetic layer 15 changes. Thus, the track width Tw of the magnetic sensing element is determined by the width of the bottom face 45b of the recess 45.

In the magnetic sensing element formed by the steps shown in FIGS. 34 to 36, the magnetization of the ferromagnetic layer 17 and the magnetization of the free magnetic layer 15 are readily fixed in a direction substantially perpendicular to the magnetization direction of the pinned magnetic layer 13, and the track width Tw of the magnetic sensing element is precisely defined.

Even when the first antiferromagnetic layer 12 and the second antiferromagnetic layer 32 are formed of the same material, the exchange anisotropic magnetic field by the second antiferromagnetic layer 32 can be oriented in the X direction, while fixing the exchange anisotropic magnetic field by the first antiferromagnetic layer 12 in the Y direction.

In the above embodiments, the pinned magnetic layer 13 may have a single layer configuration.

In the production of the magnetic sensing elements shown in FIGS. 21, 1, 28, 29, 3, 4, 5, 33, 36, and 7, at least one of the free magnetic layer 15 and the ferromagnetic layer 17 is preferably formed of a ferromagnetic material having.

A composition is represented by CoFeNi, wherein the Fe content is in the range of about 9 to about 17 atomic percent, the Ni content is in the range of about 0.5 to about 10 atomic percent, and the balance is the Co content.

The exchange coupling magnetic field due to the RKKY interaction can thereby be enhanced between the free magnetic layer 15 and the ferromagnetic layer 17. For example, the spin-flop magnetic field $H_{sf}$ when the antiparallel arrangement disappears can be increased to about 293 kA/m.

The free magnetic layer 15 and the ferromagnetic layer 17 having the above-mentioned composition exhibit a magnetostriction in the range of about $-3 \times 10^{-6}$ to about $3 \times 10^{-6}$ and a coercive force of about 790 A/m or less.

Furthermore, the above composition contributes to improved soft magnetic characteristics of the free magnetic layer 15 and suppressed interdiffusion through the nonmagnetic conductive layer 14, thus preventing a reduction in the change in resistance ($\Delta R$) and a reduction in the rate of change in resistance ($\Delta R/R$).

The free magnetic layer 15 and the nonmagnetic conductive layer 14 may be separated by an interlayer composed of a CoFe alloy or a Co alloy.

When the interlayer is provided, the CoFeNi alloy preferably has an Fe content in the range of about 7 to about 15 atomic percent and a Ni content in the range of about 5 to about 15 atomic percent, the balance being Co.

A magnetic head is formed using the above-described magnetic sensing element as follows. An underlayer composed of an insulating material such as alumina, a lower shield layer composed of a magnetic alloy, and a lower gap layer are formed on the substrate 11, and then the first antiferromagnetic layer 12 is deposited. Moreover, an upper gap layer composed of an insulating layer and an upper shield layer are formed on the magnetic sensing element. An inductive writing element may be deposited on the upper shield layer.

What is claimed is:

1. A magnetic sensing element comprising a laminate, the laminate including: a first antiferromagnetic layer; a pinned magnetic layer, a magnetization direction thereof being pinned by the first antiferromagnetic layer; a nonmagnetic conductive layer; a free magnetic layer, a magnetization direction thereof being variable in response to an external magnetic field; a nonmagnetic interlayer; a ferromagnetic layer; a second antiferromagnetic layer, and a nonmagnetic layer disposed between the second antiferromagnetic layer, wherein the second antiferromagnetic layer is directly disposed on the nonmagnetic layer, wherein the second anti ferromagnetic layers magnetically couples with the ferromagnetic layer to orient a magnetization of the ferromagnetic layer in a predetermined direction, wherein the laminate has a recess extending through the second antiferromagnetic layer, the nonmagnetic layer and the ferromagnetic layer, a bottom face of the recess lying in the nonmagnetic interlayer, a width of the bottom face in a track width direction being equal to a track width, wherein the free magnetic layer is magnetized in a direction substantially orthogonal to the magnetization direction of the pinned magnetic layer as a result of magnetic coupling with the ferromagnetic layer.

2. The magnetic sensing element according to claim 1, wherein the nonmagnetic interlayer comprises at least one metal selected from the group consisting of Ru, Rh, Ir, Cr, Re, and Cu.

3. The magnetic sensing element according to claim 1, wherein at least one of the ferromagnetic layer and the free magnetic layer comprises a CoFeNi alloy containing about 9 to about 17 atomic percent of Fe, about 0.5 to about 10 atomic percent of Ni, and a balance of Co.

4. The magnetic sensing element according to claim 1, wherein the laminate further includes an interlayer disposed between the free magnetic layer and the nonmagnetic conductive layer the interlayer comprising one of a CoFe alloy and elemental Co, the interlayer.

5. The magnetic sensing element according to claim 4, wherein at least one of the ferromagnetic layer and the free magnetic layer comprises a CoFeNi alloy containing about 7 to about 15 atomic percent of Fe, about 5 to about 15 atomic percent of Ni, and a balance of Co.

6. The magnetic sensing element according to claim 3, wherein both the ferromagnetic layer and the free magnetic layer comprise the CoFeNi alloy.

7. The magnetic sensing element according to claim 1, wherein side faces of the recess are perpendicular to the track width direction.

8. The magnetic sensing element according to claim 1, wherein the nonmagnetic layer comprises at least one element selected from the group consisting of Ru, Cu, Ag, and Au.

9. The magnetic sensing element according to claim 8, wherein the nonmagnetic layer comprises Ru and has a thickness in the range of about 8 to about 11 Å.

10. The magnetic sensing element according to claim 1, wherein the second antiferromagnetic layer comprises upper and lower antiferromagnetic layers, the lower antiferromagnetic layer being directly disposed on the nonmagnetic layer, and wherein the lower antiferromagnetic layer has a thickness of not more than about 30 Å.

11. The magnetic sensing element according to claim 1, wherein the pinned magnetic layer comprises: a plurality of ferromagnetic sublayers each differing in a magnitude of a magnetic moment per unit area, and at least one nonmagnetic intermediate sublayer separating the plurality of ferromagnetic sublayers from one another, and wherein magnetization directions of the plurality of ferromagnetic sublayers are antiparallel to each other.

12. The magnetic sensing element according to claim 11, wherein said at least one nonmagnetic intermediate sublayer comprises one metal selected from the group consisting of Ru, Rh, Ir, Cr, Re, and Cu.

13. The magnetic sensing element according to claim 1, wherein the first antiferromagnetic layer and the second antiferromagnetic layer comprise the same antiferromagnetic material.

14. The magnetic sensing element according to claim 1, wherein the second antiferromagnetic layer comprises upper and lower antiferromagnetic layers, the lower antiferromagnetic layer being directly disposed on the nonmagnetic layer, and wherein at least one of the first, and upper antiferromagnetic and lower antiferromagnetic layers comprises one of a PtMn alloy, an X—Mn alloy, and a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

15. The magnetic sensing element according to claim 1, wherein the second antiferromagnetic layer comprises upper and lower antiferromagnetic layers, the lower antiferromagnetic layer being directly disposed on the nonmagnetic layer, and wherein the first antiferromagnetic layer, the lower antiferromagnetic layer and the upper antiferromagnetic layer comprise the same antiferromagnetic material.

* * * * *